United States Patent
Amin et al.

(10) Patent No.: US 11,494,683 B2
(45) Date of Patent: Nov. 8, 2022

(54) SYSTEMS AND METHODS FOR COUPLING QUBITS IN A QUANTUM PROCESSOR

(71) Applicant: D-Wave Systems Inc., Burnaby (CA)

(72) Inventors: Mohammad H. Amin, Coquitlam (CA); Paul I. Bunyk, New Westminster (CA); Trevor M. Lanting, Vancouver (CA); Chunqing Deng, Coquitlam (CA); Anatoly Smirnov, Vancouver (CA); Kelly T. R. Boothby, Vancouver (CA); Emile M. Hoskinson, Vancouver (CA); Christopher B. Rich, Vancouver (CA)

(73) Assignee: D-WAVE SYSTEMS INC., Burnaby (CA)

(*) Notice: Subject to any disclaimer, the term of this patent is extended or adjusted under 35 U.S.C. 154(b) by 191 days.

(21) Appl. No.: 16/955,526

(22) PCT Filed: Dec. 19, 2018

(86) PCT No.: PCT/US2018/066613
§ 371 (c)(1),
(2) Date: Jun. 18, 2020

(87) PCT Pub. No.: WO2019/126396
PCT Pub. Date: Jun. 27, 2019

(65) Prior Publication Data
US 2020/0320426 A1     Oct. 8, 2020

Related U.S. Application Data
(60) Provisional application No. 62/693,305, filed on Jul. 2, 2018, provisional application No. 62/608,501, filed on Dec. 20, 2017.

(51) Int. Cl.
*H01L 39/02* (2006.01)
*G06N 10/00* (2022.01)
*H01L 39/22* (2006.01)

(52) U.S. Cl.
CPC ......... *G06N 10/00* (2019.01); *H01L 39/025* (2013.01); *H01L 39/223* (2013.01)

(58) Field of Classification Search
CPC . G06N 10/00; H01L 39/025; H01L 29/66977; H01L 39/223–226;
(Continued)

(56) References Cited

U.S. PATENT DOCUMENTS 4,280,095 A    7/1981   Hinton
4,370,359 A    1/1983   Fetter et al.
(Continued)

FOREIGN PATENT DOCUMENTS

CA    2386426 A1    5/2001
CA    2814865 A1    5/2012
(Continued)

OTHER PUBLICATIONS

Plourde et al., "Entangling Flux Qubits with a Bipolar Dynamic Inductance," Physical Review B 70, arXiv:quant-ph/0406049v1, Jun. 8, 2004, 4 pages.
(Continued)

*Primary Examiner* — Shahed Ahmed
(74) *Attorney, Agent, or Firm* — Cozen O'Connor

(57) ABSTRACT

Josephson junctions (JJ) may replace primary inductance of transformers to realize galvanic coupling between qubits, advantageously reducing size. A long-range symmetric coupler may include a compound JJ (CJJ) positioned at least approximately at a half-way point along the coupler to advantageously provide a higher energy of a first excited state than that of an asymmetric long-range coupler. Quan-
(Continued)

tum processors may include qubits and couplers with a non-stoquastic Hamiltonian to enhance multi-qubit tunneling during annealing. Qubits may include additional shunt capacitances, e.g., to increase overall quality of a total capacitance and improve quantum coherence. A sign and/or magnitude of an effective tunneling amplitude $\Delta_{\it eff}$ of a qubit characterized by a double-well potential energy may advantageously be tuned. Sign-tunable electrostatic coupling of qubits may be implemented, e.g., via resonators, and LC-circuits. YY couplings may be incorporated into a quantum anneaier (e.g., quantum processor).

20 Claims, 21 Drawing Sheets

(58) Field of Classification Search
CPC .......... H01L 39/2493–2496; H01L 21/76891; H01L 27/18; B82Y 10/00
See application file for complete search history.

(56) References Cited

U.S. PATENT DOCUMENTS

| | | |
|---|---|---|
| 4,371,796 A | 2/1983 | Takada |
| 4,496,854 A | 1/1985 | Chi et al. |
| 5,095,357 A | 3/1992 | Andoh et al. |
| 5,157,466 A | 10/1992 | Char et al. |
| 5,323,344 A | 6/1994 | Katayama et al. |
| 5,465,049 A | 11/1995 | Matsuura et al. |
| 5,523,914 A | 6/1996 | Weck et al. |
| 5,917,322 A | 6/1999 | Gershenfeld et al. |
| 5,962,781 A | 10/1999 | Veryaskin |
| 6,037,649 A | 3/2000 | Liou |
| 6,058,127 A | 5/2000 | Joannopoulos et al. |
| 6,389,197 B1 | 5/2002 | Iltchenko et al. |
| 6,437,413 B1 | 8/2002 | Yamaguchi et al. |
| 6,459,097 B1 | 10/2002 | Zagoskin |
| 6,495,854 B1 | 12/2002 | Newns et al. |
| 6,504,172 B2 | 1/2003 | Zagoskin et al. |
| 6,563,311 B2 | 5/2003 | Zagoskin |
| 6,597,010 B2 | 7/2003 | Eriksson et al. |
| 6,605,822 B1 | 8/2003 | Blais et al. |
| 6,627,915 B1 | 9/2003 | Ustinov et al. |
| 6,627,916 B2 | 9/2003 | Amin et al. |
| 6,670,630 B2 | 12/2003 | Blais et al. |
| 6,753,546 B2 | 6/2004 | Tzalenchuk et al. |
| 6,784,451 B2 | 8/2004 | Amin et al. |
| 6,791,109 B2 | 9/2004 | Tzalenchuk et al. |
| 6,803,599 B2 | 10/2004 | Amin et al. |
| 6,822,255 B2 | 11/2004 | Tzalenchuk et al. |
| 6,838,694 B2 | 1/2005 | Esteve et al. |
| 6,885,325 B2 | 4/2005 | Omelyanchouk et al. |
| 6,897,468 B2 | 5/2005 | Blais et al. |
| 6,936,841 B2 | 8/2005 | Amin et al. |
| 6,960,780 B2 | 11/2005 | Blais et al. |
| 6,979,836 B2 | 12/2005 | Zagoskin et al. |
| 6,984,846 B2 | 1/2006 | Newns et al. |
| 6,987,282 B2 | 1/2006 | Amin et al. |
| 6,996,504 B2 | 2/2006 | Novotny et al. |
| 7,002,174 B2 | 2/2006 | Il et al. |
| 7,015,499 B1 | 3/2006 | Zagoskin |
| 7,109,593 B2 | 9/2006 | Freedman et al. |
| 7,135,701 B2 | 11/2006 | Amin et al. |
| 7,253,654 B2 | 8/2007 | Amin |
| 7,277,872 B2 | 10/2007 | Raussendorf et al. |
| 7,335,909 B2 | 2/2008 | Amin et al. |
| 7,364,923 B2 | 4/2008 | Lidar et al. |
| 7,418,283 B2 | 8/2008 | Amin |
| 7,533,068 B2 | 5/2009 | Maassen et al. |
| 7,605,600 B2 | 10/2009 | Harris |
| 7,619,437 B2 | 11/2009 | Thom et al. |
| 7,639,035 B2 | 12/2009 | Berkley |
| 7,788,192 B2 | 8/2010 | Amin |
| 7,800,395 B2 | 9/2010 | Johnson et al. |
| 7,843,209 B2 | 11/2010 | Berkley |
| 7,847,615 B2 | 12/2010 | Yorozu et al. |
| 7,876,248 B2 | 1/2011 | Berkley et al. |
| 7,880,529 B2 | 2/2011 | Amin |
| 7,898,282 B2 | 3/2011 | Harris et al. |
| 8,008,942 B2 | 8/2011 | Van et al. |
| 8,018,244 B2 | 9/2011 | Berkley |
| 8,022,722 B1 | 9/2011 | Pesetski et al. |
| 8,035,540 B2 | 10/2011 | Berkley et al. |
| 8,063,657 B2 | 11/2011 | Rose |
| 8,073,808 B2 | 12/2011 | Rose |
| 8,098,179 B2 | 1/2012 | Bunyk et al. |
| 8,164,082 B2 | 4/2012 | Friesen |
| 8,169,231 B2 | 5/2012 | Berkley |
| 8,174,305 B2 * | 5/2012 | Harris ............... B82Y 10/00 327/528 |
| 8,190,548 B2 | 5/2012 | Choi |
| 8,190,553 B2 | 5/2012 | Routt |
| 8,195,596 B2 | 6/2012 | Rose et al. |
| 8,234,103 B2 | 7/2012 | Biamonte et al. |
| 8,283,943 B2 | 10/2012 | Van Den Brink et al. |
| 8,421,053 B2 | 4/2013 | Bunyk et al. |
| 8,504,497 B2 | 8/2013 | Amin |
| 8,536,566 B2 | 9/2013 | Johansson et al. |
| 8,686,751 B2 | 4/2014 | Van Den Brink et al. |
| 8,772,759 B2 | 7/2014 | Bunyk et al. |
| 8,786,476 B2 | 7/2014 | Bunyk et al. |
| 8,854,074 B2 | 10/2014 | Berkley |
| 9,015,215 B2 | 4/2015 | Berkley et al. |
| 9,059,674 B2 | 6/2015 | Chow et al. |
| 9,069,928 B2 | 6/2015 | Van Den Brink et al. |
| 9,129,224 B2 | 9/2015 | Lanting et al. |
| 9,162,881 B2 | 10/2015 | Biamonte et al. |
| 9,806,711 B1 | 10/2017 | Abdo |
| 10,074,792 B1 | 9/2018 | Ferguson et al. |
| 2002/0117656 A1 | 8/2002 | Amin et al. |
| 2002/0121636 A1 | 9/2002 | Amin et al. |
| 2002/0188578 A1 | 12/2002 | Amin et al. |
| 2002/0190341 A1 | 12/2002 | Herr et al. |
| 2003/0027724 A1 | 2/2003 | Rose et al. |
| 2003/0055513 A1 | 3/2003 | Raussendorf et al. |
| 2003/0071258 A1 | 4/2003 | Zagoskin et al. |
| 2003/0107033 A1 | 6/2003 | Tzalenchuk et al. |
| 2003/0121028 A1 | 6/2003 | Coury et al. |
| 2003/0169041 A1 | 9/2003 | Coury et al. |
| 2003/0173498 A1 | 9/2003 | Blais et al. |
| 2003/0224753 A1 | 12/2003 | Bremond et al. |
| 2004/0000666 A1 | 1/2004 | Lidar et al. |
| 2004/0012407 A1 | 1/2004 | Amin et al. |
| 2004/0016918 A1 | 1/2004 | Amin et al. |
| 2004/0077503 A1 | 4/2004 | Blais et al. |
| 2004/0078421 A1 | 4/2004 | Routt |
| 2004/0119061 A1 | 6/2004 | Wu et al. |
| 2004/0140537 A1 | 7/2004 | Il et al. |
| 2004/0173792 A1 | 9/2004 | Blais et al. |
| 2004/0238813 A1 | 12/2004 | Lidar et al. |
| 2005/0001209 A1 | 1/2005 | Hilton et al. |
| 2005/0062072 A1 | 3/2005 | Yamamoto et al. |
| 2005/0082519 A1 | 4/2005 | Amin et al. |
| 2005/0127915 A1 | 6/2005 | Schauwecker et al. |
| 2005/0140019 A1 | 6/2005 | Watanabe |
| 2005/0224784 A1 | 10/2005 | Amin et al. |
| 2005/0250651 A1 | 11/2005 | Amin et al. |
| 2005/0256007 A1 | 11/2005 | Amin et al. |
| 2006/0043541 A1 | 3/2006 | Tetelbaum |
| 2006/0097746 A1 | 5/2006 | Amin |
| 2006/0097747 A1 | 5/2006 | Amin |
| 2006/0147154 A1 | 7/2006 | Thom et al. |
| 2006/0225165 A1 | 10/2006 | Maassen et al. |
| 2007/0180586 A1 | 8/2007 | Amin |
| 2007/0212889 A1 | 9/2007 | Abatchev et al. |
| 2008/0052055 A1 | 2/2008 | Rose et al. |
| 2008/0176750 A1 | 7/2008 | Rose et al. |
| 2008/0238531 A1 * | 10/2008 | Harris ............... G06N 10/00 327/528 |
| 2008/0258753 A1 | 10/2008 | Harris |
| 2009/0070402 A1 | 3/2009 | Rose et al. |
| 2009/0078932 A1 | 3/2009 | Amin |
| 2009/0121215 A1 | 5/2009 | Choi |

(56) References Cited

U.S. PATENT DOCUMENTS

| | | |
|---|---|---|
| 2009/0153180 A1 | 6/2009 | Herr |
| 2010/0182039 A1 | 7/2010 | Baumgardner et al. |
| 2011/0057169 A1 | 3/2011 | Harris et al. |
| 2011/0060780 A1 | 3/2011 | Berkley et al. |
| 2012/0278057 A1 | 11/2012 | Biamonte et al. |
| 2013/0005580 A1 | 1/2013 | Bunyk et al. |
| 2013/0278283 A1 | 10/2013 | Berkley |
| 2014/0097405 A1 | 4/2014 | Bunyk |
| 2014/0228222 A1 | 8/2014 | Berkley et al. |
| 2014/0229722 A1* | 8/2014 | Harris .............. G06N 10/00 713/1 |
| 2014/0266406 A1 | 9/2014 | Abraham et al. |
| 2014/0337612 A1 | 11/2014 | Williams |
| 2015/0032991 A1 | 1/2015 | Lanting et al. |
| 2015/0032994 A1 | 1/2015 | Chudak et al. |
| 2015/0046681 A1 | 2/2015 | King |
| 2016/0267032 A1 | 9/2016 | Rigetti et al. |
| 2016/0314407 A1 | 10/2016 | Bunyk et al. |
| 2016/0335558 A1 | 11/2016 | Bunyk et al. |
| 2017/0344898 A1 | 11/2017 | Karimi et al. |
| 2019/0019099 A1 | 1/2019 | Hoskinson et al. |

FOREIGN PATENT DOCUMENTS

| | | |
|---|---|---|
| CN | 101868802 A | 10/2010 |
| JP | 2005142348 A | 6/2005 |
| JP | 2007250771 A | 9/2007 |
| JP | 2009065017 A | 3/2009 |
| JP | 2010524064 A | 7/2010 |
| JP | 2011524043 A | 8/2011 |
| JP | 2011197875 A | 10/2011 |
| JP | 2012064974 A | 3/2012 |
| JP | 6140679 B2 | 5/2017 |
| JP | 2020524064 A | 8/2020 |
| WO | 0227653 A2 | 4/2002 |
| WO | 2004077600 A1 | 9/2004 |
| WO | 2004102470 A2 | 11/2004 |
| WO | 2005093649 A1 | 10/2005 |
| WO | 2006024939 A2 | 3/2006 |
| WO | 2009120638 A2 | 10/2009 |
| WO | 2012064974 A2 | 5/2012 |
| WO | 2014197001 A1 | 12/2014 |
| WO | 2015103372 A1 | 7/2015 |

OTHER PUBLICATIONS

Quintana, "Superconducting Flux Qubits for High-Connectivity Quantum Annealing Without Lossy Dielectrics," Doctoral Thesis, UC Santa Barbara, 2017, 413 pages.
Ramos et al., "Design for Effective Thermalization of Junctions for Quantum Coherence," IEEE Transactions on Applied Superconductivity 11(1):998-1001, Mar. 2001.
Rocchetto et al., "Stabilisers as a design tool for new forms of Lechner-Hauke-Zoller Annealer", arXiv:1603.08554 [quant-ph], May 2, 2016. https://arxiv.org/abs/1603.08554.
Rudo, "Influence of Strong Noise on the Adiabatic Quantum Computer," University of Vienna, 2015, 66 pages.
Zurek, "Decoherence and the transition from quantum to classical", Physics Today, 44, 10, pp. 36-44, 1991.
Schaller et al., "The role of symmetries in adiabatic quantum algorithms", arXiv:0708.1882, Aug. 14, 2007. https://arxiv.org/abs/0708.1882.
Schützhold et al., "Adiabatic quantum algorithms and quantum phase transitions", arXiv:quant-ph/0608017, Aug. 1, 2006. https://arxiv.org/abs/quant-ph/0608017.
Shirts et al., "Computing: Screen Savers of the Word Unite!," Science Online 290(5498): 1903-1904, Dec. 8, 2000.
Shnirman et al., "Low-and High-Frequency Noise from Coherent two-Level Systems", Physical Review Letters, Apr. 1, 2005. https://arxiv.org/abs/cond-mat/0412668#:~:text=This%20implies%20a%20relation%20between,the%20parameters%20of%20the%20TLSs.
Shor, "Introduction to Quantum Algorithms," AT&T Labs—Research, arXiv:quant-ph/0005003 v2, pp. 1-17, Jul. 6, 2001.
Steffen et al., "Quantum computing: An IBM perspective", IBM Journal of Research and Development, Sep./Oct. 2011.
Strauch, Theory of Superconducting Phase Qubits, UMI Microform, Ann Arbor, Michigan, 2005, Chapter 8, "Conclusion," pp. 298-306.
Suzuki et al., "Quantum Annealing of the Random-Field Ising Model Transverse Ferromagnetic Interactions," arXiv:quant-ph/0702214v1, 6 pages, 2007.
Tang et al., "2D implementation of quantum annealing algorisms for fourth order binary optimization problems", Institute for Quantum Computing and Department of Electrical and Computer Engineering, May 12, 2016.
Tokuda, "Analog Computation Using Single-Electron Circuits", Analog Integrated Circuits and Signal Processing, Oct. 1, 2000.
Vala et al., "Encoded Universality for Generalized Anisotropic Exchange Hamiltonians," arXiv:quant-ph/0204016v1, Apr. 4, 2002, 15 pages.
van Dam, "Quantum Computing: In the 'Death Zone'?," Nature Physics 3:220-221, Apr. 2007.
van der Ploeg et al., "Controllable Coupling of Superconducting Flux Qubits," Physical Review Letters 98:057004-1-057004-4, 2007.
van der Ploeg, et al., "Adiabatic Quantum Computation with Flux Qubits, First Experimental Results," arXiv:cond-mat/0702580v1 [cond-mat.supr-con], Feb. 25, 2007, 6 pages.
Van der Wal et al., "Quantum Superposition of Macroscopic Persistent current states", Science 290, pp. 773-777, 2000.
van der Wal, C.H., "Quantum Superpositions of Persistent Josephson Currents," Thesis, Published by DUP Science, Sep. 24, 2001, 121 pages.
Van Zant, "Microchip Fabrication", Fourth Edition, McGraw-Hill, New York, 2000. (book details provided).
Vinci et al., "Non-stoquastic interactions in quantum annealing via the aharonov-anandan phase", arXiv:1701.07494 [quant-ph], Jan. 25, 2017.
Vion et al., "Manipulating the quantum state of an electrical circuit", Science, 296, pp. 886-889 (2002).
Wallquist et al., "Superconducting Qubit Network with Controllable Nearest-Neighbor Coupling," New Journal of Physics 7(178), 24 pages, 2005.
Wallraff et al., "Strong Coupling of a Single Photon to a Superconducting Qubit Using Circuit Quantum Electrodynamics," Nature 431:162-167, Sep. 9, 2004.
Wallraff, "Fluxon dynamics in annular Josephson junctions: from relativistic strings to quantum particles", Friedrich-Alexander University of Erlangen-Nürnberg, Apr. 1, 2001.
Wang et al., "Fast Entanglement of Two Charge-Phase Qubits Through Nonadiabatic Couling to a Large Josephson Junction," Physical Review B 70:224515-1-224515-4, 2004.
Wei et al., "Preparation of multi-qubit W states in multiple resonators coupled by a superconducting qubit via adiabatic passage", Quantum Inf Process, Apr. 14, 2015.
Wei et al., "Quantum Computation with Josephson-Qubits by Using a Current-Biased Information Bus," arXiv:cond-mat/0407667 v1, pp. 1-13, Jul. 26, 2004.
Wendin et al., "Superconducting Quantum Circuits, Qubits and Computing," arXiv:cond-mat/0508729v1 [cond-mat.supr-con], Aug. 30, 2005, 60 pages.
Wocjan et al., "Treating the Independent Set Problem by 2D Ising Interactions with Adiabatic Quantum Computing," arXiv:quant-ph/0302027v1, pp. 1-13, Feb. 4, 2003.
Wu et al., "Dressed Qubits," Physical Review Letters 91(9):1-4, Aug. 29, 2003.
Wu et al., "Qubits as Parafermions," arXiv:quant-ph/0109078v3, May 28, 2002, 17 pages.
Wu et al., "Universal Quantum Logic from Zeeman and Anisotropic Exchange Interactions," Physical Review A 66(062314):1-5, 2002.
Yamamoto et al., "Demonstration of conditional gate operation using superconducting charge qubits", Nature, Oct. 30, 2003. https://www.nature.com/articles/nature02015.
Yan et al., "A tunable coupling scheme for implementing high-fidelity two-qubit gates", Arxiv, Mar. 26, 2018.

(56) References Cited

OTHER PUBLICATIONS

You et al., "Controllable Manipulation and Entanglement of Macroscopic Quantum States in Coupled Charge Qubits," Physical Review B 68:024510-1-024510-8, 2003.
You et al., "Fast Two-Bit Operations in Inductively Coupled Flux Qubits," arXiv:cond-mat/0309491 v1, pp. 1-5, Sep. 22, 2003.
You et al., "Scalable Quantum Computing with Josephson Charge Qubits," Physical Review Letters 89(19):197902-1-197902-4, 2002.
Zagoskin et al., "Quantum Two-Level Systems in Josephson Junctions as Naturally Formed Qubits," Physical Review Letters 97:077001-1-077001-4, 2006.
Zagoskin et al., "Superconducting Qubits," La Physique au Canada 63(4):215-227, 2007.
Foxen et al., "Demonstrating a Continuous Set of Two-Qubit Gates for Near-Term Quantum Algorithms" Physical Review Letters 125, 120504 (2020), 6 pages.
He et al., "Generating multipartite entangled states of qubits distributed in different cavities", Quantum Informatoin Processing, vol. 13, No. 6, pp. 1381-1395 Feb. 11, 2014.
Hutter et al., "Parafermions in a Kagome lattice of qubits for topological quantum computation", Physical Review X, vol. 5, No. 4, Jun. 2, 2015.
Sandberg et al., "Tuning the field in a microwave resonator faster than the photon lifetime", Applied Physics Letters, American Institute of Physics, vol. 92, No. 20, 3 pages, May 19, 2008.
Extended European Search Report, dated Apr. 4, 2022, for European Application No. 21198672.4, 10 pages.
Bryant et al., "Introduction to Electronic Analogue Computing," Physics& Mathematics, AEC Research and Development Report, pp. 2-50, Aug. 1966.
Buisson et al., "Entangled states in a Josephson charge qubit coupled to a superconducting resonator", arXiv.org:cond/mat/0008275 (2000).
Butcher, J.R., "Advances in Persistent-Current Qubit Research: Inductively Coupled Qubits and Novel Biasing Methods," Final Report, Delft University of Technology, Jan. 14, 2002, 52 pages.
Carelli et al., "SQUID Systems for Macroscopic Quantum Coherence and Quantum Computing", IEEE trans. Apple. Supercond., Mar. 1, 2001. https://ieeexplore.ieee.org/document/919321.
Chancellor et al., "A Direct Mapping of Max k-SAT and High Order Parity Checks to a Chimera Graph", Nature Magazine, Nov. 8, 2016. https://www.nature.com/articles/srep37107.
Chancellor et al., "Circuit design for multi-body interactions in superconducting quantum annealing systems with applications to a scalable architecture", Nature Magazine, Aug. 1, 2016. https://www.nature.com/articles/s41534-017-0022-6.
Chancellor et al., "Experimental Freezing of mid-Evolution Fluctuations with a Programmable Annealer", arXiv:1605.07549 [quant-ph], May 24, 2016. https://arxiv.org/abs/1605.07549.
Chen et al., "Qubit architecture with high coherences and fast tunable coupling", Physical Review Letters, Feb. 28, 2014. https://arxiv.org/abs/1402.7367.
Choi, M-S., "Geometric Quantum Computation on Solid-State Qubits," arXiv:quant-ph/0111019v4, Sep. 29, 2003, 7 pages.
Choudhury, "Handbook of Microlithography, Micromachining and Microfabrication vol. 1: Microlithography", The International Society for Optical Engineering, Bellingham, WA, 1999. (book details provided).
Clarke et al., "Superconducting quantum bits," Nature 453:1031-1042, Jun. 19, 2008.
Corato et al., "Adiabatic Quantum Computation with Flux Qbits," Quantum Computing in Solid State Systems, pp. 103-110, 2006.
Cormen et al., Introduction to Algorithms, The MIT Press, Cambridge, Massachusetts, pp. 964-985, 2000.
Cosmelli, C., "Controllable Flux Coupling for the Integration of Flux Qubits," arXiv:cond-mat/0403690v1 [cond-mat.supr-con]. Mar. 29, 2004, 10 pages.
Devoret et al., "Superconducting Circuits for Quantum Information: An Outlook," Science 339:1169-1174, Mar. 8, 2013.
Devoret et al., "Superconducting Qubits: A Short Review," arXiv:cond-mat/0411174v1, Nov. 7, 2004, 41 pages.
DiVincenzo, "The Physical Implementation of Quantum Computation," Fortschr. Phys. 48:771-783, 2000.
Dolan et al., "Optimization on the NEOS Server," from SIAM News 35(6): 1-5, Jul./Aug. 2002.
Dolan, "Offset masks for lift-off photoprocessing", Applied Physics Letters, Aug. 26, 2008. https://aip.scitation.org/doi/10.1063/1.89690.
Duty et al., "Coherent Dynamics of a Josephson Charge Qubit," Physical Review B 69(140503(R)):1-4, 2004.
Esteve et al., "Solid State Quantum Bit Circuits," arXiv:cond-mat/0505676 [cond-mat.supr-con], May 27, 2005, 37 pages.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," International Journal of Theoretical Physics 21(6/7): 467-488, 1982.
Fourer et al., "Optimization as an Internet Resource," Interfaces 31(2): 130-150, Mar.-Apr. 2001.
Friedman et al., "Aharonov-Casher-Effect Suppression of Macroscopic Tunneling of Magnetic Flux," arXiv:cond-mat/0109544v1 [cond-mat.mes-hall], Sep. 28, 2001, 9 pages.
Friedman et al., "Detection of a Schrodinger's Cat State in an rf-SQUID," arXiv:cond-mat/0004293 2:1-7, Apr. 19, 2000.
Friedman et al., "Quantum superposition of distinct macroscopic states," Nature 406:43-46, Jul. 6, 2000.
Grajcar et al., "Adiabatic quantum computation with flux qubits, first experimental results", arXiv, Feb. 25, 2007. https://arxiv.org/abs/cond-mat/0702580.
Grajcar et al., "Experimental Realization of Direct Josephson Coupling Between Superconducting Flux Qubits," arXiv:cond-mat/0501085v1, Jan. 5, 2005, 4 pages.
Grajcar et al., "Four-Qubit Device with Mixed Couplings", Physical Review Letters, Oct. 2, 2006. https://journals.aps.org/prl/abstract/10.1103/PhysRevLett.96.047006.
Grajcar et al., "Possible Implementation of Adiabatic Quantum Algorithm with Superconducting Flux Qubits," arXiv:cond-mat/0407405v3 [cond-mat.supr-con], Mar. 29, 2005, 8 pages.
Groszkowski et al., "Tunable coupling between three qubits as a building block for a superconducting quantum computer", arXiv:1102.0307v2 [quant-ph], Oct. 20, 2011. https://arxiv.org/abs/1102.0307.
Gu et al., "Encoding Universal Computation in the Ground States of Ising Lattices", arXiv:1204.1084v2 [cond-mast.stat-mech], Jul. 17, 2012. https://arxiv.org/abs/1204.1084.
Han et al., "Time-Resolved Measurement of Dissipation-Induced Decoherence in a Josephson Junction," Science 293:1457-1459, Aug. 24, 2001.
Harris et al., "A Compound Josephson Junction Coupler for Flux Qubits with Minimal Crosstalk," arXiv:0904.37841 [cond-mat.supr-con] Apr. 24, 2009, 4 pages.
Harris et al., "Probing Noise in Flux Qubits via Macroscopic Resonant Tunneling," arXiv:0712.0838 [cond-mat.mes-hall], 2008, 4 pages.
Harris et al., "Sign and Magnitude Tunable Coupler for Superconducting Flux Qubits," arXiv:cond-mat/0608253v1 [cond-mat.supr-con], Aug. 11, 2006. 5 pages.
Harris et al., "Synchronization of Multiple Coupled rf-SQUID Flux Qubits", arXiv:0903.1884v1, Mar. 11, 2009. https://arxiv.org/abs/0903.1884.
Harris et al., "Experimental Demonstration of a Robust and Scalable Flux Qubit," arXiv:0909.4321v1, Sep. 24, 2009, 20 pages.
Harris et al., "Experimental Investigation of an Eight-Qubit Unit Cell in a Superconducting Optimization Processor," arXiv:1004.1628v2, Jun. 28, 2010, 16 pages.
Hita-Perez et al., "Ultrastrong capacitive coupling of flux qubits", arXiv:2108.02549v1, Aug. 5, 2021. https://arxiv.org/abs/2108.02549.
Hu et al., "Decoherence and dephasing in spin-based solid state quantum computers", arXiv.org:cond-mat/0108339 (2001).
He et al., "Switchable Coupling Between Charge and Flux Qubits," arXiv:cond-mat/0703012v2 [cond-mat.supr-con], 5 pages, 2007.

(56) References Cited

OTHER PUBLICATIONS

Hime et al., "Solid-State Qubits with Current-Controlled Coupling," Science 314:1427-1429, 2006.
Hime et al., "Supporting Online Material for Solid-State Qubits with Current-Controlled Coupling," retrieved from http://www.sciencemag.org/cgi/content/full/314/5804/1427/DC1, 5 pages, Dec. 1, 2006.
Chinese Notice of Issuance dated Jun. 6, 2022 for Chinese Application No. 201680058686.7, 4 pages.
Harrabi, et al. "Engineered selection rules fortunable coupling in a superconducting quantum circuit", Physical Reviews B 79, 020507(r) (2009), 4 pages.
Hutter et al., "Tunable Coupling of qubits: nonadiabatic corrections", arXiv:cond-mat/0602086v2, May 12, 2006. https://arxiv.org/abs/cond-mat/0602086.
Il'ichev et al., "Continuous Monitoring of Rabi Oscillations in a Josephson Flux Qubit," Physical Review Letters 91(9):097906-1-097906-4, week ending Aug. 29, 2003.
Il'ichev et al., "Radio-Frequency Method for Investigation of Quantum Properties of Superconducting Structures," arXiv:cond-mat/0402559v3, Jun. 23, 2004, 10 pages.
Johansson et al., "Landau-Zener Transitions in an Adiabatic Quantum Computer", arXiv:0807.0797v1, Jul. 4, 2008. https://arxiv.org/abs/0807.0797.
Johnson et al., "Scalable Control System for a Superconducting Adiabatic Quantum Optimization Processor," Superconductor Science & Technology (2010).
Johnson et al., "What are the Least Tractable of Max Independent Set?", AT&T Labs, Oct. 24, 1998. https://dl.acm.org/doi/abs/10.5555/314500.315093?download=true.
Joyez et al., "Observation of Parity-Induced Suppression of Josephson Tunneling in the Superconducting Single Electron Transistor", hysical Review Letters, 72(15)12458 2461, (1994).
Kaiser et al., "Coherent Atomic Matter Waves: Proceedings of the Les Houches Summer School, Session LXXII in 1999," Springer-Verlag, New York, ISBN 286883499X, pp. 184-188, 294-295, 302-303.
Kaminsky et al., "Scalable Superconducting Architecture for Adiabatic Quantum Computation," arXiv:quant-ph/0403090v1, Mar. 11, 2004, 5 pages.
Kempe et al., "The Complexity of the Local Hamiltonian Problem", arXiv:quant-ph/0406180, Jun. 24, 2004. https://arxiv.org/abs/quant-ph/0406180.
Kerman et al., "Quantum Enhanced Optimization: Experimental Study Overview", IARPA, Oct. 26, 2015.
Kim et al., "Coupling of Josephson Current Qubits Using a Connecting Loop," Physical Review B 70:184525-1-184525-6, 2004.
Kim, "Controllable Coupling in Phase-Coupled Flux Qubits," Physical Review B 74:184501-1-184501-7, 2006.
Koch et al., "Model for 1/f Flux Noise in SQUIDs and Qubits," pp. 1-14, May 5, 2007.
Koval et al., "Narrow Long Josephson Junctions", IEEE, Jun. 1999. https://ieeexplore.ieee.org/document/783894.
Lang, "Analog was not a Computer Trademark!," Sound & Vibration:16-24, Aug. 2000.
Lanting et al., "Geometrical dependence of the low-frequency noise in superconducting flux qubits", Physical Review B, 79, 060509, Jun. 5, 2009, 4 pages.
Lantz et al., "Josephson Junction Qubit Network with Current-Controlled Interaction," Proceedings of the Fourth International Workshop on Macroscopic Quantum Coherence and Computing (MQC2'04), Jun. 7-10, 2004, 13 pages.
Lechner et al., "A quantum annealing architecture with all-to-all connectivity from local interactions", Science Advances. Oct. 23, 2015. https://advances.sciencemag.org/content/1/9/e1500838.
Leggett et al., "Dynamics of the dissipative tWo—state system", RevieWs of Modern Physics, 59, pp. 1-85, 1987.
Leib et al., "A Transmon Quantum Annealer: Decomposing Many-Body Ising Constraints into Pair Interactions", arXiv:1604.02359 [quant-ph], Apr. 8, 2016. https://arxiv.org/abs/1604.02359.
Levinson, "Principles of Lithography", The International Society for Optical Engineering, Bellingham, WA, 2001. (book details provided).
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
Lidar, "On the quantum computational complexity of the Ising spin glass partition function and of knot invariants," New Journal of Physics 6(167): 1-15, 2004.
Lykiardopoulou et al., "Improving nonstoquastic quantum annealing with spin-reversal transformations", Arxiv, Sep. 30, 2020.
Maasen van den Brink et al., "Mediated Tunable Coupling of Flux Qubits," New Journal of Physics 7(230) 2005, 19 pages.
Pashkin et al., "Quantum Oscillations in Two Coupled Charge Qubits," Nature 421:823-826, Feb. 20, 2003.
Maassen van den Brink, "Galvanic coupling of flux qubits simple theory and tunability", Superconductivity (cond-mat.supr-con), May 16, 2006. https://arxiv.org/abs/cond-mat/0605398.
Madou, Fundamentals of Microfabrication, Second Edition, CRC Press LLC, Boca Raton, Florida, 2002. (book details provided).
Majer et al., "Spectroscopy on Two Coupled Superconducting Flux Qubits," Physical Review Letters 94:090501-1-090501-4, 2005.
Majer, J.B., "Superconducting Quantum Circuits," Thesis, published by DUP Science, Dec. 13, 2002, 120 pages.
Makhlin et al., "Quantum-state engineering with Josephson-junction devices," Reviews of Modern Physics 73(2):357-400, Apr. 2001.
Martinis et al., "Decoherence of a superconducting qubit due to bias noise", Physical Review B, Mar. 25, 2003. https://journals.aps.org/prb/abstract/10.1103/PhysRevB.67.094510.
Martinis et al., "Rabi Oscillations in a Large Josephson-Junction Qubit," Physical Review Letters 89(11):117901-1-117901-4, Sep. 9, 2002.
Martinis, "Superconducting phase qubits," Quantum Inf Process 8:81-103, 2009.
Mooij et al., "Josephson Persistent-Current Qubit," Science 285:1036-1039, Aug. 13, 1999.
Nakamura et al., "Coherent control of macroscopic quantum states in a single-Cooper-pair-box," Nature 398:786-788, Apr. 29, 1999.
Neill, "A path towards quantum supremacy with superconducting qubits", PhD Thesis—University of California, Dec. 1, 2017.
Nielsen et al., "7.8 Other implementation schemes", Quantum Computing and Quantum Information, 2000. http://mmrc.amss.cas.cn/tlb/201702/W020170224608149940643.pdf.
Nielsen et al., Quantum Computation and Quantum Information, Cambridge University Press, Cambridge, 2000, "7.8 Other implementation schemes," pp. 343-345.
Nishimori et al., "Exponential enhancement of the efficiency of quantum annealing by non-stoquastic hamiltonians", arXiv:1609.03785 [quant-ph], Feb. 18, 2017. https://arxiv.org/abs/1609.03785.
Niskanen et al., "Quantum Coherent Tunable Coupling of Superconducting Qubits," Science 316:723-726, May 4, 2007.
Niskanen et al., "Tunable Coupling Scheme for Flux Qubits at the Optimal Point," Physical Review B 73:094506-1-094506-8, 2006.
Oliveria et al., "The complexity of quantum spin systems on a two-dimensional square lattice", arXiv:quant-ph/0504050, Aug. 1, 2008. https://arxiv.org/abs/quant-ph/0504050.
Orlando et al., "Superconducting persistent-current qubit," Physical Review B 60(22):15398-15413, Dec. 1, 1999.
Paauw et al., "Spectroscopy on Two Coupled Superconducting Flux Qubits", Physical Review Letters, Mar. 9, 2005. https://journals.aps.org/prl/abstract/10.1103/PhysRevLett.94.090501.
"A High-Level Look at Optimization: Past, Present and Future," e-Optimization.Community, May 2000, pp. 1-5.
Aaronson, "Thanksgiving Special: D-Wave at MIT," Shtetl-Optimized—The Blog of Scott Aaronson, URL=http://www.scottaaronson.com/blog/?p=291, retrieved Apr. 14, 2011 (originally retrieved Nov. 28, 2007), 54 pages.
Abelson et al., "Superconductor Integrates Circuit Fabrication Technology", IEEE Invited Paper, Oct. 10, 2004. https://ieeexplore.ieee.org/document/1335546.

(56) References Cited

OTHER PUBLICATIONS

Albash et al., "Simulated Quantum Annealing with Two All-to-All Connectivity Schemes", arXiv:1603.03755v1 [quant-ph], Mar. 11, 2016. https://arxiv.org/abs/1603.03755.
Almasi et al., "Blue Gene: A vision for protein science using a petaflop supercomputer", IBM Systems Journal, 2001. https://ieeexplore.IEEE.org/document/5386970.
Al-Saidi et al., "Several small Josephson junctions in a resonant cavity: Deviation from the Dicke model", Physical Review B, Jun. 5, 2002.
Amin et al., "Decoherence in adiabatic quantum computation", arXiv:0708.0384, Aug. 2, 2007. https://arxiv.org/abs/0708.0384.
Amin et al., "Probing Noise in Superconducinting Flux Qubits Using Macroscopic Resonant Tunneling" Sep. 1, 2007.
Angelakis et al., "Many body effects and cluster state quantum computation in strongly interacting systems of photons," Quantum Information and Many Body Quantum Systems referred proceedings. Scuola Normale Superiore, CRM Series, vol. 5., 2008, pp. 1-10.
Astafiev et al., "Single-Shot Measurement of the Joseph Charge Qubit," Physical Review B 69(180507(R)):1-4, 2004.
Averin et al., "Variable Electrostatic Transformer: Controllable Coupling of Two Charge Qubits," Physical Review Letters 91(5): 057003-1-057003-4, Aug. 1, 2003.
Averin, D.V., "Adiabatic Quantum Computation with Cooper Pairs," arXiv:quant-ph/9706026v1, Jun. 13, 1997, 18 pages.
Barenco et al., "Elementary gates for quantum computation," Physical Review A 52(5):3457-3467, Nov. 1995.
Barends R. et al., "Coherent Josephson qubit suitable for scalable quantum integrated circuits," arXiv:1304.2322v1 [quant-ph], Apr. 8, 2013, 10 pages.
Bartlett et al., "Simple Nearest-Neighbor Two-Body Hamiltonian System for Which the Ground State is a Universal Resource for Quantum Computation," Physical Review A 74:040302-1-040302-4, 2006.
Berggren, "Quantum Computing With Superconductors", Proceedings of the IEEE, Oct. 1, 2004. https://www.researchgate.net/publication/2986358_Quantum_Computing_with_Superconductors.

Berkley et al., "Entangled Macroscopic Quantum States in Two Superconducting Qubits", Science, Jun. 6, 2003. https://science.sciencemag.org/content/300/5625/1548.
Biamonte et al., "Realizable Hamiltonians for universal adiabatic quantum computers," arXiv:0704.1287v2, Jun. 17, 2008, 7 pages.
Blais et al., Cavity Quantum Electrodynamics for Superconducting Electrical Circuits: An Architecture for Quantum Computation, Physical Review A 69(062320):1-14, 2004.
Blais et al., "Operation of universal gates in a solid-state quantum computer based on clean Josephson junctions between d-wave superconductors", Physical Review A, 61, 042308, 2000.
Blatter et al., "Design aspects of superconducting-phase quantum bits," Physical Review B 63: 174511-1-174511-9, 2001.
Blatter, G., "The Qubit Duet," Nature 421:796-797, Feb. 20, 2003.
Bocko et al., "Prospects for Quantum Coherent Computation Using Superconducting Electronics," IEEE Transactions on Applied Superconductivity 7(2):3638-3641, Jun. 1997.
Bravyi et al., "The Complexity of Stoquastic Local Hamiltonian Problems," arXiv:quant-ph/0606140v1, pp. 1-21, Jun. 16, 2006.
Born , et al., "Fabrication of Ultrasmall Tunnel Junctions by Electron Beam Direct-Writing", IEEE, 2001, 4 pages.
Inokuchi, "Analog Computation Using Quantum-Flux Parametron Devices," Physica C 357-360 :1618-1621, 2001.
Blais et al., "Tunable Coupling of Superconducting Qubits," arXiv:cond-mat/0207112v3 [cond-mat.mes-hall], Mar. 18, 2003, 4 pages.
dos Santos, R., "Introduction to Quantum Monte Carlo Simulations for Fermionic Systems," arXiv:cond-mat/0303551v1 [cond-mat-str-el], Mar. 26, 2003, 18 pages.
Hormozi et al., "Nonstoquastic Hamiltonians and Quantum Annealing of an Ising Spin Glass," arXiv:1609.06558v2 [quant-ph], May 15, 2017, 9 pages.
Hua et al., "Microstrip Bandpass Filters Using Dual-Mode Resonators with Internal Coupled Lines," Progress in Electromagnetics Research C, 21:99-111, 2011.
Perdomo-Ortiz et al., "Opportunities and Challenges for Quantum-Assisted Machine Learning in Near-Term Quantum Computers," arXiv:1708.09757v1 [quant-ph]. Aug. 31, 2017, 14 pages.
Weber et al., "Coherent Coupled Qubits for Quantum Annealing," arXiv:1701.06544v2 [quant-ph], Jun. 6, 2017, 14 pages.
International Search Report and Written Opinion for PCT/US2018/066613, dated Mar. 29, 2019, 24 pages.

\* cited by examiner

SYSTEMS AND METHODS FOR COUPLING QUBITS IN A QUANTUM PROCESSOR

BACKGROUND

Field

This disclosure generally relates to systems, devices, methods, and articles for quantum computation, and, in particular, for coupling qubits in a quantum processor.
Quantum Devices Quantum devices are structures in which quantum mechanical effects are observable. Quantum devices include circuits in which current transport is dominated by quantum mechanical effects. Such devices include spintronics, where electronic spin is used as a resource, and superconducting circuits. A superconducting circuit is a circuit that includes a superconducting device. A superconducting device is a device that includes a superconducting material. A superconducting material is a material that has no electrical resistance below critical levels of current, magnetic field and temperature. Both spin and superconductivity are quantum mechanical phenomena. Superconductivity is a physical phenomenon that was well known in the art at the time of filing of the present application. Quantum devices can be used for measurement instruments, in computing machinery, and the like.
Quantum Computation Quantum computation and quantum information processing are active areas of research and define classes of vendible products. A quantum computer is a system that makes direct use of at least one quantum-mechanical phenomenon, such as, superposition, tunneling, and entanglement, to perform operations on data. The elements of a quantum computer are quantum binary digits, known as qubits. Quantum computers hold the promise of providing exponential speedup for certain classes of computational problems such as computational problems simulating quantum physics. Useful speedup may exist for other classes of problems.

One model of quantum computing is adiabatic quantum computing. Adiabatic quantum computing can be suitable for solving hard optimization problems, for example. Further details on adiabatic quantum computing systems, methods, and apparatus are described, for example, in U.S. Pat. No. 7,135,701 entitled "ADIABATIC QUANTUM COMPUTATION WITH SUPERCONDUCTING QUBITS"; and U.S. Pat. No. 7,418,283 "ADIABATIC QUANTUM COMPUTATION WITH SUPERCONDUCTING QUBITS".
Quantum Annealing Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing. In quantum annealing, thermal effects and other noise may be present. The final low-energy state may not be the global energy minimum.

Adiabatic quantum computation may be considered a special case of quantum annealing. In adiabatic quantum computation, the system ideally begins and remains in its ground state throughout an adiabatic evolution. Thus, those of skill in the art will appreciate that quantum annealing systems and methods may generally be implemented on an adiabatic quantum computer. Throughout the present application, any reference to quantum annealing is intended to encompass adiabatic quantum computation unless the context requires otherwise.
Superconducting Qubits A quantum processor can be a superconducting quantum processor that includes superconducting qubits. Wendin G. and Shumeiko V. S., "SUPERCONDUCTING QUANTUM CIRCUITS, QUBITS AND COMPUTING" (arXiv:cond-mat/0508729v1, 2005), provides an introduction to the physics and principles of operation of quantized superconducting electrical circuits for quantum information processing.
Coupling Couplers (also referred to in the present application as coupling devices) can provide communicative coupling between qubits in a quantum processor. Coupling can be between adjacent and/or non-adjacent qubits. Unless expressly indicated otherwise, as used herein and in the claims, the terms couple, couples, coupling and variations of such means direct or indirect communicative coupling or communications between two or more components. A component can include, for example, a system, a subsystem, a computing machine, a circuit, an integrated circuit, a device, and/or a qubit of a quantum processor. An integrated circuit (also referred to in the present application as an IC, a chip, and a microchip) is a wafer of material (for example, silicon) populated by circuits and/or devices including, for example, resistors, capacitors, qubits, and couplers.

The foregoing examples of the related art, and limitations related thereto, are intended to be illustrative and not exclusive. Other limitations of the related art will become apparent to those of skill in the art upon a reading of the specification and a study of the drawings.

BRIEF SUMMARY

A superconducting integrated circuit may be summarized as including a first superconducting qubit comprising a first loop of material, a second superconducting qubit comprising a second loop of material, each of the first and the second loop of material superconductive in a range of temperatures below a respective critical temperature; and a superconducting coupler including a compound Josephson junction galvanically communicatively coupled to each of the first and the second loop of material; a first Josephson inductance comprising a first Josephson junction interrupting the first loop of material; and a second Josephson inductance comprising a second Josephson junction interrupting the second loop of material, wherein the first superconducting qubit is communicatively coupled to the second superconducting qubit at least in part via the first Josephson inductance and the second Josephson inductance.

A quantum processor may be summarized as including a first qubit; a second qubit; and a coupler galvanically coupled to the first and the second qubit, wherein the coupler is operable to inductively communicatively couple the first qubit and the second qubit. The first and the second qubit may be superconducting flux qubits, and the coupler may be a superconducting coupler.

The superconducting coupler may include a compound Josephson junction galvanically coupled to the first and the second superconducting qubit; and a loop of material superconductive in a range of temperatures below a critical temperature, the loop including a first Josephson inductance comprising a first Josephson junction; and a second Josephson inductance comprising a second Josephson junction, wherein the first superconducting qubit is communicatively coupled to the second superconducting qubit at least in part via the first Josephson inductance and the second Josephson inductance.

A quantum computer may be summarized as including a first resonant circuit comprising a first inductance; a first qubit electrostatically communicatively coupled to the first resonant circuit; a second resonant circuit comprising a second inductance; and a second qubit electrostatically communicatively coupled to the second resonant circuit, wherein the first resonant circuit and the second resonant circuit are inductively communicatively coupled via a mutual inductance between the first inductance and the second inductance. The first resonant circuit may be a first LC-circuit including the first inductance and a first capacitance, and the second resonant circuit may be a second LC-circuit including the second inductance and a second capacitance. The first qubit and the second qubit may each be respective superconducting flux qubits. The first qubit and the second qubit may each be respective radio frequency super conducting quantum interference devices (RF-SQUIDs). The first qubit may include a first loop of material that is superconducting in a range of temperatures below a critical temperature, the first loop of material interrupted by a first Josephson junction, the first loop including a first qubit inductance in series with the first Josephson junction and a first qubit capacitance in parallel with the first Josephson junction; and the second qubit may include a second loop of material that is superconducting in the range of temperatures, the second loop of material interrupted by a second Josephson junction, the second loop including a second qubit inductance in series with the second Josephson junction and a second qubit capacitance in parallel with the second Josephson junction.

A quantum processor may be summarized as including a first LC-circuit; a first qubit communicatively coupled to the first LC-circuit via a first capacitance; a second LC-circuit; and a second qubit communicatively coupled to the second LC-circuit via a second capacitance, the second LC-circuit communicatively coupled to the first LC-circuit via a mutual inductance, wherein the first qubit is capacitively coupled to the second qubit. The first qubit and the second qubit may each be respective superconducting qubits. The first qubit and the second qubit may each be respective superconducting flux qubits. The first qubit may be capacitively communicatively coupled to the second qubit by YY coupling.

The quantum processor may further include an interface, the interface operable to tune at least one of a sign and a magnitude of a coupling strength between the first qubit and the second qubit.

A quantum processor may be summarized as including a first LC-circuit; a first qubit communicatively coupled to the first LC-circuit via a first capacitance; a second LC-circuit; and a second qubit communicatively coupled to the second LC-circuit via a second capacitance, wherein the second LC-circuit is inductively communicatively coupled to the first qubit via a first mutual inductance, and the first LC-circuit inductively communicatively coupled to the second qubit via a second mutual inductance. The first qubit and the second qubit may each be respective superconducting qubits. The first and the second qubit may each be respective superconducting flux qubits. The first qubit may be communicatively coupled to the second qubit by YZ coupling.

The quantum processor may further include an interface, the interface operable to tune at least one of a sign and a magnitude of a coupling strength between the first qubit and the second qubit.

A quantum processor may be summarized as including a common resonator; a first LC-circuit; a second LC-circuit; a first qubit communicatively coupled to the first LC-circuit via a first capacitance, the first LC-circuit inductively communicatively coupled to the common resonator via a first mutual inductance; and a second qubit communicatively coupled to the second LC-circuit via a second capacitance, the second LC-circuit inductively communicatively coupled to the common resonator via a second mutual inductance, wherein the first qubit and the second qubit are each communicatively coupled to one another via the common resonator. The first qubit and the second qubit may each be respective superconducting qubits. The first qubit and the second qubit may each be respective superconducting flux qubits. The first qubit may be capacitively communicatively coupled to the second qubit.

The quantum processor may further include an interface, the interface operable to tune at least one of a sign and a magnitude of a coupling strength between the first qubit and the second qubit.

The quantum processor may further include a third LC-circuit; a third qubit communicatively coupled to the third LC-circuit via a third capacitance, the third LC-circuit inductively communicatively coupled to the common resonator via a third mutual inductance. The first, the second, and the third qubits may each be respective superconducting qubits. The first, the second, and the third qubits may each be respective superconducting flux qubits. The first qubit may be capacitively communicatively coupled to the second qubit, the second qubit may be capacitively communicatively coupled to the third qubit, and the third qubit may be capacitively communicatively coupled to the first qubit.

The quantum processor may further include a first interface operable to tune at least one of a sign and a magnitude of a coupling strength between the first qubit and the second qubit; a second interface operable to tune at least one of a sign and a magnitude of a coupling strength between the second qubit and the third qubit; and a third interface operable to tune at least one of a sign and a magnitude of a coupling strength between the third qubit and the first qubit.

A circuit may be summarized as including: a first device, the first device including: a first loop, the first loop comprising a material that is superconductive in a range of temperatures below a respective critical temperature, the first loop interrupted by a first Josephson junction; and a first device inductance in series with the first Josephson junction; and a second device, the second device comprising: a second loop, the second loop comprising a material that is superconductive in a range of temperatures below a respective critical temperature, the second loop interrupted by a second Josephson junction; and a second device inductance in series with the second Josephson junction, a coupling device comprising a third loop, the third loop comprising a material that is superconductive in a range of temperatures below a respective critical temperature, the third loop interrupted by a third Josephson junction, the third loop comprising a plurality of coupling inductances, each coupling inductance in series with the third Josephson junction, a portion of the third loop shared with a portion of the first loop to form a first common segment, wherein the second device is communicatively coupled to the first device by: an inductive coupling of the first device inductance to a first one of the plurality of coupling inductances; an inductive coupling of the second device inductance to a second one of the plurality of coupling inductances; and a galvanic coupling by the first common segment.

At least one of the first device and the second device may further include a third device inductance, the second device communicatively coupled to the first device by: an inductive coupling of the third device inductance to a third one of the plurality of coupling inductances. The third loop may further include a second common segment, the second common segment in common with the second loop, the second device communicatively coupled to the first device by a coupling that further includes a galvanic coupling by the second common segment. At least one of the first device and the second device may further include a third device inductance, the second device communicatively coupled to the first device by: an inductive coupling of the third device inductance to a third one of the plurality of coupling inductances. The circuit may be an integrated circuit. The first device may be a first qubit, and the second device may be a second qubit. The first device may be a superconducting flux qubit, and the second device may be a superconducting flux qubit. At least one of the first Josephson junction, the second Josephson junction, and the third Josephson junction may be a compound Josephson junction. At least one of the first Josephson junction and the second Josephson junction may be a compound-compound Josephson junction. At least one of the first device inductance, the second device inductance, and the plurality of coupling inductances may include a plurality of inductive segments.

A circuit may be summarized as including: a first device, the first device comprising a first loop, the first loop comprising a material that is superconductive in a range of temperatures below a respective critical temperature, the first loop interrupted by a first Josephson junction; and a second device, the second device comprising a second loop, the second loop comprising a material that is superconductive in a range of temperatures below a respective critical temperature, the second loop interrupted by a second Josephson junction, a coupling device comprising a third loop, the third loop comprising a material that is superconductive in a range of temperatures below a respective critical temperature, the third loop comprising an ordered sequence of segments, the ordered sequence comprising in order a first segment in common with a segment of the first loop; a second segment interrupted by a third Josephson junction; a third segment in common with a segment of the second loop; and a fourth segment interrupted by a fourth Josephson junction, wherein the second device is communicatively coupled to the first device by a galvanic coupling by the first segment and the second segment.

At least one of the third Josephson junction and the fourth Josephson junction may be operable as an L-tuner. The circuit may be an integrated circuit. The first device may be a first qubit, and the second device may be a second qubit. The first device may be a superconducting flux qubit, and the second device may be a superconducting flux qubit. At least one of the first Josephson junction, the second Josephson junction, the third Josephson junction, and the fourth Josephson junction may be a compound Josephson junction. At least one of the first Josephson junction and the second Josephson junction may be a compound-compound Josephson junction. At least one of the first device inductance, the second device inductance, the first coupling inductance, and the second coupling inductance may include a plurality of inductive segments.

A circuit may be summarized as including: a first device, the first device comprising a first device loop, the first device loop comprising a material that is superconductive in a range of temperatures below a respective critical temperature, the first device loop interrupted by a first Josephson junction, the first device loop comprising a first device inductance; and a second device, the second device comprising a second device loop, the second device loop comprising a material that is superconductive in a range of temperatures below a respective critical temperature, the second device loop interrupted by a second Josephson junction, the second device loop comprising a second device inductance; a coupling device comprising: a first coupling loop comprising a material that is superconductive in a range of temperatures below a respective critical temperature, the first coupling loop interrupted by a third Josephson junction, the first coupling loop comprising: a first coupling inductance; and a first segment in common with a segment of the second device loop, the second coupling loop comprising: a second coupling inductance; and a second segment in common with a segment of the first device loop, wherein the first coupling loop is inductively communicatively coupled to the first device by the first coupling inductance and the first device inductance, the second coupling loop is inductively communicatively coupled to the second device by the second coupling inductance and the second device inductance, the first coupling loop is galvanically communicatively coupled to the second device by the first segment, and the second coupling loop is galvanically communicatively coupled to the first device by the second segment.

The circuit may be an integrated circuit. The first device may be a qubit, and the second device may be a qubit. The first device may be a superconducting flux qubit, and the second device may be a superconducting flux qubit. At least one of the first Josephson junction, the second Josephson junction, and the third Josephson junction may be a compound Josephson junction. At least one of the first Josephson junction and the second Josephson junction may be a compound-compound Josephson junction. At least one of the first device inductance, the second device inductance, the first coupling inductance, and the second coupling inductance may include a plurality of inductive segments.

A circuit may be summarized as including: a first device, the first device comprising a first device loop, the first device loop comprising a material that is superconductive in a range of temperatures below a respective critical temperature, the first device loop interrupted by a first Josephson junction, the first device loop comprising a first device inductance; and a second device, the second device comprising a second device loop, the second device loop comprising a material that is superconductive in a range of temperatures below a respective critical temperature, the second device loop interrupted by a second Josephson junction, the second device loop comprising a second device inductance; a coupling device comprising: a first coupling loop comprising a material that is superconductive in a range of temperatures below a respective critical temperature, the first coupling loop comprising an ordered sequence of segments, the ordered sequence comprising in order: a first segment comprising a first coupling inductance; a second segment interrupted by a third Josephson junction; a third segment comprising a second coupling inductance; and a fourth segment interrupted by a fourth Josephson junction, wherein the second device is communicatively coupled to the first device by an inductive coupling by the first coupling inductance and the second coupling inductance.

The circuit may be an integrated circuit. The first device may be a qubit, and the second device may be a qubit. The first device may be a superconducting flux qubit, and the second device may be a superconducting flux qubit. At least one of the first Josephson junction, the second Josephson junction, and the third Josephson junction may be a compound Josephson junction. At least one of the first Josephson junction and the second Josephson junction may be a compound-compound Josephson junction. At least one of the first device inductance, the second device inductance, the first coupling inductance, and the second coupling inductance may include a plurality of inductive segments.

A circuit may be summarized as including a first device, the first device comprising a first device loop, the first device loop comprising a material that is superconductive in a range of temperatures below a respective critical temperature, the first device loop interrupted by a first Josephson junction, the first device loop comprising a first device inductance; and a second device, the second device comprising a second device loop, the second device loop comprising a material that is superconductive in a range of temperatures below a respective critical temperature, the second device loop interrupted by a second Josephson junction, the second device loop comprising a second device inductance; a coupling device comprising a first coupling loop comprising a material that is superconductive in a range of temperatures below a respective critical temperature, the first coupling loop interrupted by a third Josephson junction, the first coupling loop comprising a first, a second, and a third coupling device inductance; and a first interface comprising a first interface inductance and a first current source, the first interface operable to provide a flux bias to the first coupling loop by a communicative coupling of the first interface inductance to the first coupling inductance, wherein the first device is communicatively coupled to the second device by a communicative coupling of the first device inductance to the second coupling device inductance and a communicative coupling of the second device inductance to the third coupling device inductance.

The first and the second device may be a superconducting flux qubit. The first and the second Josephson junction may be one of a compound Josephson junction and a compound-compound Josephson junction. The third Josephson junction may be one of a compound Josephson junction and a compound-compound Josephson junction.

In various of the above implementations, the circuit may include a second interface comprising a second interface inductance and a second current source, the first device loop comprising a third device inductance, the second interface operable to provide a flux bias to the first device loop by a communicative coupling of the second interface inductance to the third device inductance; and a third interface comprising a third interface inductance and a third current source, the second device loop comprising a fourth device inductance, the third interface operable to provide a flux bias to the second device loop by a communicative coupling of the third interface inductance to the fourth device inductance.

A superconducting integrated circuit may be summarized as including a stack, the stack comprising an upper layer, the upper layer comprising a first winding, the first winding comprising a material that is superconductive in a range of temperatures below a respective critical temperature the first winding comprising a first inductance; a lower layer, the lower layer lower in the stack than the upper layer, the lower layer comprising a second winding, the second winding comprising a material that is superconductive in a range of temperatures below a respective critical temperature the second winding comprising a second inductance: and an intervening layer, the intervening layer between the upper and lower layer in the stack, the intervening layer comprising a first device loop, the first loop comprising a material that is superconductive in a range of temperatures below a respective critical temperature, the first device loop comprising a third and a fourth inductance, wherein the first winding is inductively coupled to the device loop by the first and the third inductance, and the second winding is inductively coupled to the first device loop by the second and the fourth inductance.

In some implementations, the first device loop is a loop of a first superconducting flux qubit. In some implementations, at least one of the first winding, the second winding, and the device loop includes niobium. In some implementations, the first winding is superconductingly electrically coupled to the second winding by a vertical interconnect access (via). In some implementations, at least one of the first winding and the second winding is galvanically communicatively coupled to the device loop. In various of the above implementations, at least one of the first and the second winding is at least one of galvanically and inductively communicatively coupled to a second device loop. The second device loop may be a loop of a second superconducting flux qubit.

A circuit may be summarized as including a first device, the first device comprising a first loop, the first loop comprising a material that is superconductive in a range of temperatures below a respective critical temperature, the first loop interrupted by a first Josephson junction, and a first body L-tuner in series with the first Josephson junction, the first loop including a first coupling L-tuner a second device, the second device comprising a second loop, the second loop comprising a material that is superconductive in a range of temperatures below a respective critical temperature, the second loop interrupted by a second Josephson junction, and a second body device L-tuner in series with the second Josephson junction, the second loop including a second coupling L-tuner and a coupling device comprising a third loop, the third loop comprising a material that is superconductive in a range of temperatures below a respective critical temperature, the third loop interrupted by a first and a second capacitance, and the first and the second coupling L-tuner, wherein the first device is capacitively communicatively coupled to the second device with a coupling strength determined at least in part by adjusting at least of the first and the second body L-tuner and the first and the second coupling L-tuner.

In some implementations, at least one of the first and the second loop includes niobium. In some implementations, at least one of the first and the second Josephson junction is at least one of a compound Josephson junction and a compound-compound Josephson junction.

In various of the above implementations, at least one of the first and the second body L-tuner and the first and the second coupling L-tuner is at least one of a compound Josephson junction and a compound-compound Josephson junction. The coupling strength may be determined at least in part by applying a flux bias to the at least one of a compound Josephson junction and a compound-compound Josephson junction. The coupling strength may be determined at least in part by applying a flux bias using an inductively communicably coupled interface.

BRIEF DESCRIPTION OF THE SEVERAL
VIEWS OF THE DRAWING(S)

In the drawings, identical reference numbers identify similar elements or acts. The sizes and relative positions of elements in the drawings are not necessarily drawn to scale.

For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been selected for ease of recognition in the drawings.

Figure 18:
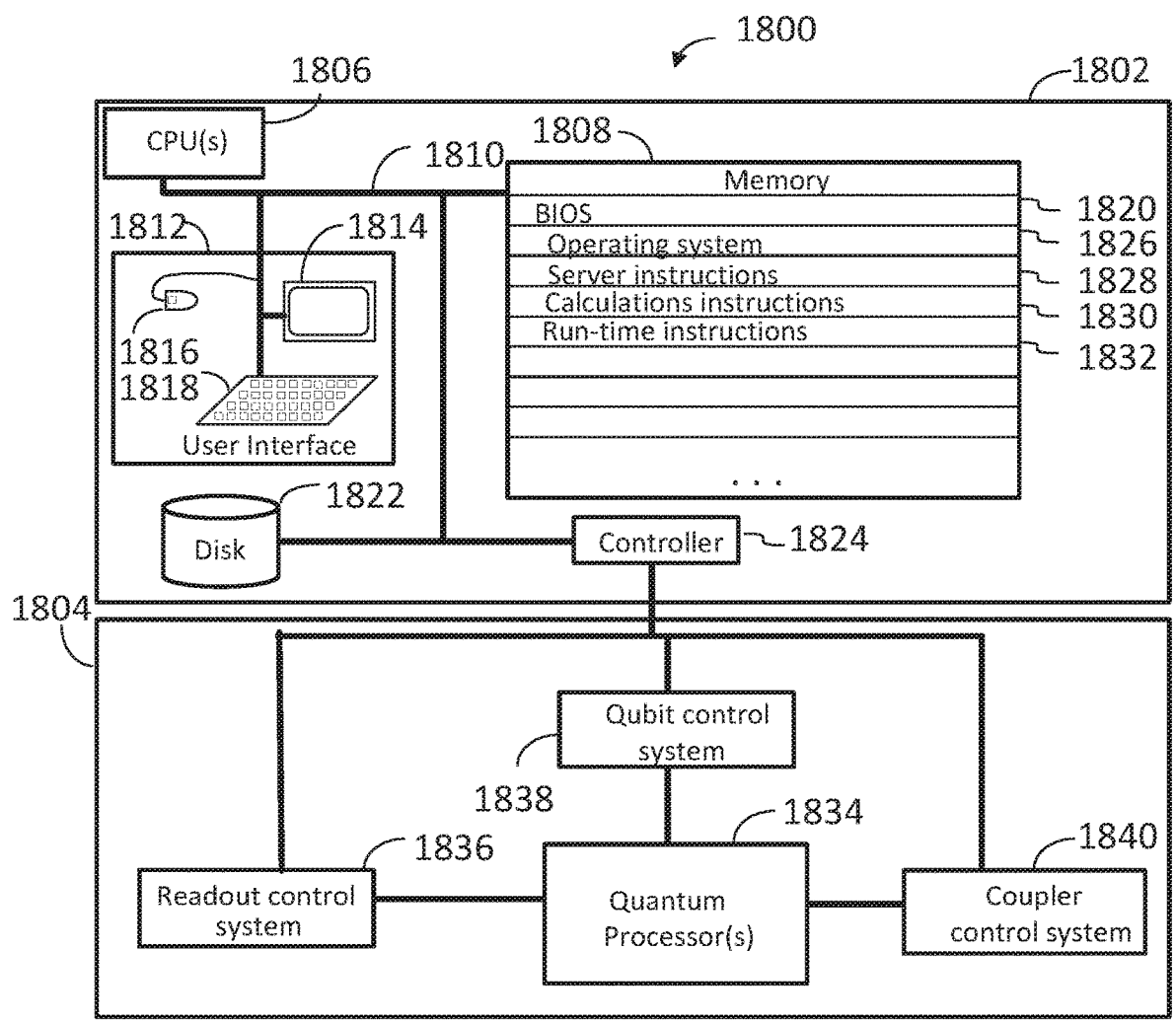

FIG. 18 schematic diagram of an example hybrid computing system comprising a classical, digital computer communicatively or operatively coupled with an analog computer, the classical, digital computer including one or more digital processors, and the analog computer, for example, in the form of a quantum computer with one or more quantum processors, in accordance with the present systems, devices, articles, and methods.

DETAILED DESCRIPTION

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, couplers, and control systems including microprocessors and drive circuitry have not been shown or described in detail to avoid unnecessarily obscuring descriptions of the embodiments of the present methods. Throughout this specification and the appended claims, the words "element" and "elements" are used to encompass, but are not limited to, all such structures, systems, and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content dearly dictates otherwise. Thus, for example, reference to a problem-solving system including "a quantum processor" includes a single quantum processor, or two or more quantum processors. It should also be noted that the term "or" is generally employed in its sense including "and/or" unless the content dearly dictates otherwise.

The headings provided herein are for convenience only and do not interpret the scope or meaning of the embodiments.

See below for a description of an example hybrid computing system with reference to FIG. 11.

Galvanic Coupling

It can be desirable to reduce the size of superconducting devices in a superconducting integrated circuit. For example, it can be desirable to reduce the size of superconducting qubits (for example, superconducting flux qubits) in a superconducting integrated circuit. A benefit of smaller superconducting qubits can be a reduction in an intrinsic error, for example an intrinsic error caused by a background susceptibility. Another benefit of smaller superconducting qubits can be a boosted energy scale resulting from an increase in a persistent current. A persistent current in a superconducting material is a flow of charge without resistance. A persistent current can be created by causing a material to become superconducting while charge is flowing through it, or by changing a magnetic field around a material while the material is superconducting.

A superconducting qubit can be communicatively coupled to another superconducting qubit by a superconducting coupling device (also referred to in the present application as a coupler). One implementation of a coupler is a coupler comprising a compound Josephson junction (CJJ) (also referred to in the present application as a CJJ coupler). A compound Josephson junction (CJJ) structure is a Josephson junction structure that includes two parallel current paths, each of the two parallel current paths formed of a superconducting material, and each of the two parallel current paths interrupted by a respective Josephson junction structure. In some implementations, at least one of the Josephson junction structures of the CJJ is a single Josephson junction. In some implementations, at least one of the Josephson junction structures of the CJJ is another CJJ. It is understood that the behavior of a CJJ may be modeled in effect as a single Josephson junction.

In operation of a CJJ coupler, inductive coupling can occur between the body of the CJJ coupler and the body of a qubit. Inductive coupling (also referred to in the present application as magnetic coupling) is a coupling between two conductors configured such that a change in current through one conductor induces a voltage across the ends of the other conductor through electromagnetic induction.

Inductive coupling between the body of the CJJ coupler and the body of each of two qubits can cause the qubits to be inductively communicatively coupled to one another.

In quantum mechanics, a Hamiltonian is an operator corresponding to an energy of a system, usually the total energy of the system. A spectrum of the Hamiltonian is a set of possible outcomes when one measures the energy of the system. The Hamiltonian is closely related to a time-evolution of the system. The Hamiltonian can be a Hamiltonian of a computational problem, and is referred to in the present application as a problem Hamiltonian.

The energy scale for specifying a problem Hamiltonian in a quantum process that includes superconducting flux qubits and superconducting couplers depends at least in part on $M_{afm}I_P^2$ where $M_{afm}=M_1M_2\chi_{afm}$, $M_1$ is a mutual inductance between a first qubit and the body of a coupler, $M_2$ is a mutual inductance between a second qubit and body of the coupler, $\chi_{afm}$ is an antiferromagnetic susceptibility of the superconducting material from which the superconducting flux qubits and superconducting coupler are made, and $I_P$ is a persistent current (see definition above). Magnetic susceptibility is a measure of magnetic properties of a material. Susceptibility can indicate whether a material is attracted to or repelled from a magnetic field. Ferromagnetic, ferrimagnetic, and antiferromagnetic materials can possess a permanent magnetization even without an external magnetic field.

A mutual inductance can be expressed in terms of the inductance of a primary and a secondary as follows:

$$M=k\sqrt{L_{primary}L_{secondary}}$$

where $0 \le k \le 1$ and k is a coupling constant.

It is generally desirable to attempt to make the mutual inductance for a given primary and secondary transformer as large as practically possible. As the size of the qubit is reduced, it can be challenging to achieve sufficiently large values of coupling constant k, and hence it can be challenging to achieve sufficiently large values of mutual inductance M.

One approach to achieving larger values of k is to use a galvanic coupling (also referred to in the present application as a galvanic connection) for one of the two mutual inductances between the coupler and the qubit. A galvanic connection is a coupling that provides a direct current path between coupled components.

Even with a galvanic connection for one of the two mutual inductances between the coupler and the qubit, an inductor is conventionally still used to form a primary of the galvanic transformer. As the qubit shrinks, it can remain challenging to achieve the desired value of mutual inductance M.

The present application describes an approach to galvanic coupling in which the primary inductance of the transformer is replaced by a Josephson junction (JJ) with inductance $L_{JJ}=\Phi_0/2\pi I_C$ where $\Phi_0$ is the superconducting magnetic flux quantum, and $I_C$ is the critical current.

The Josephson junction inductance, $L_{JJ}$, can be more compact than a conventional inductor. For example, the critical current of a typical Josephson junction can be approximately 20 μA, and the Josephson junction inductance can be approximately 16 pH. The physical footprint of an inductor formed by a Josephson junction can be, for example, only approximately 2.5 μm×2.5 μm.

Figure 1A:
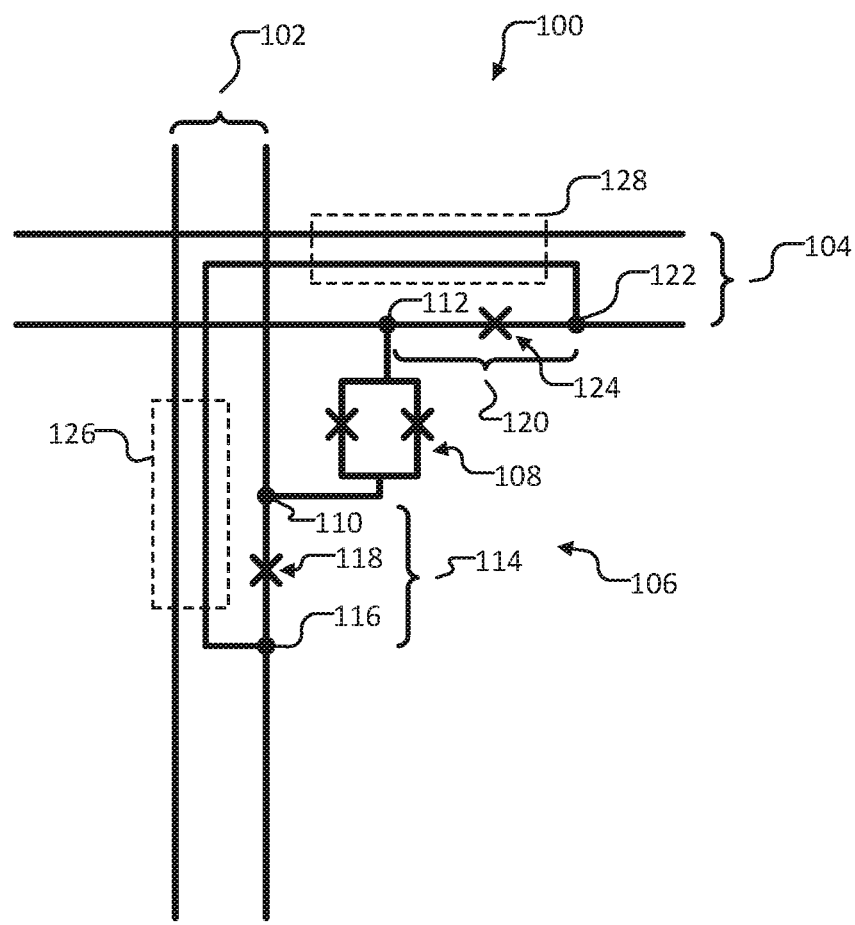
FIG. 1A is a schematic diagram illustrating an example implementation of a portion of a superconducting circuit with a JJ-galvanic CJJ coupler, in accordance with the present systems, devices, articles, and methods.

FIG. 1A is a schematic diagram illustrating an example implementation of a portion 100 of a superconducting circuit with a JJ-galvanic CJJ coupler, in accordance with the present systems, devices, articles, and methods. The superconducting circuit to which portion 100 belongs comprises at least two superconducting qubits. Superconducting qubits are qubits that are superconducting in a range of temperatures, typically in a range of temperatures below a critical temperature characteristic of a material from which the qubits are made. Each superconducting qubit comprises a loop of material that is superconductive in a range of temperatures, typically in a range of temperatures below a critical temperature characteristic of the material (also referred to in the present application as superconductive material). FIG. 1A illustrates a) a first portion 102 of a loop of a first superconducting qubit, and b) a second portion 104 of a loop of a second superconducting qubit.

In the example implementation illustrated in FIG. 1A, first portion 102 is oriented vertically on the layout of the circuit (i.e., first portion 102 runs up and down the drawing sheet), and second portion 104 is oriented horizontally on the layout of the circuit (i.e., second portion 104 runs left and right across the drawing sheet). FIG. 1A illustrates a region in which the loops of the two superconducting qubits cross each another on the layout of the circuit. In the example implementation of FIG. 1A, the loops of the two superconducting qubits are perpendicular to each other, and cross each other at ninety degrees or at a steep angle close to ninety degrees. In some implementations, the loops of the two superconducting qubits cross each other at an angle of less than ninety degrees.

In another implementation, the loops of the two superconducting qubits come close to one another without crossing. In yet another implementation, the two superconducting qubits do not come close to one another, and are coupled by a long-range coupler.

Those of skill art will appreciate that at least a portion of the loop of a superconducting qubit can be at a suitable orientation on the layout of the circuit, and is not limited to a vertical or horizontal orientation. Those of skill in the art will appreciate that the loops of two superconducting qubits that cross one another on the layout of the circuit or come close to one another or are coupled by a long-range coupler can be at a suitable orientation with respect to each other, and not limited to a perpendicular or an orthogonal orientation.

JJ-galvanic CJJ coupler 106 (see also separate illustration in FIG. 1B) comprises compound Josephson junction (CJJ) 108 connected to first portion 102 at node 110, and connected to second portion 104 at node 112. A first Josephson inductance 114 comprises a) a segment of first portion 102 between node 110 and node 116, and b) Josephson junction 118.

A Josephson junction (for example, Josephson junction 118 of FIG. 1) can behave as a non-linear inductance which accumulates (magnetic field) energy when a current passes through it. In contrast to real inductance, no magnetic field is created by a supercurrent in a Josephson junction—the accumulated energy is the Josephson energy. One of the basic equations that governs the behavior of a Josephson junction is the following:

$$I(t) = I_C \sin(\varphi(t))$$

where I(t) is the current through the Josephson junction, $I_C$ is the "critical current" of the junction, and $\varphi(t)$ is the Josephson phase across the junction.

The voltage V across the junction can be expressed as:

$$V = \frac{\Phi_0}{2\pi} \frac{\partial \varphi}{\partial t}$$

where $\Phi_0$ is a magnetic flux quantum.

A voltage V across a conventional inductance L can be expressed as:

$$y = L \frac{\partial I}{\partial t}$$

By analogy, a Josephson inductance can be defined as:

$$L_J(\varphi_0) = \frac{\Phi_0}{2\pi I_C \cos \varphi_0}$$

where $\varphi_0$ is the Josephson phase across the junction.

A second Josephson inductance 120 comprises a) a segment of second portion 104 between node 112 and 122, and b) Josephson junction 124.

Dashed rectangle 126 indicates inductive communicative coupling of JJ-galvanic CJJ coupler 106 with first portion 102 of the first superconducting qubit. Dashed rectangle 128 indicates inductive communicative coupling of JJ-galvanic CJJ coupler 106 with second portion 104 of the second superconducting qubit. In one implementation, the main coupling inductance between the first and the second superconducting qubits is provided by first Josephson inductance 114 and second Josephson inductance 120.

Figure 1B:
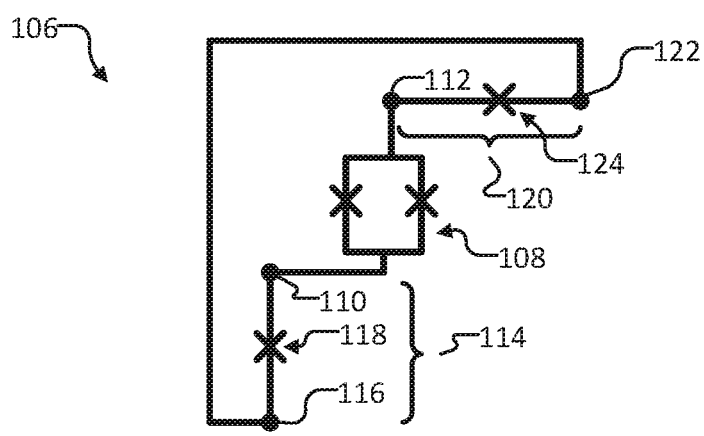
FIG. 1B is a schematic diagram illustrating the JJ-galvanic CJJ coupler of FIG. 1A.

FIG. 1B is a schematic diagram illustrating JJ-galvanic CJJ coupler 106 of FIG. 1A. JJ-galvanic CJJ coupler 106 is described above. Structures of JJ-galvanic CJJ coupler 106 illustrated in FIG. 1B that are similar or even identical to corresponding structures illustrated in FIG. 1A are labeled with the same reference numbers as those used in FIG. 1A.

Superconducting Flux Qubits

Figure 2A:
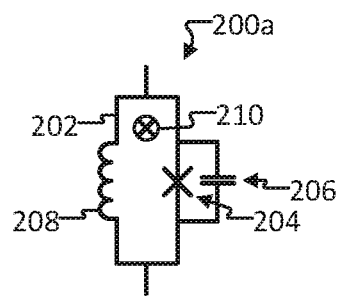
FIG. 2A is a schematic diagram illustrating an example implementation of a superconducting flux qubit, in accordance with the present systems, devices, articles, and methods.

FIG. 2A is a schematic diagram illustrating an example implementation of a superconducting flux qubit 200a, in accordance with the present systems, devices, articles, and methods. Qubit 200a comprises a loop 202 comprising a material that is superconductive in a range of temperatures, typically in a range of temperatures below a critical temperature characteristic of the material (also referred to in the present application as superconductive material). Loop 202 is interrupted by a Josephson junction 204. Qubit 200a further comprises a capacitance 206 in parallel with Josephson junction 204, and an inductance 208 in series with the parallel combination of Josephson junction 204 and capacitance 206. In some implementations, capacitance 206 is an intrinsic capacitance (also referred to in the present application as an inherent capacitance). In operation, a flux 210 can thread loop 202.

Figure 2B:
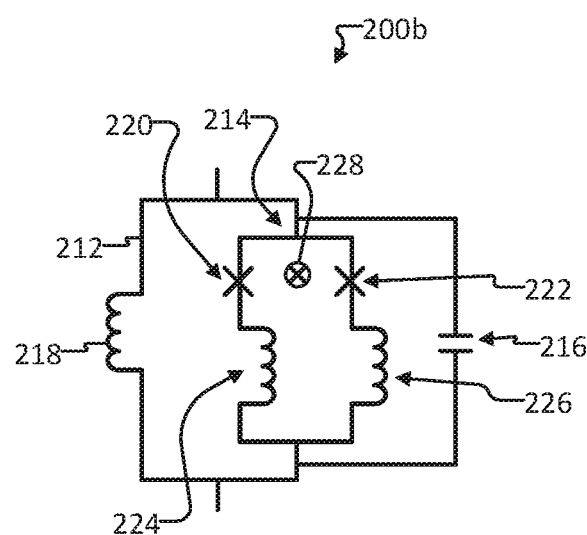
FIG. 2B is a schematic diagram illustrating another example implementation of a superconducting flux qubit, in accordance with the present systems, devices, articles, and methods.

FIG. 2B is a schematic diagram illustrating another example implementation of a superconducting flux qubit 200b, in accordance with the present systems, devices, articles, and methods. Qubit 200b comprises a loop 212 comprising a superconductive material. Loop 212 is interrupted by a compound Josephson junction (CJJ) 214. Qubit 212 further comprises a capacitance 216 in parallel with CJJ 214, and an inductance 218 in series with the parallel combination of CJJ 214 and capacitance 216. In some implementations, capacitance 216 is an intrinsic capacitance. CJJ 214 comprises a parallel arrangement of two Josephson junctions 220 and 222, each Josephson junction 220, 222 in series with an inductance 224 and 226, respectively. In operation, a flux 228 can thread CJJ 214.

Symmetric Long-Range Couplers

The present application describes a symmetric coupler for long-range couplings in a quantum annealer. Long-range couplings between qubits in a quantum annealer can be beneficial. Long-range couplings can increase the connectivity of a graph that can be natively represented in the quantum annealer, thereby improving the ability of the hardware structure to accommodate problems that it might not otherwise be able to accommodate.

One challenge with implementing long-range couplers in a quantum annealer is that the increased inductance and/or capacitance of the body of the long-range coupler, compared to a local coupler, can reduce an energy scale of the coupler.

A coupler can be characterized at least in part by a coupling strength which in the present application refers to a strength of coupling between coupled qubits in a quantum annealer. A coupling can depend on an energy scale at which one observes the coupling.

As the energy scale of the coupler is reduced, and becomes comparable to the energy scale of a coupled qubit in the quantum annealer, the coupler can provide additional energy eigenstates for tunneling. The additional energy eigenstates can be eigenstates that are not described in an Ising representation (also referred to in the present application as an Ising model) of a computational problem embedded in the quantum annealer. An Ising model can include discrete variables that represent magnetic dipole moments of spins that can be in one of two states (+1 or −1). The spins can be arranged in a graph, for example a lattice, allowing each spin to interact with its neighboring spin in the graph. Performance of the quantum annealer can be adversely affected by the presence of the additional energy eigenstates. For example, in the presence of the additional energy eigenstates, the quantum annealer can fail to provide suitable solutions to computational problems such as optimization and/or sampling.

It can be desirable for a long-range coupler to have a first excited energy eigenstate with an energy scale much higher than the energy scale of a coupled qubit, for example an order of magnitude higher.

In conventional implementations, a coupler in a quantum annealer typically provides communicative coupling between neighboring or nearby qubits. For example, in one implementation of a quantum annealer, the qubits are superconducting flux qubits, and the superconducting coupler operates over a distance of a few tens of micrometers. A superconducting flux qubit is typically a micrometer-sized loop of superconducting material interrupted by one or more Josephson junctions, and operable as a quantum bit in a quantum computer (for example, a quantum annealer). While conventional implementations of couplers can usually be analyzed using a lumped-element circuit model, it can be advantageous to analyze long-range couplers using a transmission line model (also referred to in the present application as a distributed circuit model). In a lumped-element circuit model, the physical dimensions of the circuit are such that a voltage across a conductor coupling two elements of the circuit does not vary. Similarly, a current through a conductor coupling the two elements of the circuit does not vary. In a distributed model, voltage and current along conductors and elements of the circuit can vary. Unlike, the lumped-element circuit model, phase change and/or transit time cannot be neglected.

In the various figures of the present application, circuits are generally illustrated according a lumped-element circuit model. For example, an inductance is generally illustrated as an inductor (also referred to in the present application as an inductance or lumped-element inductance) connected to one or more other circuit elements by a conductor. It should be understood that each circuit in the various figures of the present application, or at least an equivalent circuit, can be illustrated according to a respective distributed or transmission line model.

Extending the coupler to provide communicative coupling between two or more qubits separated by more than a few tens of micrometers can be a challenge. Firstly, the energy of a first excited state of the coupler can be low enough to be comparable to the energy of a state of a coupled qubit (e.g., a few GHz), and the presence of the coupler can perturb an energy spectrum of the coupled qubit. Secondly, if the compound Josephson junction (CJJ) of the coupler is positioned closer to one of the coupled qubits than another coupled qubit, then the coupler is asymmetric, and the energy spectrum of the closer qubit can show a greater impact of the couplers presence than the energy spectrum of another coupled qubit. Consequently, it can be a challenge to maintain an at least approximately homogeneous (comparable) energy scale across multiple qubits in the quantum annealer.

The present application describes a symmetric long-range coupler in which a CJJ is positioned at least approximately at the half-way point along the length of the body of the coupler. In one example of a symmetric long-range coupler, the CJJ is positioned between 45% of the way along the length of the body of the coupler and 55% of the way along the length of the body of the coupler. The energy of a first excited state of the symmetric long-range coupler can be significantly higher than for an asymmetric long-range coupler. An asymmetric long-range coupler is one in which a CJJ is positioned significantly closer to one end of the body of the coupler than the other end. In one example of an asymmetric long-range coupler, the CJJ is positioned at a point less than or equal to 45% of the way along the length of the body of the coupler or at a point greater than or equal to 55% of the way along the length of the body of the coupler.

In one implementation, the energy of the first excited state of the symmetric long-range coupler is approximately 70% higher than an asymmetric long-range coupler. A benefit of the higher energy of the first excited state of the symmetric long-range coupler is a reduction in the impact of the couplers presence on the energy spectrum of a coupled qubit.

Figure 3:
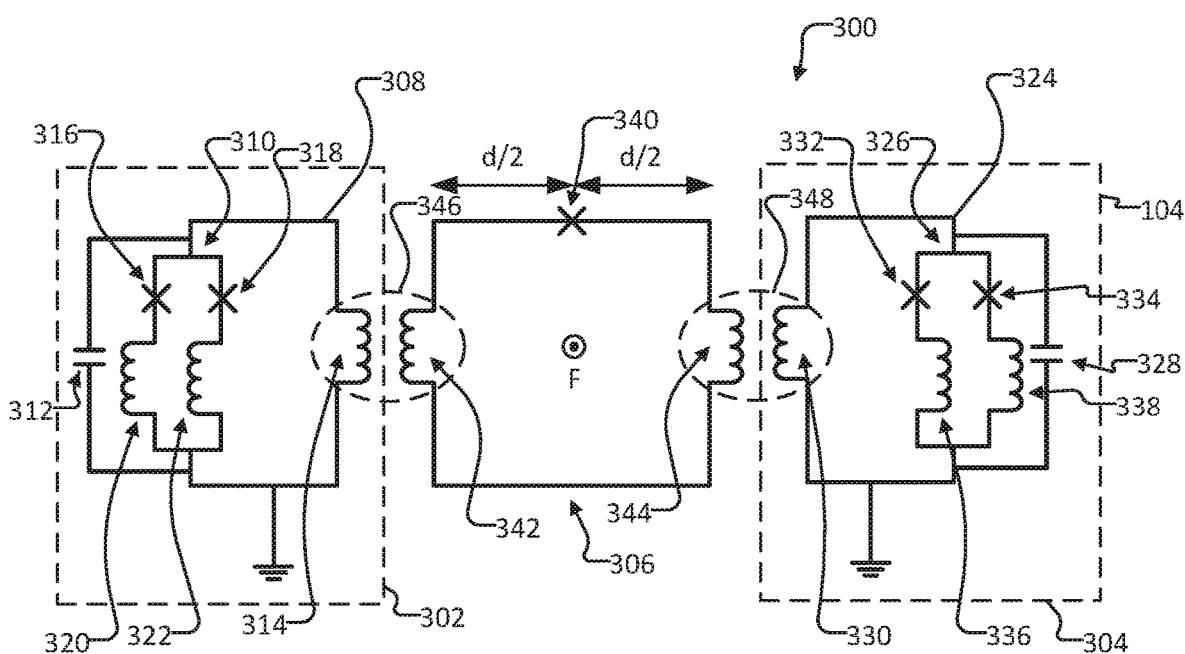
FIG. 3 is a schematic diagram illustrating an example implementation of a circuit comprising two qubits, and a symmetric coupler, in accordance with the present systems, devices, articles, and methods.

FIG. 3 is a schematic diagram illustrating an example implementation of a circuit 300 comprising two qubits 302 and 304, and a symmetric coupler 306, in accordance with the present systems, devices, articles, and methods. In one implementation, qubits 302 and 304 are superconducting flux qubits. In another implementation, qubits 302 and 304 are charge qubits or hybrid charge-phase qubits or another suitable type of qubits.

Qubit 302 comprises a loop 308 of material that is superconductive in a range of temperatures. Loop 308 is interrupted by a compound Josephson junction (CJJ) 310. Qubit 302 further comprises a capacitance 312 in parallel with CJJ 310, and an inductance 314 in series with the parallel combination of CJJ 310 and capacitance 312. In some implementations, capacitance 312 is an intrinsic capacitance. CJJ 310 comprises a parallel arrangement of two Josephson junctions 316 and 318, each junction in series with an inductance 320 and 322, respectively.

Qubit 304 comprises a loop 324 of material that is superconductive in a range of temperatures. Loop 324 is interrupted by a compound Josephson junction (CJJ) 326. Qubit 304 further comprises a capacitance 328 in parallel with CJJ 326, and an inductance 330 in series with the parallel combination of CJJ 326 and capacitance 328. In some implementations, capacitance 328 is an intrinsic capacitance of CJJ 326. CJJ 326 comprises a parallel arrangement of two Josephson junctions 332 and 334, each junction in series with an inductance 336 and 338, respectively.

Coupler 306 comprises a Josephson junction (JJ) 340, and inductances 342 and 344. In one implementation, JJ 340 is a compound Josephson junction. JJ 340 can be placed at least approximately halfway between inductances 342 and 344. In the example illustrated in FIG. 3, JJ 340 is placed a distance d/2 from each of inductances 342 and 344 where d is the wire length i.e., the distance between inductance 342 and inductance 344.

Inductance 314 of qubit 302 and inductance 342 of coupler 306 form a mutual inductance 346. Inductance 330 of qubit 304 and inductance 344 of coupler 306 form a mutual inductance 348. Mutual inductances 346 and 348 are indicated by dashed lines in FIG. 3.

In some implementations of a quantum annealer, qubits in at least a subset of qubits are communicatively coupled by symmetric long-range couplers (such as symmetric coupler 306 of FIG. 3). In some implementations, coupler 306 is a tunable coupler. The coupling strength of the tunable coupler can be tuned, for example via an interface (not shown in FIG. 3).

In the example implementation illustrated in FIG. 3, qubits 302 and 304 comprise a CJJ (310 and 326 respectively). Those of skill in the art will appreciate that alternative qubit implementations may be used.

In an example implementation, the mutual inductance (coupling strength) between a qubit and a symmetric coupler (such as coupler 306 of FIG. 3) is 40 pH, the wire length d is 600 µm, the total inductance of the coupler is 470 pH, the junction critical current is 0.7 µA, the ratio of energy in the junction to energy in the inductance is 1.03, the mutual inductance (coupling strength) is 1.68 pH, and the resonance frequencies of the coupler are 42.5 GHz and 50.9 GHz for the antiferromagnetic (AFM) and ferromagnetic (FM) cases, respectively.

C-Couplers

A Hamiltonian is referred to in the present application as a "stoquastic" Hamiltonian if it is given by a real Hermitian matrix in which all off-diagonal elements of the matrix are non-positive in the standard basis. Otherwise, the Hamiltonian is referred to as a "non-stoquastic" Hamiltonian. Hormozi et. al. in "NONSTOQUASTIC HAMILTONIANS AND QUANTUM ANNEALING OF AN ISING SPIN GLASS" (arxiv.org/pdf/1609.06558, May 2017) describe the role of Hamiltonian complexity in the performance of a quantum annealer.

A signature of a system with a non-stoquastic Hamiltonian is that the system can exhibit destructive interference between tunneling paths that cannot be efficiently simulated by a stochastic method. Interference can occur when two waves meet. Destructive interference can occur when one wave has a displacement in an opposite direction to the other wave. Destructive interference between tunneling paths can result in a lower tunneling amplitude.

A quantum system with a non-stoquastic Hamiltonian cannot be efficiently simulated by a Quantum Monte-Carlo (QMC) method—the most advanced classical simulation method. QMC methods are described further, for example, in R. R. dos Santos, "Introduction to Quantum Monte Carlo Simulations for Fermionic Systems", arXiv:cond-mat/0303551 [cond-mat.str-el](2003). There is evidence that a non-stoquastic Hamiltonian can improve the efficiency of quantum annealing.

The present application describes implementations of a quantum processor that includes qubits and couplers with a non-stoquastic Hamiltonian to enhance multi-qubit tunneling during quantum annealing. This may be useful for simulating Fermionic systems or in general quantum tunneling problems with tunneling amplitudes of different signs using quantum annealing via a quantum processor. A Fermionic system is a system including fermions. A fermion is a particle with half-integer spin (e.g. 1/2, 3/2 and the like). Protons and neutrons are examples of fermions.

One approach to realizing a non-stoquastic Hamiltonian in quantum annealing is to use high-order couplings through a flux degree of freedom in the compound Josephson junction (CJJ) loop. Couplings between three or more qubits are referred to in the present application as higher-order couplings. Another approach to realizing a non-stoquastic Hamiltonian in quantum annealing is to use an annealing time (also referred to in the present application as an anneal time) that is short enough to bring the system into a non-adiabatic regime. The annealing time is a duration of a quantum annealing operation.

In a quantum processor that includes flux qubits (also referred to in the present application as superconducting flux qubits), magnetic coupling can provide $\sigma_z\sigma_z$ coupling terms in the Hamiltonian. The $\sigma_z\sigma_z$ coupling terms are stoquastic. A non-stoquastic Hamiltonian can be engineered by coupling qubits using another degree of freedom, for example by coupling qubits using a charge or electrostatic degree of freedom. In one implementation, qubits can be coupled using a charge degree of freedom by providing capacitive coupling between qubits.

Superconducting charge qubits, phase qubits, and hybrid charge-phase qubits can have capacitive communicative coupling (see, for example, U.S. Pat. No. 7,253,654 "SUPERCONDUCTING QUBITS HAVING A PLURALITY OF CAPACITIVE COUPLINGS"). U.S. Pat. No. 7,613,765 entitled "BUS ARCHITECTURE FOR QUANTUM PROCESSING" describes controllable coupling of a qubit to a superconducting bus, including a state in which the qubit is capacitively coupled to the bus. Tunable capacitive coupling can be used to couple information between superconducting qubits (see, for example, Averin et al. Physical Review Letters 91, 05003 [2003]). Approaches to communications between qubits to provide an architecture for universal adiabatic quantum computation are described in U.S. Pat. No. 8,234,103 entitled "PHYSICAL REALIZATIONS OF A UNIVERSAL ADIABATIC QUANTUM COMPUTER". A quantum processor with communicative coupling between pairs of qubits via an in-situ tunable superconducting capacitive coupler and an in-situ tunable superconducting inductive coupler is described in U.S. Patent Application US20150111754 entitled "UNIVERSAL ADIABATIC QUANTUM COMPUTING WITH SUPERCONDUCTING QUBITS".

The present application describes an approach in which the bodies of magnetically-coupled flux qubits are additionally coupled using capacitors, as detailed below with reference to FIG. 4. Coupling capacitors such as those shown in FIG. 4 can give rise to $\sigma_y\sigma_y$ coupling terms between qubits. The pairwise electrostatic couplings when complemented by anti-ferromagnetic (AFM) couplings between flux qubits can give rise to a non-stoquastic Hamiltonian. If one single-qubit tunneling amplitude has the opposite sign to that of the other qubit, a non-stoquastic Hamiltonian can be achieved when the pairwise electrostatic couplings are complemented by ferromagnetic (FM) couplings. The sign of the single-qubit tunneling amplitude can be tuned by dressing a qubit with microwave radiation that is resonant to a transition frequency from the qubits first excited state to its second excited state.

The non-stoquastic nature of the Hamiltonian can be detected by measuring destructive quantum inference in a multi-qubit system.

The presently described approach for realizing a non-stoquastic Hamiltonian can be scaled up to systems with many qubits (for example, more than 50 qubits). The present application describes how, in a network of superconducting flux qubits, all-to-all (fully-connected) electrostatic $\sigma_y \sigma_y$ couplings can be realized with an implementation that includes sparse capacitive couplings. In an example implementation, in an eight-qubit arrangement of qubits, a bipartite capacitance matrix can lead to a fully-connected charge-coupling matrix. Qubits with direct capacitive couplings may be coupled more strongly than those without direct couplings.

As described above, the Hamiltonian of capacitively-coupled flux qubits can be non-stoquastic if the qubits also have anti-ferromagnetic (AFM) couplings between them. In the case of qubits also having ferromagnetic (FM) couplings, the Hamiltonian of capacitively-coupled flux qubits can be non-stoquastic if the single-qubit tunneling amplitudes have opposite signs.

Figure 6:
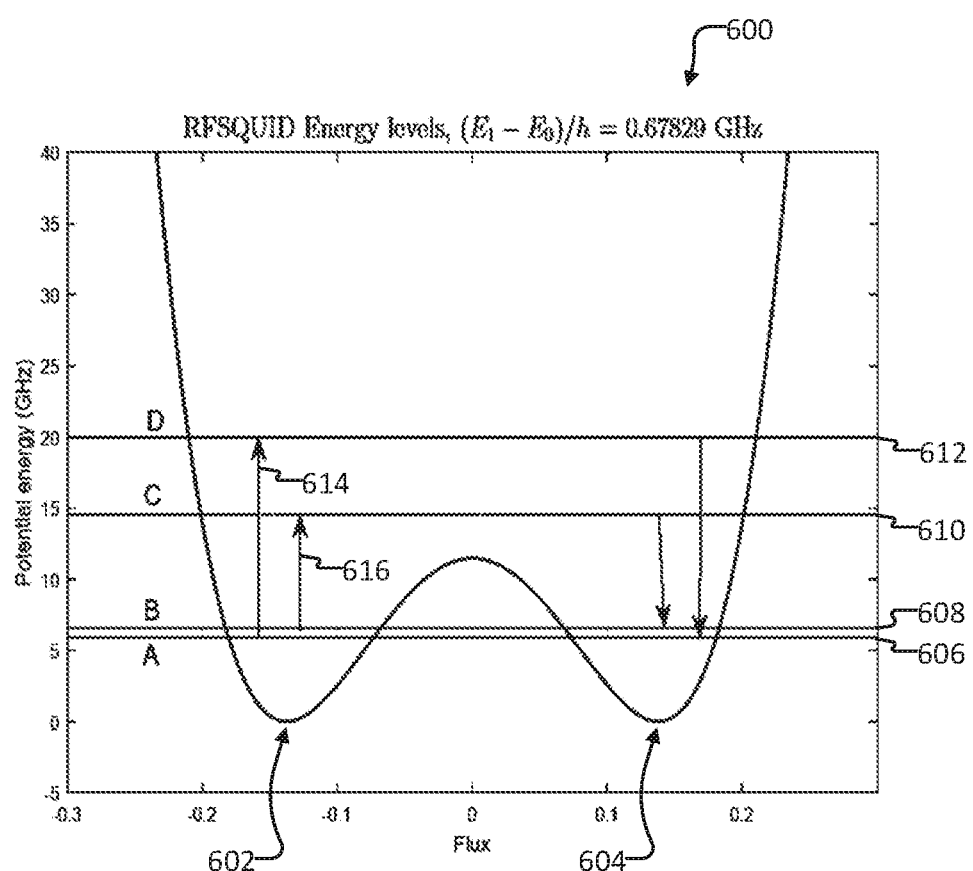
FIG. 6 is a plot illustrating an example double-well potential energy curve 600.
Figure 7:
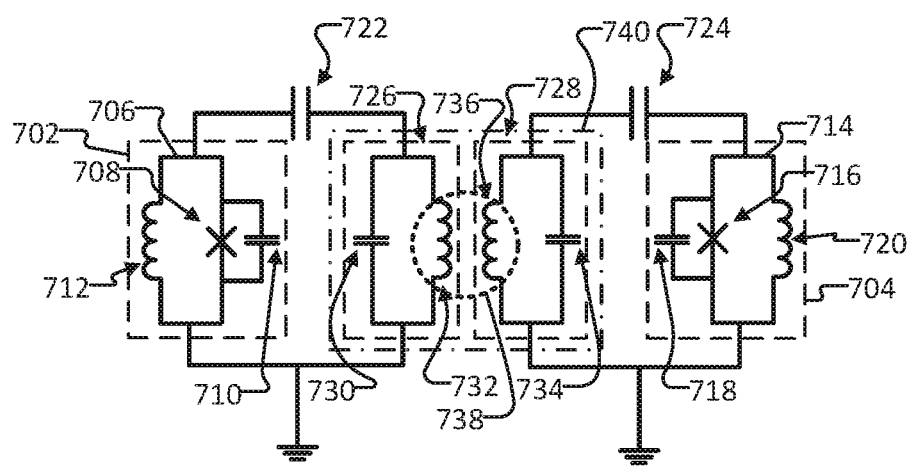
FIG. 7 is a schematic diagram of an example implementation of a circuit 700 of a superconducting quantum processor, in accordance with the present systems, devices, articles, and methods.

In one implementation, the sign of single-qubit tunneling amplitudes (also referred to in the present application as $\Delta_i$ for the $i^{th}$ qubit) can be tuned using systems and methods described in the present application (see, for example, FIGS. 6 and 7 and accompanying description).

In one implementation, coupling capacitors can be added between qubits in at least a subset of magnetically (inductively) communicatively coupled pairs of qubits in the quantum processor to achieve a non-stoquastic Hamiltonian. The non-stoquastic Hamiltonian can result in multi-qubit tunneling and longer-range qubit-to-qubit correlations, effects that can be challenging to simulate using a classical computer. One benefit of a non-stoquastic quantum annealer is that hard Ising problems can be solved faster by a non-stoquastic quantum annealer than by a stoquastic quantum annealer. A hard Ising problem is a problem represented by an Ising model that is computationally intractable. Another benefit is that a non-stoquastic quantum annealer can be used for simulations of Fermionic systems.

Figure 4:
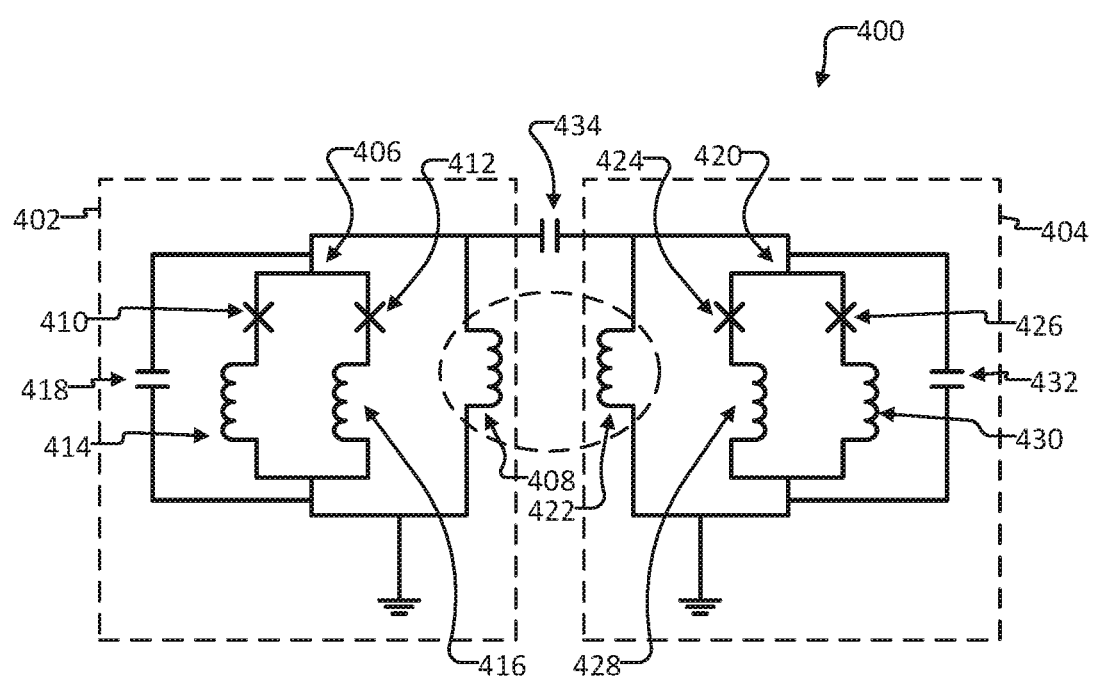
FIG. 4 is a schematic diagram illustrating an example implementation of a portion 400 of a superconducting quantum processor, in accordance with the present systems, devices, articles, and methods.

FIG. 4 is a schematic diagram illustrating an example implementation of a portion 400 of a superconducting quantum processor, in accordance with the present systems, devices, articles, and methods. Portion 400 of the superconducting quantum processor comprises qubits 402 and 404 (each indicated via respective broken line rectangles enclosing the qubits 402 and 404). In one implementation, qubit 402 and/or qubit 404 is a superconducting flux qubit. In another implementation, qubits 402 and 404 are charge qubits or hybrid charge-phase qubits or another suitable type of qubits.

Qubit 402 comprises a compound Josephson junction (CJJ) 406 and an inductance 408. CJJ 406 comprises Josephson junctions 410 and 412, inductances 414 and 416, and a capacitance 418. In some implementations, capacitance 418 is an intrinsic capacitance of CJJ 406. Qubit 404 comprises a compound Josephson junction (CJJ) 420 and an inductance 422. CJJ 420 comprises Josephson junctions 424 and 426, inductances 428 and 430, and a capacitance 432. In some implementations, capacitance 432 is an intrinsic capacitance of CJJ 420.

Qubits 402 and 404 can be magnetically (inductively) communicatively coupled via a mutual inductance from proximity of inductance 408 of qubit 402 and inductance 422 of qubit 404. In one implementation, the inductive communicative coupling of qubits 402 and 404 can be performed using a coupling device such as tunable coupler 1004 of FIG. 10A. In one implementation, the inductive communicative coupling of qubits 402 and 404 is tunable, and the coupling strength can be tuned, for example via an interface (not shown in FIG. 4).

Portion 400 of the superconducting quantum processor comprises a coupling capacitance 434. Qubits 402 and 404 can be capacitively communicatively coupled via coupling capacitance 434.

In one implementation, coupling capacitance 434 of FIG. 4 has a value of approximately 400 F which can be much larger than the single-qubit total capacitance. For example, the total capacitance of first qubit 402 can be determined at least in part from the value of capacitance 418, and the total capacitance of second qubit 404 can be determined at least in part from the value of capacitance 432. When coupling capacitance 434 is much larger than the single-qubit total capacitance, the loaded capacitance approaches a value of twice the single-qubit total capacitance. In this regime, the coupling energy $I_y$ may not have a strong dependence on the single-qubit total capacitance.

A description of stoquastic and non-stoquastic Hamiltonians, and expressions for effective tunneling amplitudes are provided below following a description of FIG. 7.

C-Shunt

Figure 5:
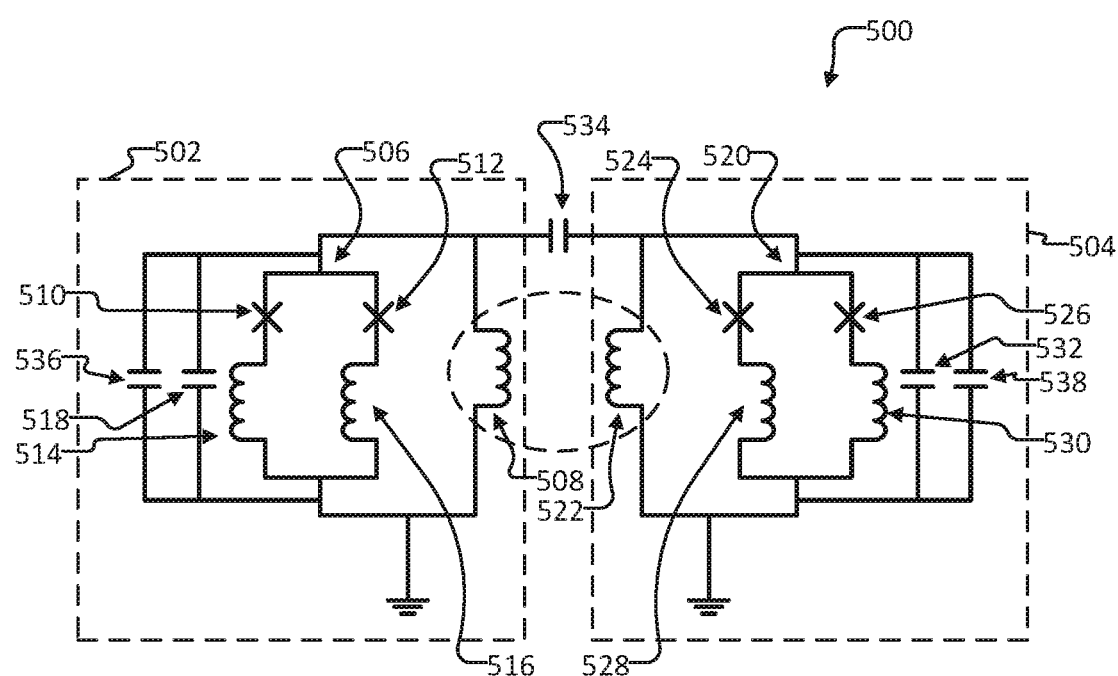
FIG. 5 is a schematic diagram illustrating an example implementation of a portion 500 of a quantum processor, in accordance with the present systems, devices, articles, and methods.

FIG. 5 is a schematic diagram illustrating an example implementation of a portion 500 of a quantum processor, in accordance with the present systems, devices, articles, and methods.

Portion 500 of the superconducting quantum processor comprises qubits 502 and 504 (each indicated via respective broken line rectangles enclosing the qubits 502 and 504), similar in some respects to qubits 402 and 404 (FIG. 4). In contrast to the implementation of FIG. 4, qubit 502 additionally comprises a capacitance 536 (also referred to in the present application as a shunt capacitance 536), and qubit 504 additionally comprises a capacitance 538 (also referred to in the present application as a shunt capacitance 538). In one implementation, capacitances 518 and 532 are inherent capacitances (also referred to in the present application as intrinsic capacitances), and shunt capacitances 536 and 538 are overlap capacitances. Shunt capacitances 536 and 538 can advantageously be higher quality capacitances than capacitances 518 and 532, and can increase the overall quality of the total capacitance of qubits 502 and 504, respectively. Higher-quality qubit capacitance can lead to improved quantum coherence, which can be desirable.

The quality of a capacitor (a device having capacitance) can be expressed in terms of a quality factor defined as the ratio of the reactance of the capacitor to the equivalent series resistance of the capacitor. The quality factor can be frequency dependent. The quality factor can be a measure of the ratio of energy stored in the capacitor to energy dissipated as thermal losses. The quality factor can be used in the design of RF circuits. High-quality capacitors can be used, for example, to reduce high-frequency losses.

Inductive and capacitive communicative coupling between qubits can be tunable coupling. In one implementation, an interface provides tuning of at least one of a sign and a magnitude of a coupling strength. In one implementation, the interface is via a flux bias provided to tune the coupling strength of inductive communicative coupling between qubits.

Microwave-Assisted Tunneling

The present application includes a description of systems and methods for tuning a sign and/or a magnitude of an effective tunneling amplitude $\Delta_{eff}$ of a qubit that is characterized by a double-well potential. The double-well potential is one of a number of quartic potentials of interest in quantum mechanics. One example of a qubit characterized by a two-well potential is an RF-SQUID qubit. For a description of an RF-SQUID qubit, see, for example, M. H. S. Amin et al, JOSEPHSON-PHASE QUBIT WITHOUT TUNNELING, Phys. Rev. B 67, 100508 (2003), and U.S. Pat. No. 6,943,368 entitled "QUANTUM LOGIC USING THREE ENERGY LEVELS".

In one implementation, changing a sign and/or a magnitude of a contribution to an effective tunneling amplitude of a single qubit can be used to create destructive interference and a non-stoquastic Hamiltonian of a system of many coupled qubits. In another implementation, inclusion of capacitive coupling and operation in the antiferromagnetic (AFM) regime (as described above in reference to FIGS. 4 and 5) can be used to create destructive interference and a non-stoquastic Hamiltonian.

FIG. 6 is a plot illustrating an example double-well potential energy curve 600. Double-well potential energy curve 600 has a left-hand well 602 and a right-hand well 604. An RF-SQUID can have four states denoted by $|A\rangle$, $|B\rangle$, $|C\rangle$, and $|D\rangle$ corresponding to the four lowest energy levels of the qubit $E_A$, $E_B$, $E_C$, and $E_D$ respectively (in sequence with $|A\rangle$ corresponding to the lowest energy level), and indicated by 606, 608, 608, and 612, respectively, in FIG. 6.

A microwave field can be resonant with a transition 614 between the lowest energy level $E_A$ and the highest energy level $E_D$, and can be applied to the qubit. A microwave field can be resonant with a transition 616 between the first excited state $|B\rangle$ and the second excited state $|C\rangle$, and can also be applied to the same qubit.

Applying the microwave fields described above can produce over-barrier Rabi transitions between the left-hand and right-hand wells of the double-well potential of the qubit, such as between left-hand well 602 and right-hand well 604 of double-well potential energy curve 600 of FIG. 6. A Rabi frequency can be defined as the radian frequency of a Rabi cycle undergone for a given atomic transition in a given light field. The Rabi cycle can be defined as the cyclic behavior of a two-level quantum system in the presence of an oscillatory driving field. The left, $|L\rangle$, and the right, $|R\rangle$, states of the RF-SQUID encode computation states of the qubit. Under-barrier quantum tunneling between the left-hand and right-hand wells can also occur.

In one implementation, a system operable to produce over-barrier Rabi transitions includes one or more GHz microwave lines with inductive and/or capacitance couplings to the qubits. The qubits can be coherent low-noise qubits. The system can be controlled with timing on a scale of less than one nanosecond to read out the qubits.

Rabi microwave-induced transitions between first excited state B) and second excited state $|C\rangle$ (at zero or at negative de-tunings) and/or Rabi transitions between ground state $|A\rangle$ and third excited state $|D\rangle$ (at positive de-tunings) can create at least one additional contribution to the effective tunneling amplitude between the left-hand and right-hand wells of the potential energy curve of the qubit. The additional contribution to the effective tunneling amplitude can have a sign that is opposite to the sign of the standard under-barrier tunneling amplitude $\Delta$.

Changing the sign of the tunneling amplitude of a qubit, by applying a microwave field as described above in reference to FIG. 6, can lead to destructive interference, and creation of a non-stoquastic Hamiltonian for a system of electrostatically-coupled RF-SQUID qubits.

A benefit of the system and methods described in the present application is that the system of electrostatically-coupled RF-SQUID qubits can be characterized by higher energy scales than a conventional RF-SQUID. Consequently, the quantum computation can be performed at a higher temperature.

In some implementations, the under-barrier quantum tunneling plays a less significant role than the over-barrier tunneling, and can be suppressed by introducing a shunting capacitance to the quantum circuit.

A qubit with a larger capacitance typically has a lower level of noise, and consequently more quantum coherence.

FIG. 7 is a schematic diagram of an example implementation of a circuit 700 of a superconducting quantum processor, in accordance with the present systems, devices, articles, and methods. Circuit 700 comprises two qubits 702 and 704 (each indicated via respective broken line rectangles enclosing the qubits 702 and 704). In one implementation, qubits 702 and 704 are superconducting flux qubits.

Qubit 702 comprises a body 706, a Josephson junction 708, a capacitance 710, and an inductance 712. In one implementation, body 706 comprises a loop of superconductive material. Josephson junction 708 can be a compound Josephson junction that includes two Josephson junctions in parallel with one another. In one implementation, capacitance 710 is an inherent capacitance of Josephson junction 708.

Qubit 704 comprises a body 714, a Josephson junction 716, a capacitance 718, and an inductance 720. In one implementation, body 714 comprises a loop of superconductive material. Josephson junction 716 can be a compound Josephson junction that includes two Josephson junctions in parallel with one another. In one implementation, capacitance 718 is an inherent capacitance of Josephson junction 716.

Qubits 702 and 704 can be electrostatically communicatively coupled (also referred to in the present application as capacitively communicatively coupled) via coupling capacitors 722 and 724, and LC-circuits 726 and 728 (each indicated via respective broken line rectangles enclosing the qubits 726 and 728). LC-circuit 726 comprises a capacitance 730 and an inductance 732. LC-circuit 728 comprises a capacitance 734 and an inductance 736. LC-circuits 726 and 728 may also be referred to in the present application as resonators 726 and 728, or resonant tanks 726 and 728.

Each of LC-circuits 726 and 728 may include a respective Josephson junction (not shown in FIG. 7) coupled in parallel with each circuits capacitance, 730 and 734, respectively. Each of LC-circuits 726 and 728 may include a respective Josephson junction, and capacitance 730 and 734 may be an intrinsic capacitance of the respective Josephson junction.

LC-circuits 726 and 728 can have a non-zero mutual inductance 738 due to proximity of inductances 732 and 736. Mutual inductance 738 can provide inductive communicative coupling between LC-circuits 726 and 728. The inductively coupled LC-circuits 726 and 728 can form a two-mode resonator 740. Circuit 700 comprises two qubits electrostatically communicatively coupled via two-mode resonator 740 (indicated via broken line rectangle enclosing the two-mode resonator 740).

The two qubits 702 and 704 can be magnetically (inductively) communicatively coupled via a mutual inductance (not shown in FIG. 7).

A Hamiltonian of two flux qubits with magnetic and electrostatic coupling can be expressed as follows:

$$H = -\Delta_1 \sigma_1^x - h_1 \sigma_1^z - \Delta_2 \sigma_2^x - h_2 \sigma_2^z + J_z \sigma_1^z \sigma_2^z + J_x \sigma_1^x \sigma_2^x + J_y \sigma_1^y \sigma_2^y$$

The Hamiltonian in the above equation describes two flux qubits with XX, YY, and ZZ coupling, and with biases $h_1$ and $h_2$ applied to the qubits.

The above expression is valid for small, non-zero biases. The Hamiltonian is referred to in the present application as a stoquastic Hamiltonian if it is given by a real Hermitian matrix and if there exists a local basis in which all off-diagonal elements of the matrix are non-positive (i.e., negative or equal to zero). Otherwise, the Hamiltonian is referred to as a non-stoquastic Hamiltonian, i.e., the Hamiltonian is referred to as a non-stoquastic Hamiltonian if, in all local bases, some off-diagonal elements of the matrix are positive.

A two-qubit Hamiltonian (for example, the Hamiltonian H in the above equation) can be a non-stoquastic Hamiltonian if, and only if, there is a non-zero bias applied to at least one of the qubits. In some implementations, the non-zero bias is very small.

In one implementation, the computational basis for two qubits has four states as follows:

$|1\rangle = |L_1, L_2\rangle$ $|2\rangle = |L_1, R_2\rangle$ $|3\rangle = |R_1, L_2\rangle$ $|4\rangle = |R_1, R_2\rangle$ In this basis, the two-qubit Hamiltonian can be written as:

$$H = \begin{pmatrix} h_1 + h_2 + J_z & -\Delta_2 & -\Delta_1 & J_x - J_y \\ -\Delta_2 & h_1 - h_2 - J_z & J_x + J_y & -\Delta_1 \\ -\Delta_1 & J_x + J_y & -h_1 + h_2 - J_z & -\Delta_2 \\ J_x - J_y & -\Delta_1 & -\Delta_2 & -h_1 - h_2 + J_z \end{pmatrix}$$

In the anti-ferromagnetic case (AFM), with large positive magnetic coupling $J_z > 0$, states $|2\rangle$ and $|3\rangle$ can have the lowest energies. Effective tunneling between the two states can be described by:

$$H_{23} = \Delta_{eff}(|2\rangle\langle 3| + |3\rangle\langle 2|)$$

where the effective tunneling amplitude can be expressed as follows:

$$\Delta_{eff} = J_x + J_y - \frac{\Delta_1 \Delta_2}{|J_z|}$$

The above expression can be valid for small, non-zero biases, for example when $|h_1|, |h_2| \ll |J_z|$.

The effective tunneling amplitude can be positive when $$J_x + J_y = \frac{\Delta_1 \Delta_2}{|J_z|}$$

thereby making the Hamiltonian non-stoquastic in the presence of positive XX and YY couplings.

If $\Delta_1 \Delta_2 > 0$, then a two-qubit Hamiltonian can be non-stoquastic if there exists a positive XX coupling $J_x > 0$, or a positive YY coupling $J_y > 0$, or a combination of couplings such that $J_x + J_y > 0$. FIG. 4 illustrates an example implementation of YY coupling using capacitive coupling. In FIG. 4, for example, the YY coupling can be positive i.e., $J_y > 0$. The onset of a non-stoquastic Hamiltonian can be accompanied by destructive interference at the point where $$J_x + J_y = \frac{\Delta_1 \Delta_2}{|J_z|}$$

In the case of ferromagnetic (FM) coupling between qubits, with:

$$J_z = -|J_z| < 0$$

states $|1\rangle$ and $|4\rangle$ can have the lowest energies. Effective tunneling between the two states can be described by:

$$H_{14} = \Delta_{eff}(|1\rangle\langle 4| + |4\rangle\langle 1|)$$

where an effective tunneling amplitude can be expressed as follows:

$$\Delta_{eff} = J_x - J_y - \frac{\Delta_1 \Delta_2}{|J_z|}$$

As before, positive YY coupling can be provided, for example, by capacitive coupling between the two qubits. In the absence of XX coupling, destructive interference where $\Delta_{eff} = 0$ can occur at:

$$J_y = -\Delta_1 \Delta_2 / |J_z|$$

The effect is generally only possible if the tunneling amplitudes have opposite signs i.e., $\Delta_1 \Delta_2 < 0$.

In some implementations, a sign of a single-qubit tunneling amplitude of a qubit can be changed by applying microwave radiation to an rf-SQUID representing the qubit.

In some implementations, the Hamiltonian of two capacitively-coupled qubits can be non-stoquastic only in the presence of a non-zero bias applied to at least one of the coupled qubits.

Referring again to the states described in FIG. 6, the present application describes systems and methods for changing a sign of a tunneling amplitude of a qubit such as a flux qubit. Rabi microwave-induced transitions between states $|B\rangle$ and $|C\rangle$ (at zero of negative de-tunings), or Rabi transitions between states $|A\rangle$ and $|D\rangle$ (at positive de-tunings), can create additional transfer amplitudes between the left and right states of the qubit, the amplitudes having opposite signs to the under-barrier tunneling amplitude.

An interaction of a double-well qubit (for example an RF-SQUID) with microwave fields can be expressed by a Hamiltonian as follows:

$$H_{MW} = F_D(|A\rangle\langle D| + |D\rangle\langle A|) + F_C(|B\rangle\langle C| + |C\rangle\langle B|)$$

where $F_D$ and $F_C$ are real amplitudes of the driving microwaves at frequencies $\omega_D$ and $\omega_C$, respectively.

In the example implementation described here, the microwave guide is inductively communicatively coupled to the qubit. In another implementation, the microwave guide is capacitively communicatively coupled to the qubit.

Frequency $\omega_D$ is close to the A→D transition, and frequency $\omega_C$ is close to the B→C transition. The related detuning can be expressed as follows:

$$\delta_c = E_c - \frac{E_A + E_B}{2} - \omega_c$$

$$\delta_D = E_D - \frac{E_A + E_B}{2} - \omega_D$$

$$H_{\text{eff}} = -\Delta_{\text{eff}} \sigma^x$$

$$\Delta_{\text{eff}} = \Delta + \frac{1}{2} \frac{F_C^2}{|E_g| + \delta_c} + \frac{1}{2} \frac{F_D^2}{|E_g| + \delta_D}$$

where $E_g$ is the ground state energy of the dressed qubit i.e. the qubit dressed by photons of a microwave field.

For example, at zero detuning, $\delta_C=0$ and $\delta_D=0$, and at sufficiently strong B→C driving, where $F_C^2 \geq F_D^2 + 2\Delta |E_g|$, the effective tunneling amplitude can change its sign to become negative i.e. $\Delta_{\text{eff}} < 0$. Detuning can cause the qubit to be out of resonance (i.e., for there to be a difference between the microwave frequency and the corresponding energy level). Detuning can provide an additional degree of tunability.

Sign-Tunability of Electrostatic Coupling Via Magnetically-Coupled Resonators

The present application describes a method for a sign-tunable electrostatic coupling of qubits. In one implementation, the qubits are flux qubits. Each qubit can be capacitively communicatively coupled to a respective LC-circuit (also referred to in the present application as a resonator). In turn, each resonator can be magnetically coupled to another resonator, the coupling such that, in operation, the sign of the magnetic interaction can be changed.

In one implementation, the coupled qubits can be out of resonance with a two-mode resonator (also referred to in the present application as a dual-mode resonator) formed by the coupled LC-circuits. A two-mode resonator can be used, for example, as a doubly tunable resonator. A two-mode resonator can have an odd-mode resonance and an even-mode resonance. The qubits can be effectively capacitively communicatively coupled via the resonator, and the sign of the coupling can be determined at least in part by the sign of the magnetic interaction between the LC-circuits.

The technology described above can provide a sign-tunable $\sigma_y \sigma_y$ (YY) coupling between flux qubits, for example. The sign-tunable electrostatic coupling between qubits can be mediated by a resonator. The sign and magnitude of the electrostatic coupling constant (also referred to in the present application as coupling strength) can be at least in part determined by a magnetic coupling constant proportional to a mutual inductance between two LC-circuits. The mutual inductance can be tuned by a magnetic coupler. A sign and a magnitude of an effective electrostatic coupling between flux qubits can be adjusted by tuning the mutual inductance of the two LC-circuits. Sign-tunable YY coupling can be used to implement a non-stoquastic Hamiltonian in a quantum annealer.

The technology described above can also be used in a resonant regime where frequencies of the qubits can be aligned with frequencies of a multi-mode resonator (also referred to in the present application as a bus). Strong selective electrostatic coupling of qubits can be implemented by tuning selected qubits in resonance with the bus.

In one implementation, the sign of the electrostatic coupling is fixed. For example, the sign of the electrostatic coupling can be positive.

In another implementation, the technology provides a tunable $\sigma_y \sigma_z$ (YZ) coupling between qubits. The body of a second qubit (for example a loop of superconducting material) is magnetically coupled to the LC-circuit, and the LC-circuit is electrostatically attached to a first qubit. The YZ coupler can be tuned by tuning a mutual inductance between the LC-circuit and the body of the second qubit.

In another implementation, LC-circuits that are capacitively coupled to qubits are magnetically coupled to a common resonator. The result can be an implementation of one-to-one, one-to-many, many-to-one, and/or many-to-many electrostatic coupling of flux qubits. A benefit of such coupling can be to facilitate additional tunneling paths during quantum annealing.

A multi-mode resonator formed by magnetically coupled LC-circuits can be in resonance with high-energy levels of RF-SQUIDs that form flux qubits. An effective electrostatic coupling between the RF-SQUIDs and the multi-mode resonator can induce over-barrier transitions in the RF-SQUIDs.

Referring again to FIG. 7, FIG. 7 is a schematic diagram illustrating an example implementation of a circuit 700 of a superconducting quantum processor, in accordance with the present systems, devices, articles, and methods. Circuit 700 can include YY coupling. Circuit 700 may be a portion of a circuit. Circuit 700 may be a circuit or a portion of a circuit in a quantum annealer or a quantum processor.

As described above, circuit 700 comprises two qubits 702 and 704. Circuit 700 also comprises two LC-circuits (also referred to in the present application as resonators) 726 and 728. Resonators 726 and 728 can be inductively communicatively coupled by a mutual inductance 738 (indicated by a dashed circle) between inductances 732 and 738.

In one implementation, qubits 702 and 704 are superconducting flux qubits. Mutual inductance 738 can be a sign-tunable mutual inductance. Qubits 702 and 704 can also be inductively communicatively coupled to one another, for example by a sign-tunable coupler (not shown in FIG. 7). The inductive coupling can be described in a Hamiltonian by a term $J_z \sigma_1^z \sigma_2^z$ w with coupling constant $J_z$.

The charge of a flux qubit (such as qubit 702 of FIG. 7) can be represented by a Pauli matrix $\sigma_y$. The charge can be electrostatically coupled to a charge on a coupled resonator (such as resonator 722 of FIG. 7).

A common resonator 740 (indicated by a dash-dotted box) can be formed from magnetically coupled resonators 722 and 724. In operation, when the frequencies of the common resonator are higher than the frequencies of the qubits, the charge on one qubit can be affected by the charge on the other qubit, and the two qubits can be electrostatically communicatively coupled to one another.

For two qubits, the electrostatic coupling can be described in a Hamiltonian by a term $J_y \sigma_1^y \sigma_2^y$ with a coupling constant $J_y$ at least approximated by the following expression:

$$J_y \sim \frac{M_{12}}{L_{T1} L_{T2}} \frac{\Delta^2}{\omega_T^2} \frac{C_{R1}}{\sqrt{C_1 C_{T1}}} \frac{C_{R2}}{\sqrt{C_2 C_{T2}}} \frac{(e/\pi)^2}{\sqrt{C_1 C_2}}$$

where it has been assumed that the frequencies of the resonators coupled to the qubits are at least one order of magnitude greater than the tunneling amplitudes of the qubits. In the above equation, the $i^{th}$ flux qubit has inductance $L_i$, and capacitance $C_i$. Inductance $L_{Ti}$ and capacitance $C_{Ti}$ characterize the corresponding LC-circuit. The mutual inductance between the LC-circuits is given by a sign-tunable parameter $M_{12}$.

The YY electrostatic coupling between the flux qubits can be sign-tunable. In one implementation, an interface is used to tune a sign and/or a magnitude of a coupling strength between qubits.

Figure 8:
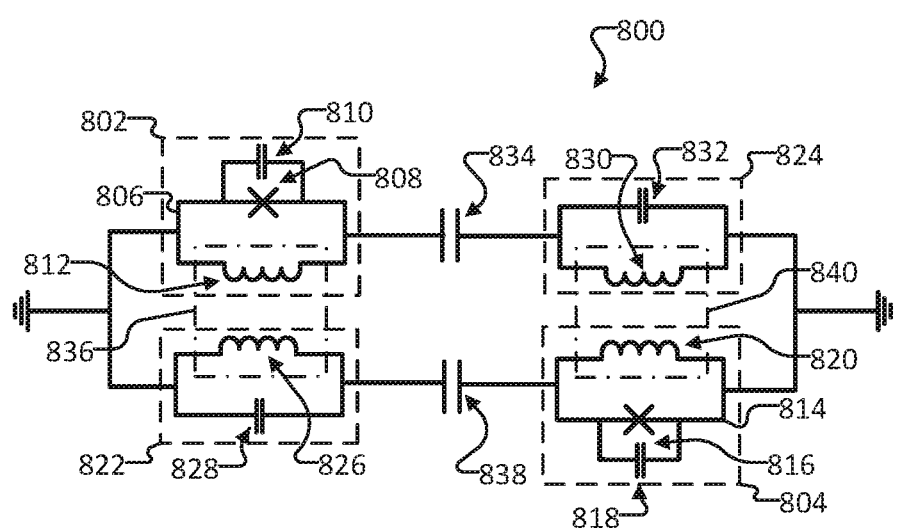
FIG. 8 is a schematic diagram illustrating an example implementation of a circuit with YY coupling, in accordance with the present systems, devices, articles, and methods.

FIG. 8 is a schematic diagram illustrating an example implementation of a circuit 800 with YZ coupling, in accordance with the present systems, devices, articles, and methods. Circuit 800 may be a portion of a circuit. Circuit 800 may be a circuit or a portion of a circuit in a quantum annealer or a quantum processor.

Circuit 800 comprises two qubits 802 and 804 (illustrated enclosed in respective broken line rectangles). In one implementation, qubits 802 and 804 are flux qubits. Qubit 802 comprises a body 806, a Josephson junction 808, a capacitance 810, and an inductance 812. In one implementation, body 806 comprises a loop of material that is superconducting in a range of temperatures, typically in a range of temperatures below a critical temperature characteristic of the material (also referred to in the present application as superconductive material). In one implementation, capacitance 810 is an inherent capacitance (also referred to in the present application as an intrinsic capacitance). Inherent capacitance 810 can be a capacitance that is inherent to Josephson junction 808.

Qubit 804 comprises a body 814, a Josephson junction 816, a capacitance 818, and an inductance 820. In one implementation, body 814 comprises a loop of superconductive material. In one implementation, capacitance 818 is an inherent capacitance. Inherent capacitance 818 can be a capacitance that is inherent to Josephson junction 816.

Circuit 800 also comprises two resonators 822 and 824 (illustrated enclosed in respective broken line rectangles). Resonator 822 comprises inductance 826 and capacitance 828. Resonator 824 comprises inductance 830 and capacitance 832.

Qubit 802 is capacitively communicatively coupled to resonator 824 via capacitor 834. Qubit 802 is inductively communicatively coupled to resonator 822 via a mutual inductance 836 (indicated by a dot-dash box) between inductance 812 of qubit 802 and inductance 826 of resonator 822.

Qubit 804 is capacitively communicatively coupled to resonator 822 via capacitor 838. Qubit 804 is inductively communicatively coupled to resonator 824 via a mutual inductance 840 (indicated by a dot-dash box) between inductance 820 of qubit 804 and inductance 830 of resonator 824. In one implementation, inductive communicative coupling can be performed using a coupling device such as tunable coupler 1004 of FIG. 10A.

In operation, circuit 800 can provide sign-tunable YZ coupling between qubits 802 and 804. The YZ coupling can be represented in a Hamiltonian by a term $J_{yz}\sigma_1^y\sigma_2^z$.

Figure 9:
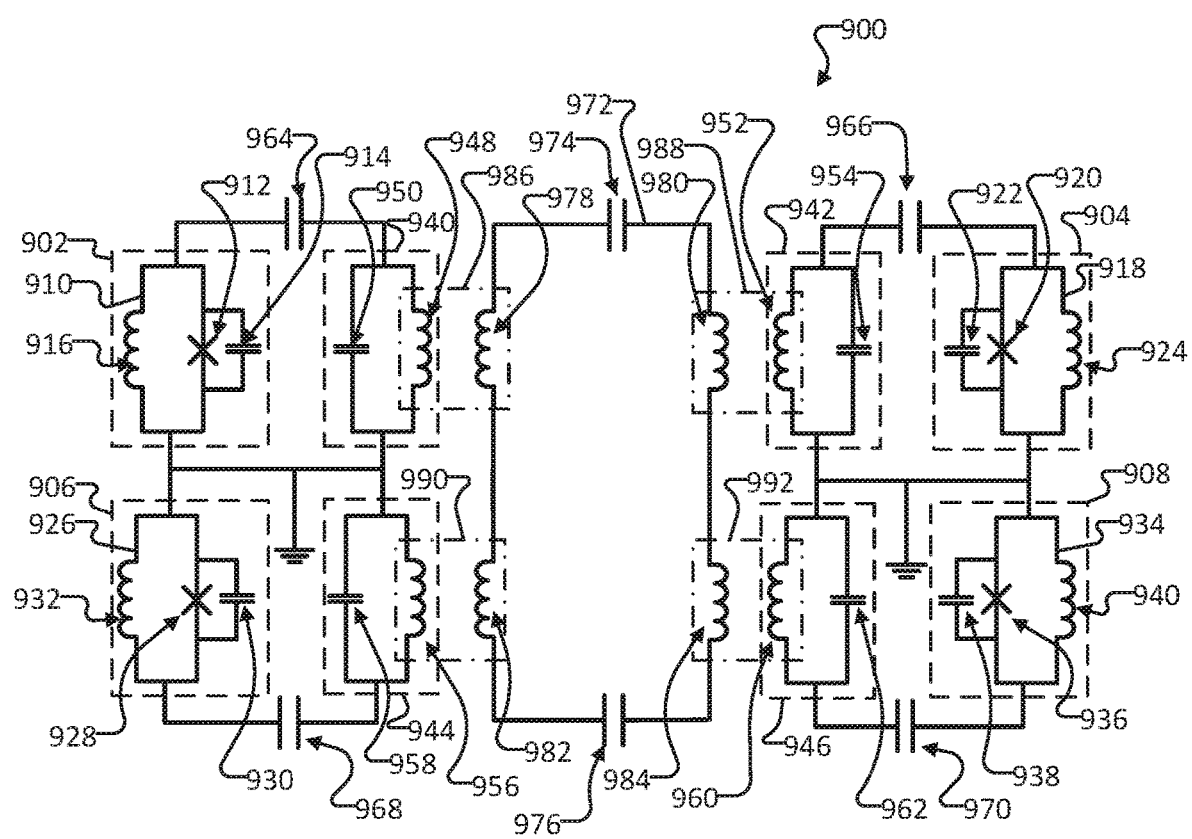
FIG. 9 is a schematic diagram illustrating an example implementation of a circuit with YZ coupling, in accordance with the present systems, devices, articles, and methods.

FIG. 9 is a schematic diagram illustrating an example implementation of a circuit 900 with YY coupling, in accordance with the present systems, devices, articles, and methods. Circuit 900 may be a portion of a circuit. Circuit 900 may be a circuit or a portion of a circuit in a quantum annealer or a quantum processor.

Circuit 900 comprises four qubits 902, 904, 906, and 908 (illustrated enclosed in respective broken line rectangles). In one implementation, qubits 902, 904, 906, and 908 are flux qubits. In one implementation, qubits 902, 904, 906, and 908 are superconducting flux qubits.

Qubit 902 comprises body 910, Josephson junction 912, capacitance 914, and inductance 916. In one implementation, body 910 comprises a loop of superconductive material. In one implementation, Josephson junction 912 is a compound Josephson junction. In one implementation, capacitance 914 is an inherent capacitance. Inherent capacitance 914 can be a capacitance that is inherent to Josephson junction 912.

Qubit 904 comprises body 918, Josephson junction 920, capacitance 922, and inductance 924. In one implementation, body 918 comprises a loop of superconductive material. In one implementation, Josephson junction 920 is a compound Josephson junction. In one implementation, capacitance 922 is an inherent capacitance. Inherent capacitance 922 can be a capacitance that is inherent to Josephson junction 920.

Qubit 906 comprises body 926, Josephson junction 928, capacitance 930, and inductance 932. In one implementation, body 926 comprises a loop of superconductive material. In one implementation, Josephson junction 928 is a compound Josephson junction. In one implementation, capacitance 930 is an inherent capacitance. Inherent capacitance 930 can be a capacitance that is inherent to Josephson junction 928.

Qubit 908 comprises body 934, Josephson junction 936, capacitance 938, and inductance 940. In one implementation, body 934 comprises a loop of superconductive material. In one implementation, Josephson junction 936 is a compound Josephson junction. In one implementation, capacitance 938 is an inherent capacitance. Inherent capacitance 938 can be a capacitance that is inherent to Josephson junction 936.

Those of skill in art will appreciate that a circuit with YY coupling may contain four qubits or fewer than four qubits or more than four qubits.

Circuit 900 also comprises four resonators 940, 942, 944, and 946 (illustrated enclosed in respective broken line rectangles). Resonator 940 comprises inductance 948 and capacitance 950. Resonator 942 comprises inductance 952 and capacitance 954. Resonator 944 comprises inductance 956 and capacitance 958. Resonator 946 comprises inductance 960 and capacitance 962.

Qubit 902 is communicatively coupled to resonator 940 via capacitor 964. Qubit 904 is communicatively coupled to resonator 942 via capacitor 966. Qubit 906 is communicatively coupled to resonator 944 via capacitor 968. Qubit 908 is communicatively coupled to resonator 946 via capacitor 970.

Circuit 900 also comprises a loop 972 interrupted by capacitances 974 and 976, and inductances 978, 980, 982, and 984. Loop 972 is also referred to in the present application as a common resonator.

Inductance 948 of resonator 940 and inductance 978 form a mutual inductance 986 (indicated by a broken line box in FIG. 9). Inductance 952 of resonator 942 and inductance 980 form a mutual inductance 988 (indicated by a broken line box in FIG. 9). Inductance 956 of resonator 944 and inductance 982 form a mutual inductance 990 (indicated by a broken line box in FIG. 9). Inductance 960 of resonator 946 and inductance 984 form a mutual inductance 992 (indicated by a broken line box in FIG. 9).

Figure 10A:
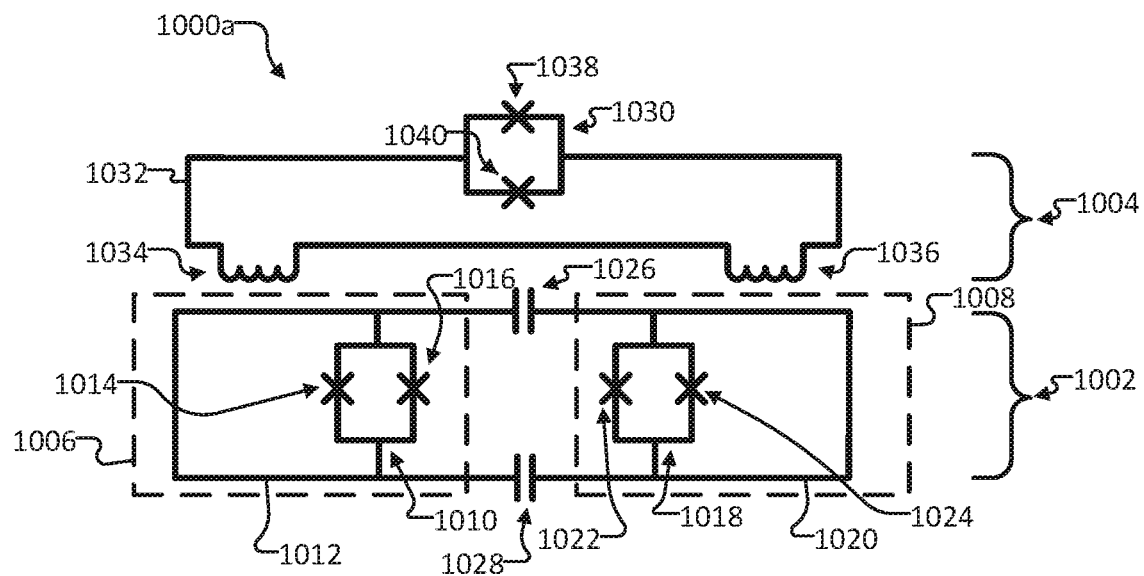
FIG. 10A is a schematic diagram illustrating an example implementation of a portion 1000a of a superconducting circuit that includes qubits with ZZ and YY coupling, in accordance with the present systems, devices, articles, and methods.

In one implementation, a respective inductive communicative coupling of each of resonators 940, 942, 944, and 946, and common resonator 972 can be performed using a coupling device such as tunable coupler 1004 of FIG. 10A. In one implementation, each of qubits 902, 904, 906, and 908 can be inductively communicatively coupled to another qubit (such as another one of qubits 902, 904, 906, and 908), for example by using a coupling device such as tunable coupler 1004 of FIG. 10A.

Circuit 900 can provide YY coupling of qubits 902, 904, 906, and 908. Circuit 900 can provide sign-tunable and magnitude-tunable YY coupling of qubits 902, 904, 906, and 908. Circuit 900 can provide long-range coupling. In one implementation, circuit 900 can operate in a resonant regime and can couple a selected pair of qubits. In another implementation, circuit 900 operate in an off-resonant, non-selective regime to couple qubits. In some implementations, circuit 900 can selectively operate in resonant and off-resonant regimes.

Similarly, systems and methods described in the present application can be used to implement one-to-one, one-to-many, many-to-one, and many-to-many YZ coupling of flux qubits via a common resonator.

Enhancing Multi-Qubit Tunneling with YY Couplings

Adding off-diagonal elements to a Hamiltonian during quantum annealing can improve a probability of success. In some cases, adding off-diagonal elements can lead to a non-stoquastic Hamiltonian. Adding off-diagonal elements to a Hamiltonian can include adding YY coupling to a quantum processor.

YY coupling can provide greater opportunities for tunneling, and for a system to find low-energy states during quantum annealing. The present application includes systems and methods for incorporating YY couplings into the layout of a quantum annealer (also referred to in the present application as a quantum processor).

A superconducting flux qubit can be inductively communicatively coupled to another superconducting flux qubit using ZZ coupling, and can be annealed using an X degree of freedom. ZZ coupling can be implemented using a ZZ coupling device. In some implementations, the ZZ coupling device (also referred to in the present application as a ZZ coupler) is a tunable ZZ coupling device.

A superconducting flux qubit can be electrostatically communicatively coupled to another superconducting flux qubit using YY coupling. In one implementation, YY coupling can be introduced by attaching coupling capacitors across the compound Josephson junctions of the qubits.

FIG. 10A is a schematic diagram illustrating an example implementation of a portion 1000a of a superconducting circuit that includes qubits with ZZ and YY coupling, in accordance with the present systems, devices, articles, and methods. Portion 1000a of the superconducting circuit comprises a circuit element 1002 comprising a pair of capacitively communicatively coupled qubits, and a tunable coupler 1004. Tunable coupler 1004 can be a tunable ZZ coupler.

Circuit element 1002 comprises pair of qubits 1006 and 1008 (illustrated enclosed in respective broken line rectangles). Qubit 1006 comprises a compound Josephson junction (CJJ) 1010 and a qubit loop 1012 made from material that is superconductive in a range of temperatures, typically in a range of temperatures below a critical temperature characteristic of the material (also referred to in the present application as superconductive material). CJJ 1010 comprises a pair of Josephson junctions 1014 and 1016 in parallel with one another. Qubit 1008 comprises a compound Josephson junction (CJJ) 1018 and a qubit loop 1020 made from superconductive material. CJJ 1018 comprises a pair of Josephson junctions 1022 and 1024 in parallel with one another. Qubits 1006 and 1008 are capacitively communicatively coupled to one another by capacitances 1026 and 1028.

Tunable coupler 1004 comprises a CJJ 1030, a coupler loop 1032 made from superconductive material, and inductances 1034 and 1036. CJJ 1030 comprises a pair of Josephson junctions 1038 and 1040 in parallel with one another. Tunable coupler 1004 can be tuned via the threading of coupler loop 1032 by flux created by electrical current flowing through a magnetic flux inductor (not shown in FIG. 10A). Tunable coupler 1004 is also referred to in the present application as a controllable coupler, and can be controlled by tuning as described above.

Figure 10B:
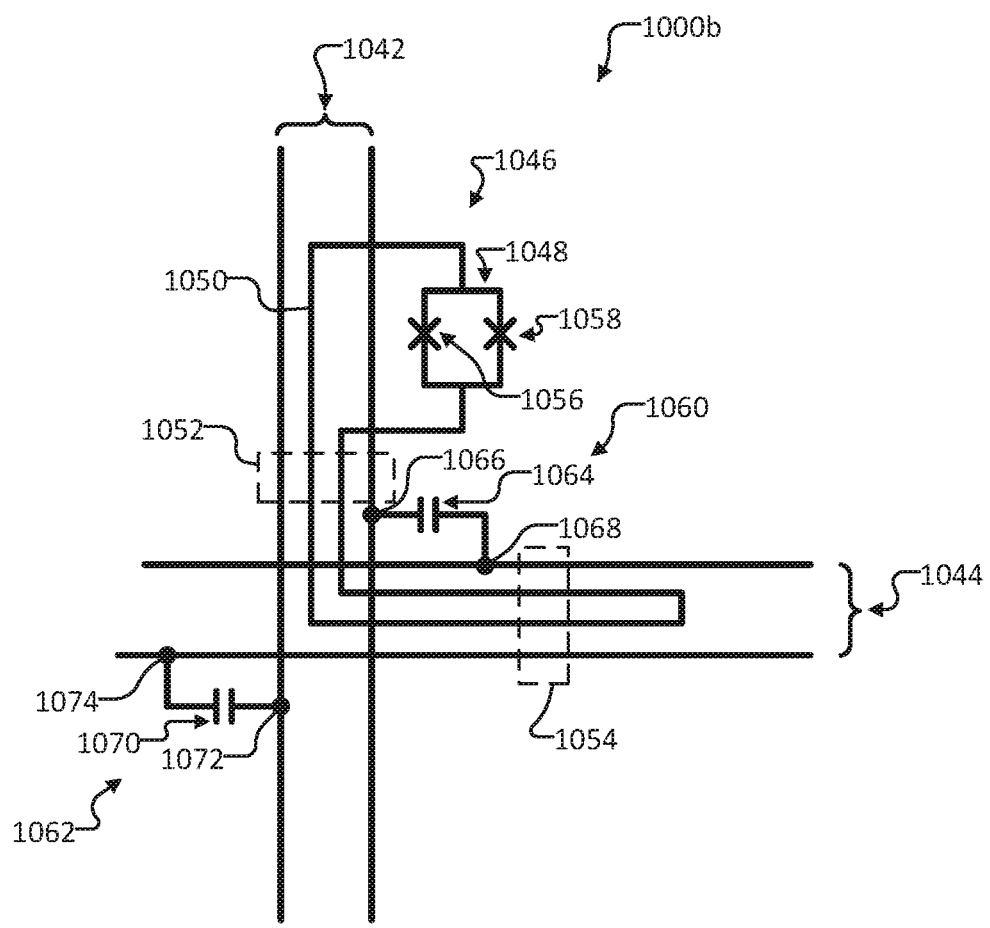
FIG. 10B is a schematic diagram illustrating an example implementation of a portion 1000b of a superconducting circuit that includes qubits with ZZ and YY coupling, in accordance with the present systems, devices, articles, and methods.

In some implementations of a quantum processor, a pair of qubits can be coupled to each another when they are in proximity to each another and/or when they physically cross each other. FIG. 10B is a schematic diagram illustrating an example implementation of a portion 1000b of a superconducting circuit that includes qubits with ZZ and YY coupling, in accordance with the present systems, devices, articles, and methods. The superconducting circuit to which portion 1000b belongs comprises at least two superconducting qubits. Superconducting qubits are qubits that are superconducting in a range of temperatures, typically in a range of temperatures below a critical temperature characteristic of a material from which the qubits are made. Each superconducting qubit comprises a loop of superconductive material. FIG. 10B illustrates a) a portion 1042 of a loop of a first superconducting qubit, and b) a portion 1044 of a loop of a second superconducting qubit.

In the example implementation illustrated in FIG. 10B, portion 1042 is oriented vertically on the layout of the circuit (i.e. portion 1042 runs up and down the drawing sheet), and portion 1044 is oriented horizontally on the layout of the circuit (i.e., portion 1044 runs left and right across the drawing sheet). FIG. 10B illustrates a region in which the loops of the two superconducting qubits cross one another on the layout of the circuit.

In the example illustrated in FIG. 10B, portion 1000b includes a tunable coupler 1046 which, in operation, provides inductive communicative coupling between the two qubits that include portions 1042 and 1044 of the loops of the qubits. Tunable coupler comprises a CJJ 1048 and a loop 1050 of superconductive material having mutual inductances 1052 and 1054 (indicated by broken line rectangles) with each of the two qubits to which portions 1042 and 1044, respectively, belong. CJJ 1048 comprises a pair of Josephson junctions 1056 and 1058, respectively, arranged in parallel with one another.

In another implementation, the loops of the two superconducting qubits come close to one another without crossing. In yet another implementation, the two superconducting qubits do not come close to one another, and are coupled by a long-range coupler.

Portion 1000b also includes YY capacitive couplings 1060 and 1062. Capacitive coupling 1060 comprises a capacitance 1064 electrically coupled to qubit 1042 at node 1066 and to qubit 1044 at node 1068. Capacitive coupling 1062 comprises a capacitance 1070 electrically coupled to qubit 1042 at node 1072 and to qubit 1044 at node 1074. Capacitances 1064 and 1070 can be superconductingly electrically coupled to qubits 1042 and 1044, respectively, in a range of temperatures.

In the example implementation illustrated in FIGS. 10A and 10B, capacitance 1064 is electrically coupled to qubits 1042 and 1044 on the right-side of qubit 1042 and on the upper-side of qubit 1044 on the drawing sheet, and capacitance 1070 is electrically coupled to qubits 1042 and 1044 on the left side of qubit 1042 and on the lower-side of qubit 1044 on the drawing sheet. In another implementation, capacitance 1064 is electrically coupled to qubits 1042 and 1044 on the left-side of qubit 1042 and on the upper-side of qubit 1044 on the drawing sheet, and capacitance 1070 is electrically coupled to qubits 1042 and 1044 on the right-side of qubit 1042 and on the lower-side of qubit 1044 on the drawing sheet. In yet another implementation, portion 1000*b* includes four capacitances—capacitances 1064 and 1070 as illustrated in FIGS. 10A and 10B and two additional capacitances electrically connected to qubits 1042 and 1044, one on the left-side of qubit 1042 and on the upper-side of qubit 1044 on the drawing sheet, and another on the right-side of qubit 1042 and on the lower-side of qubit 1044 on the drawing sheet.

The technology described above includes distributing a YY coupler providing capacitive communicative coupling (also referred to in the present application as a YY coupling device) along the length of a qubit, the YY coupler arranged to follow the layout of a ZZ coupler providing inductive communicative coupling to the qubit.

Superconducting circuits such as those illustrated in FIGS. 10A and 10B can be used to implement quantum annealing in a quantum processor, for example. The capacitive YY couplings can provide opportunities for tunneling, and increase the likelihood of multi-qubit tunneling for coupled qubits.

The various embodiments and implementations described in the present application include systems and methods for providing communicative coupling between qubits such as superconducting flux qubits in a superconducting quantum processor, for example.

Partially-Galvanic Coupling

A superconducting device (for example, a superconducting qubit) can be communicatively coupled to another superconducting device by a superconducting coupler (also referred to in the present application as a coupling device). One implementation of a coupler is a coupler comprising a compound Josephson junction (CJJ) (also referred to in the present application as a CJJ coupler). In operation of a CJJ coupler, inductive coupling can occur between the body of the CJJ coupler and the body of a qubit. Inductive coupling between the body of the CJJ coupler and the body of each of two qubits can cause the qubits to be inductively communicatively coupled to one another.

Another implementation of a coupler is a coupler that includes a galvanic coupling between the body of the coupler and the body of a qubit. A coupler with both an inductive coupling and a galvanic coupling is referred to in the present application as a partially-galvanic coupler.

An advantage of a partially-galvanic coupler is that it can allow sufficiently large values of a coupling constant to be achieved, when the size of the qubit is reduced, for example.

Example implementations of galvanic coupling are described in U.S. Provisional Patent Application Ser. No. 62/608,501, entitled "Systems And Methods For Coupling Qubits In A Quantum Processor", filed 20 Dec. 2017.

An example of a qubit is a superconducting flux qubit. One implementation of a superconducting flux qubit includes a loop of a material that is superconductive in a range of temperatures, typically in a range of temperatures below a critical temperature characteristic of the material (also referred to in the present application as a superconductive material). In operation, a magnetic flux can thread the loop. The loop can be interrupted by a Josephson junction. The Josephson junction can be a compound Josephson junction (CJJ) that includes two parallel current paths, each current path interrupted by a respective Josephson junction. In operation, a magnetic flux can thread the CJJ. The Josephson junction can be a compound-compound Josephson junction (CCJJ) in which each Josephson junction in a CJJ is a respective CJJ. The loop can include an inductance. The qubit can include a capacitance in parallel with the Josephson junction. The capacitance can be an intrinsic capacitance of the Josephson junction. See, for example, International PCT Patent Application Publication Number WO2010/028183A2 titled SYSTEMS, METHODS AND APPARATUS FOR ACTIVE COMPENSATION OF QUANTUM PROCESSOR ELEMENTS for a description of a qubit with a CCJJ.

A shortcoming of conventional coupler technology is that control of a coupler can have limited precision. Limited precision can refer to a limited precision in problem fidelity, i.e., in the fidelity by which a quantum processor can represent a computational problem. Limited precision can lead to intrinsic control error (ICE).

Limited precision can be at least in part due to an asymmetry in the circuit. An asymmetry can arise from imperfections and/or variations during fabrication that can lead to one coupler to have different characteristics than another (also referred to in the present application as coupler-to-coupler asymmetry). An asymmetry can also arise from differences in the coupling between qubits (also referred to in the present application as coupler-to-qubit asymmetry). Aspects of the present technology can improve precision (for example, including an L-tuner in a coupler).

Aspects of the present technology can improve a coupling strength of a coupler. For example, coupling strength can be increased by using a combination of an inductive coupling and a galvanic coupling. Inductive coupling is also referred to in the present application as magnetic coupling. Inductive coupling can be achieved by running two wires in parallel. Galvanic coupling can be achieved by merging two current paths, e.g., by sharing a length of wire in two sub-circuits.

In one implementation, a coupler provides communicative coupling between two qubits. The coupler can have multiple windings. In one implementation, the coupler is double-wound. In the present application, a double-wound coupler refers to a coupler in a multi-layer integrated circuit in which a coupler loop includes two segments, each segment in a different vertical layer of the integrated circuit—one segment in a layer above a layer that includes a qubit loop, and the other segment below the layer that includes the qubit loop. See FIG. 16 and accompanying description below.

An integrated circuit (also referred to in the present application as an IC, a chip, or a microchip) is a set of electronic circuits on a substrate of material, usually silicon. An integrated circuit can include multiple overlapping layers, each layer defined during fabrication by photolithography. Some layers can be dielectric layers, others can be metal layers, and others can be via layers (also referred to in the present application as contact layers). Components (for example, qubits and couplers) can be fabricated from a combination of layers.

In some implementations, a qubit includes multiple windings. For example, an integrated circuit can include a double-wound qubit and a triple-wound coupler.

In one implementation, a partially-galvanic coupler includes four segments magnetically coupled to one qubit, three segments inductively coupled to the other qubit, and one segment galvanically coupled to the other qubit.

Figure 11:
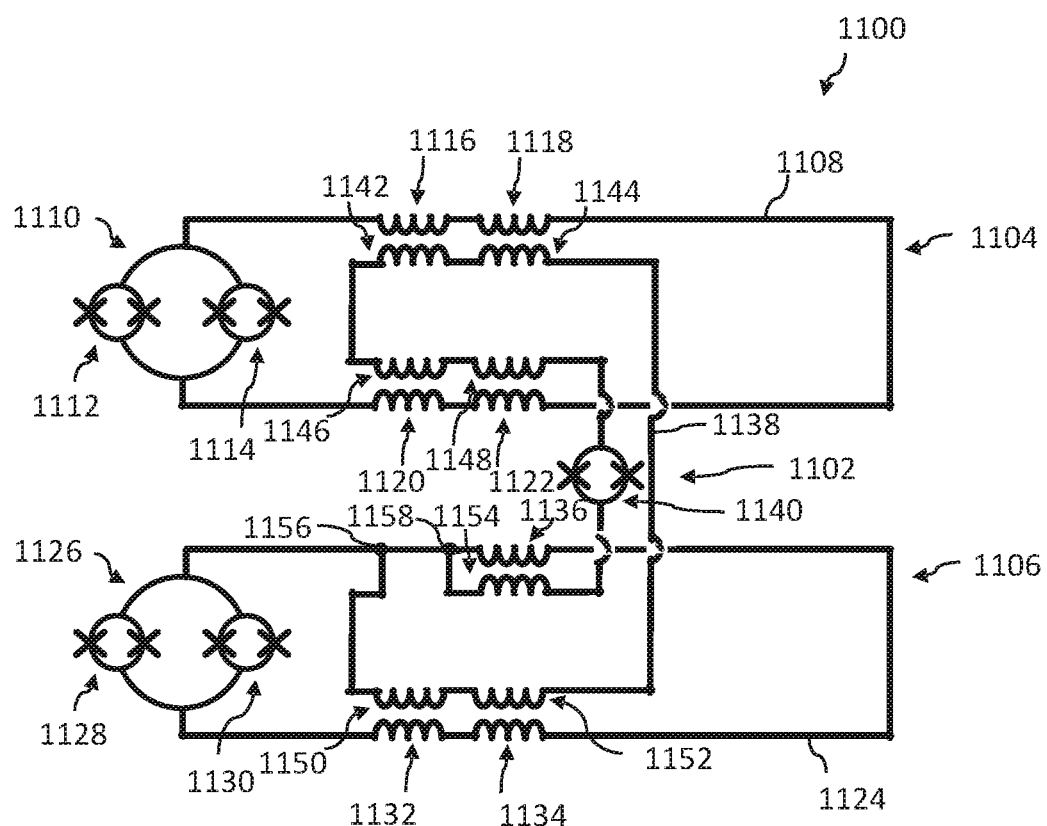
FIG. 11 is a schematic diagram illustrating an example implementation of a portion of a circuit that includes a partially-galvanic coupler, in accordance with the present systems, devices, articles, and methods.

FIG. 11 is a schematic diagram illustrating an example implementation of a portion of a circuit 1100 that includes a partially-galvanic coupler 1102, in accordance with the present systems, devices, articles, and methods. Coupler 1102 can be a double-wound coupler. Circuit 1100 can be an integrated circuit. Elements of circuit 1100 can include one or more materials that are superconductive in a range of temperatures. Circuit 1100 can be a superconducting circuit. Coupler 1102 can be a superconducting coupler. Coupler 1102 communicatively couples qubit 1104 and qubit 1106. Qubits 1104 and 1106 can be superconducting qubits. Qubits 1104 and 1106 can be superconducting flux qubits. Examples of superconducting flux qubits that may be used include: a) rf-SQUIDs, which include a superconducting loop interrupted by a single Josephson junction, or a compound junction (where the single Josephson junction is replaced by two parallel Josephson junctions), or a compound-compound Josephson junction, and b) persistent current qubits, which include a superconducting loop interrupted by three Josephson junctions, and the like. See e.g., Mooij et al, 1999, Science 285, 1036; and Orlando et al., 1999, Phys. Rev. B 60, 15398. Other examples of superconducting qubits can be found, for example, in Il'ichev et al., 2003, Phys. Rev. Lett. 91, 097906; Blatter et al., 2001, Phys. Rev. B 63, 174511, and Friedman et al., 2000, Nature 406, 43. In another implementation, hybrid charge-phase qubits are used.

Qubit 1104 includes a loop 1108 of material that is superconducting in a range of temperatures interrupted by a compound-compound Josephson junction (CCJJ) 1110. A CCJJ is a compound Josephson junction (CJJ) in which each of the two parallel Josephson junctions is replaced by a respective nested CJJ. In circuit 1100, CCJJ 1110 includes CJJ 1112 and CJJ 1114. Loop 1108 includes four inductances 1116, 1118, 1120, and 1122. In one implementation, loop 1108 includes niobium.

Qubit 1106 includes a loop 1124 of material that is superconducting in a range of temperatures interrupted by a compound-compound Josephson junction (CCJJ) 1126 that includes CJJ 1128 and CJJ 1130. Loop 1124 includes three inductances 1132, 1134, and 1136. In one implementation, loop 1124 includes niobium.

Coupler 1102 includes a loop 1138 of material that is superconducting in a range of temperatures interrupted by a compound Josephson junction 1140. Coupler 1102 includes seven inductances 1142, 1144, 1146, 1148, 1150, 1152, and 1154. Coupler 1102 is inductively communicatively coupled to qubit 1104 by coupling of inductances 1142, 1144, 1146, and 1148 of coupler 1102 to inductances 1116, 1118, 1120, and 1122 of qubit 1104, respectively.

Coupler 1102 is inductively communicatively coupled to qubit 1106 by coupling of inductances 1150, 1152, and 1154 of coupler 1102 to inductances 1132, 1134, and 1136 of qubit 1106, respectively. Coupler 1102 is galvanically communicatively coupled to qubit 1106 by a galvanic coupling by a common segment between nodes 1156 and 1158.

At least one of inductances 1116, 1118, 1120, 1122, 1132, 1134, 1136, 1142, 1144, 1146, 1148, 1150, 1152, and 1154 can include two or more inductance segments (also referred to in the present application as magnetic segments).

Figure 12A:
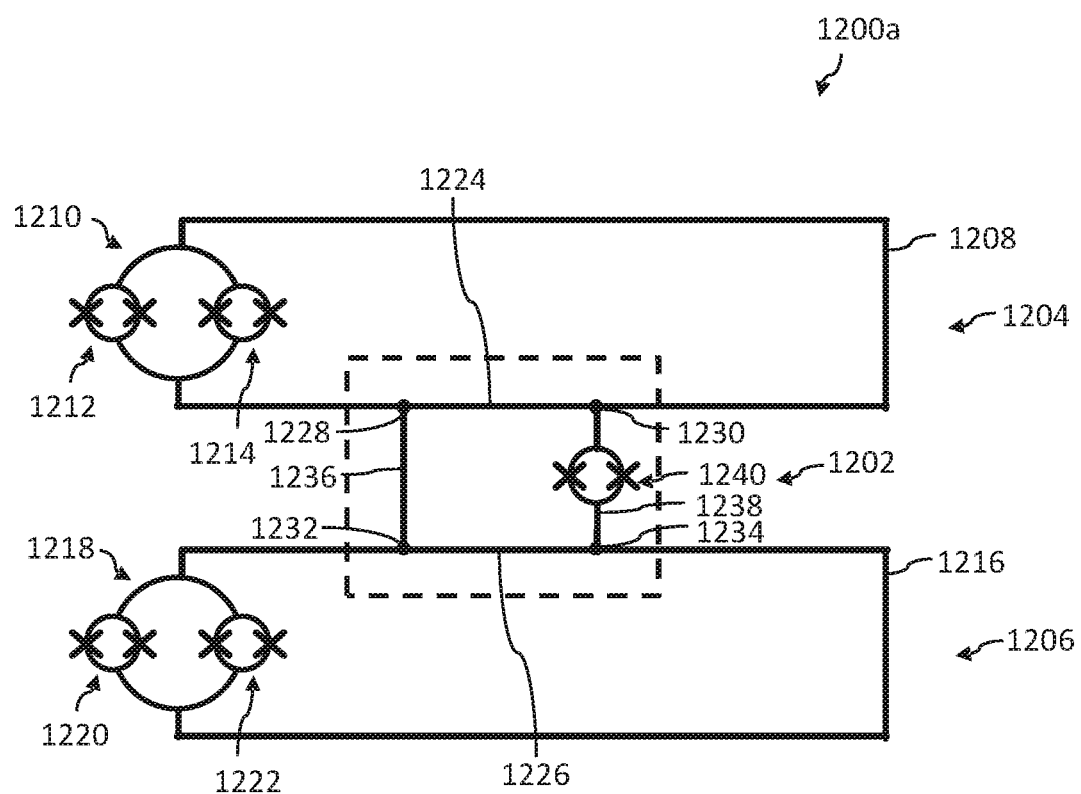
FIG. 12A is a schematic diagram illustrating an example implementation of a portion of a circuit that includes a galvanic coupler, in accordance with the present systems, devices, articles, and methods.

FIG. 12A is a schematic diagram illustrating an example implementation of a portion of a circuit 1200*a* that includes a galvanic coupler 1202, in accordance with the present systems, devices, articles, and methods. Circuit 1200*a* can be an integrated circuit. Elements of circuit 1200*a* can include one or more materials that are superconductive in a range of temperatures. Circuit 1200*a* can be a superconducting circuit. Coupler 1202 can be a superconducting coupler. Coupler 1202 communicatively couples qubit 1204 and qubit 1206. Qubits 1204 and 1206 can be superconducting qubits. Qubits 1204 and 1206 can be superconducting flux qubits. Examples of superconducting flux qubits that may be used include those discussed above with reference to FIG. 11.

Qubit 1204 includes a loop 1208 of material that is superconducting in a range of temperatures interrupted by a compound-compound Josephson junction (CCJJ) 1210. CCJJ 1210 includes CJJ 1212 and CJJ 1214. In one implementation, loop 1208 includes niobium.

Qubit 1206 includes a loop 1216 of material that is superconducting in a range of temperatures interrupted by a compound-compound Josephson junction (CCJJ) 1218 that includes CJJ 1220 and CJJ 1222. In one implementation, loop 1216 includes niobium.

Qubit 1204 and qubit 1206 are galvanically communicatively coupled by coupler 1202. Coupler 1202 includes a galvanic coupling between qubit 1204 and qubit 1206 by common segments 1224 and 1226 between nodes 1228 and 1230, and 1232 and 1234, respectively. Segment 1236 between nodes 1228 and 1232 is also referred to in the present application as a shorting bar. Segment 1238 between nodes 1230 and 1234 is interrupted by a compound Josephson junction (CJJ) 1240. In some implementations, CJJ 1240 is replaced by a single Josephson junction. When CJJ 1240 is replaced by a single Josephson junction, coupler 1202 may be a fixed coupler (i.e., not tunable).

In one implementation, a shorting bar (such as shorting bar 1236 of FIG. 12A) is interrupted by a Josephson junction. The Josephson junction that replaces the shorting bar can be operated in a manner similar to a qubit L-tuner (such as the qubit L-tuner of M. W. Johnson et al., A scalable control system for a superconducting adiabatic quantum optimization processor, arXiv:0907.3757v2, 2010).

Figure 12B:
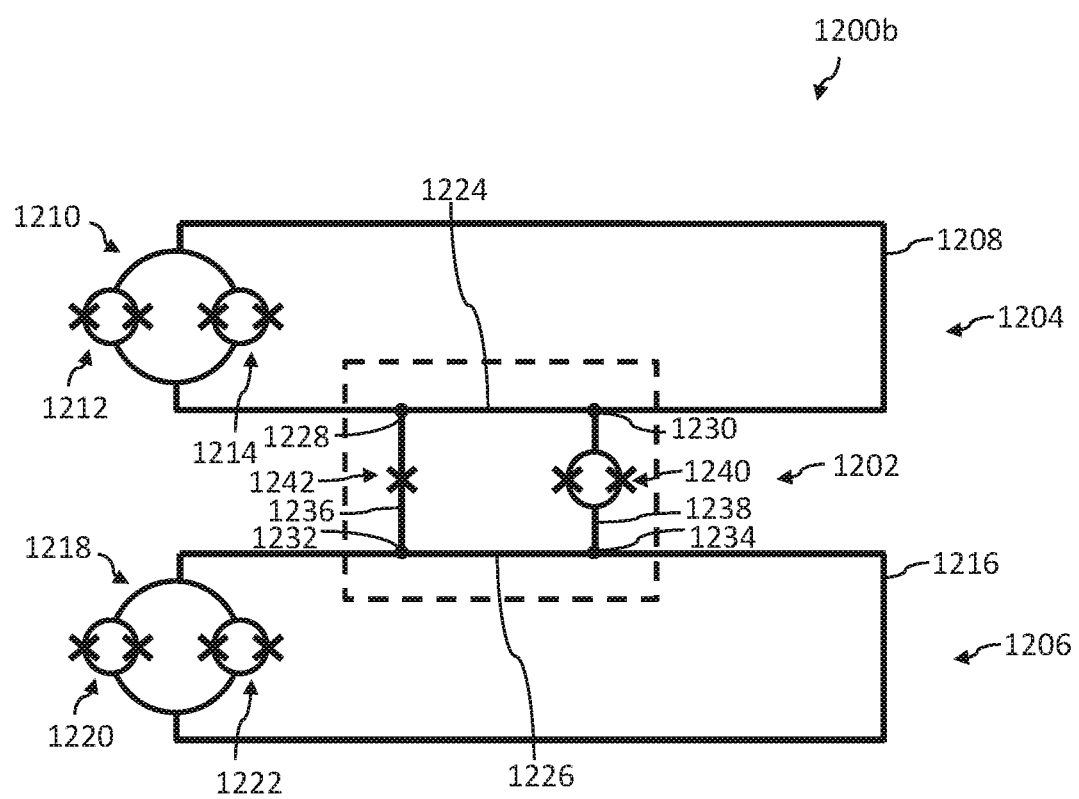
FIG. 12B is a schematic diagram illustrating another example implementation of a portion of a circuit that includes a galvanic coupler, in accordance with the present systems, devices, articles, and methods.

FIG. 12B is a schematic diagram illustrating yet another example implementation of a portion of a circuit 1200*b* that includes a galvanic coupler 1202, in accordance with the present systems, devices, articles, and methods. The same reference numbers as used in FIG. 12A are used in FIG. 12B to denote the same or similar elements. Elements of circuit 1200*b* can include one or more materials that are superconductive in a range of temperatures. Circuit 1200*b* can be a superconducting circuit. Coupler 1202 can be a superconducting coupler. Coupler 1202 communicatively couples qubit 1204 and qubit 1206. Qubits 1204 and 1206 can be superconducting qubits. Qubits 1204 and 1206 can be superconducting flux qubits. Examples of superconducting flux qubits that may be used include those discussed above with reference to FIG. 1.

Qubit 1204 includes a loop 1208 of material that is superconducting in a range of temperatures interrupted by a compound-compound Josephson junction (CCJJ) 1210. CCJJ 1210 includes CJJ 1212 and CJJ 1214. In one implementation, loop 1208 includes niobium.

Qubit 1206 includes a loop 1216 of material that is superconducting in a range of temperatures interrupted by a compound-compound Josephson junction (CCJJ) 1218 that includes CJJ 1220 and CJJ 1222. In one implementation, loop 1216 includes niobium.

Qubit 1204 and qubit 1206 are galvanically communicatively coupled by coupler 1202. Coupler 1202 includes a galvanic coupling between qubit 1204 and qubit 1206 by common segments 1224 and 1226 between nodes 1228 and 1230, and 1232 and 1234, respectively. Segment 1236 between nodes 1228 and 1232 is also referred to in the present application as a shorting bar. Segment 1238 between nodes 1230 and 1234 is interrupted by a compound Josephson junction (CJJ) 1240. In some implementations, CJJ 1240 is replaced by a single Josephson junction. When CJJ 1240 is replaced by a single Josephson junction, coupler 1202 may be a fixed coupler (i.e., not tunable). In the implementation of FIG. 12B, segment 1236 of coupler 1202 is interrupted by a Josephson junction 1242.

Figure 12C:
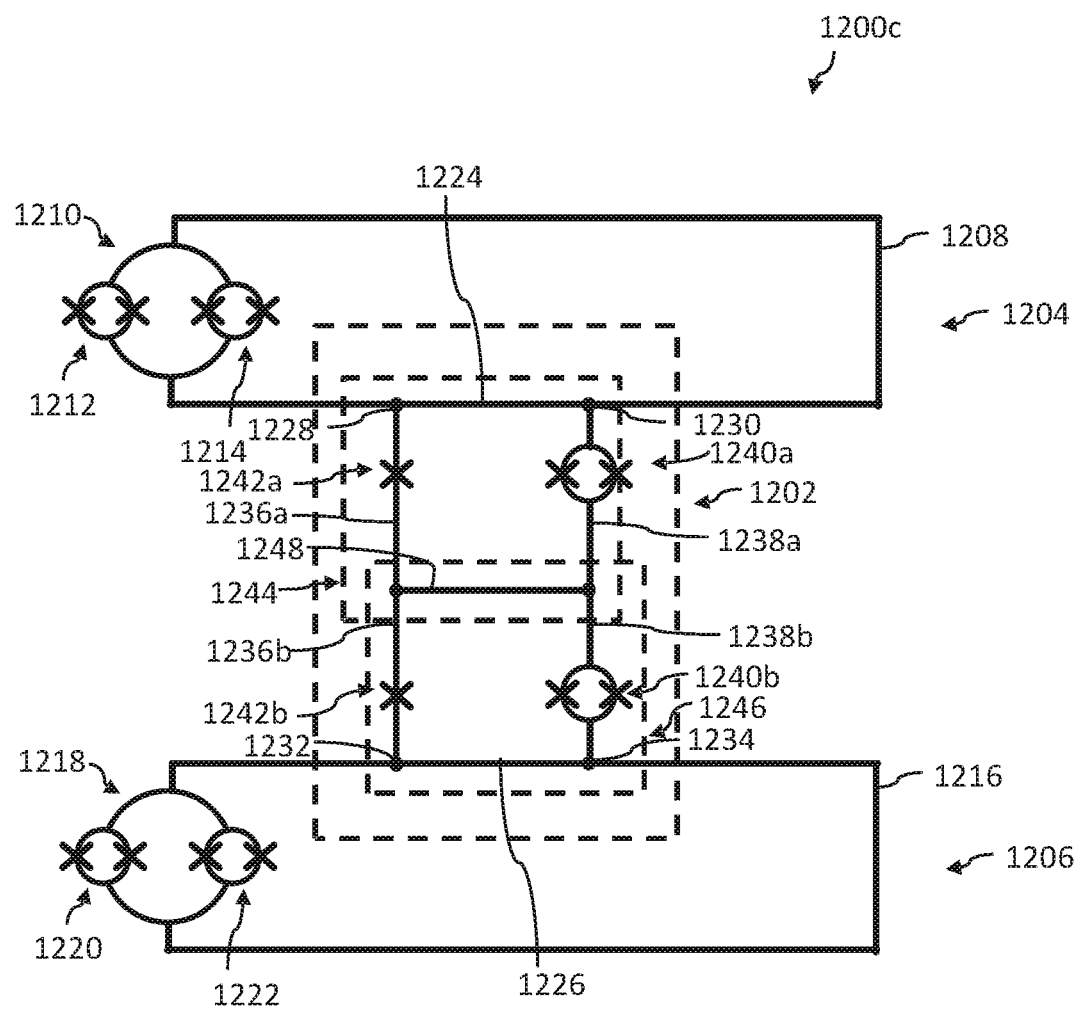
FIG. 12C is a schematic diagram illustrating yet another example implementation of a portion of a circuit that includes a galvanic coupler, in accordance with the present systems, devices, articles, and methods.

FIG. 12C is a schematic diagram illustrating yet another example implementation of a portion of a circuit 1200c that includes a galvanic coupler 1202, in accordance with the present systems, devices, articles, and methods. The same reference numerals are used to denote the same or similar elements in FIG. 12C as in FIG. 12B. Elements of circuit 1200c can include one or more materials that are superconductive in a range of temperatures. Circuit 1200c can be a superconducting circuit Coupler 1202 can be a superconducting coupler. Coupler 1202 communicatively couples qubit 1204 and qubit 1206. Qubits 1204 and 1206 can be superconducting qubits. Qubits 1204 and 1206 can be superconducting flux qubits. Examples of superconducting flux qubits that may be used include those discussed above with reference to FIG. 1.

Qubit 1204 includes a loop 1208 of material that is superconducting in a range of temperatures interrupted by a compound-compound Josephson junction (CCJJ) 1210. CCJJ 1210 includes CJJ 1212 and CJJ 1214. In one implementation, loop 1208 includes niobium.

Qubit 1206 includes a loop 1216 of material that is superconducting in a range of temperatures interrupted by a compound-compound Josephson junction (CCJJ) 1218 that includes CJJ 1220 and CJJ 1222. In one implementation, loop 1216 includes niobium.

Qubit 1204 and qubit 1206 are galvanically communicatively coupled by coupler 1202. Coupler 1202 includes a galvanic coupling between qubit 1204 and qubit 1206 by a chain of two couplings 1244 and 1246. Coupling 1244 includes a common segment with loop 1208, a segment 1238a interrupted by compound Josephson junction 1240a, a segment 1248 in common with coupling 1246, and a segment 1236a interrupted by Josephson junction 1242a. Coupling 1246 includes a common segment with loop 1216, a segment 1238b interrupted by compound Josephson junction 1240b, a segment 1248 in common with coupling 1244, and a segment 1236b interrupted by Josephson junction 1242b. In some implementations, at least one of CJJ 1240a and CJJ 1240b is replaced by a single Josephson junction.

In another implementation, a pair of qubits is communicatively coupled by a coupler that includes a pair of couplings. Each of the pair of couplings is also referred to in the present application as a coupler. Each coupling of the pair of couplings can be a partially galvanic coupling, i.e., can provide coupling between the pair of qubits that is at least partially galvanic. A first qubit of the pair of qubits is coupled to a first coupling of the pair of couplings in at least a similar manner as a second qubit of the pair of qubits is coupled to a second coupling of the pair of couplings, for example by an inductive coupling. The first qubit is coupled to the second coupling in at least a similar manner as the second qubit is coupled to the first coupling, for example by a galvanic coupling.

A benefit of the implementation described in the previous paragraph is that a coupler can include a combination of inductive and galvanic coupling with higher symmetry than conventional couplers.

In yet another implementation, a pair of qubits is communicatively coupled by a coupler that includes more than two couplings.

Figure 13:
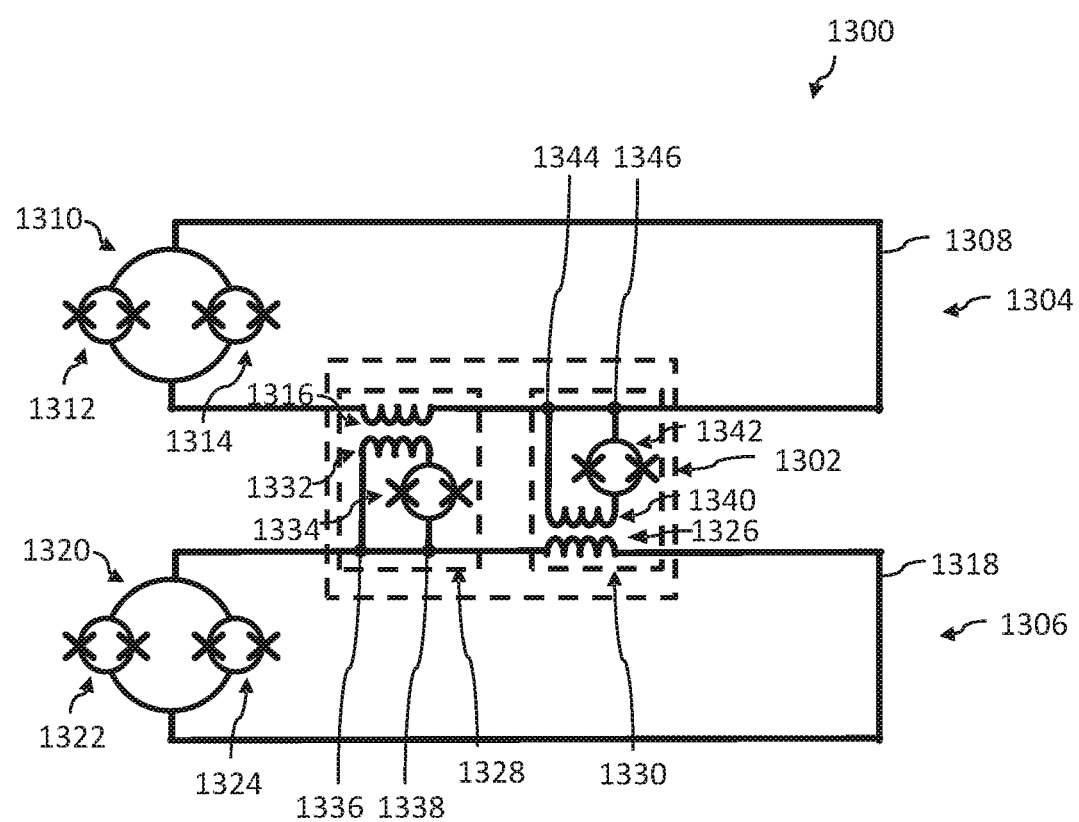
FIG. 13 is a schematic diagram illustrating an example implementation of a portion of a circuit that includes a partially-galvanic coupler with two coupling loops, in accordance with the present systems, devices, articles, and methods.

FIG. 13 is a schematic diagram illustrating an example implementation of a portion of a circuit 1300 that includes a partially-galvanic coupler 1302 with two coupling loops, in accordance with the present systems, devices, articles, and methods. Coupler 1302 is indicated by a dashed line in FIG. 13.

Circuit 1300 can be an integrated circuit. Elements of circuit 1300 can include one or more materials that are superconductive in a range of temperatures. Circuit 1300 can be a superconducting circuit. Coupler 1302 can be a superconducting coupler. Coupler 1302 communicatively couples qubit 1304 and qubit 1306. Qubits 1304 and 1306 can be superconducting qubits. Qubits 1304 and 1306 can be superconducting flux qubits. Examples of superconducting flux qubits that may be used include those discussed above with reference to FIG. 11.

Qubit 1304 includes a loop 1308 of material that is superconducting in a range of temperatures interrupted by a compound-compound Josephson junction (CCJJ) 1310. CCJJ 1310 includes CJJ 1312 and CJJ 1314. Qubit 1304 includes an inductance 1316. In one implementation, loop 1308 includes niobium.

Qubit 1306 includes a loop 1318 of material that is superconducting in a range of temperatures interrupted by a compound-compound Josephson junction (CCJJ) 1320 that includes CJJ 1322 and CJJ 1324. Qubit 1306 includes an inductance 1326. In one implementation, loop 1318 includes niobium.

Qubit 1304 and qubit 1306 are partially-galvanically communicatively coupled by coupler 1302. Coupler 1302 includes a coupling 1328 and another coupling 1330. Coupler 1302, and couplings 1328 and 1330 are indicated by dashed lines in FIG. 13.

In one implementation, couplings 1328 and 1330 are at least approximately balanced with respect to each other. In the present application, the term "at least approximately balanced" refers to the existence of a spatial transformation that can be applied to circuit 1300 in the vicinity of at least one coupler (such as coupler 1302) in which the couplings can be mapped to cause the role of qubits 1304 and 1306 to be interchanged. In another implementation, couplings 1328 and 1330 are imbalanced with respect to each other.

In one implementation, the coupling strength of couplings 1328 and 1330 are at least approximately the same. In some implementations, the coupling strengths of couplings 1328 and 1330 are within +/−20% of the coupling strength of each other. Each coupling of couplings 1328 and 1330 includes an inductive element and a galvanic element.

Coupling 1328 includes an inductance 1332 and a CJJ 1334. Coupling 1328 is galvanically communicatively coupled to qubit 1306 at nodes 1336 and 1338. Coupling 1328 is inductively communicatively coupled to qubit 1304 by inductance 1332 of coupling 1328 and inductance 1316 of qubit 1304.

Coupling 1330 includes an inductance 1340 and a CJJ 1342. Coupling 1330 is galvanically communicatively coupled to qubit 1304 at nodes 1344 and 1346. Coupling 1330 is inductively communicatively coupled to qubit 1306 by inductance 1340 of coupling 1330 and inductance 1326 of qubit 1306.

In some implementations, at least one of CJJ 1334 and CJJ 1342 is replaced by a single Josephson junction.

In yet another implementation, a coupler includes an L-tuner (defined below), and a single galvanic coupling to a qubit, and two or more inductive couplings to the qubit.

In some implementations, a circuit includes a partially-galvanic coupler with more than two couplings, each coupling having a loop of material that is superconductive in a range of temperatures interrupted by a Josephson junction, and inductively coupled to one qubit and galvanically coupled to another qubit. In some implementations, a circuit includes a partially-galvanic coupler with two or more couplings providing communicative coupling between more than two qubits.

In some implementations, a digital-to-analog converter (DAC) is used to control an L-tuner and/or one or more couplings of a partially-galvanic coupler. In some implementations, a single DAC is used to control a coupler and a coupling of a partially-galvanic coupler. The DAC can be an inductively-coupled DAC.

As inter-qubit coupling strength is adjusted, the susceptibility of a coupler, and the extent to which it inductively loads a qubit, can change. This can cause a qubit inductance to be dependent on coupling terms in a Hamiltonian representing a computational problem programmed on a quantum processor, for example.

To overcome the resulting problem-dependent inter-qubit imbalance, one approach is to add another compound Josephson junction (CJJ) in series with the qubit inductance where the additional CJJ includes larger junctions. This structure is referred to in the present application as an L-tuner. The Josephson inductance of the additional CJJ can be modified by application of a flux bias. The flux bias can be applied through an on-chip flux DAC, for example. A DAC is also referred to in the present application as a flux storage device.

Figure 14A:
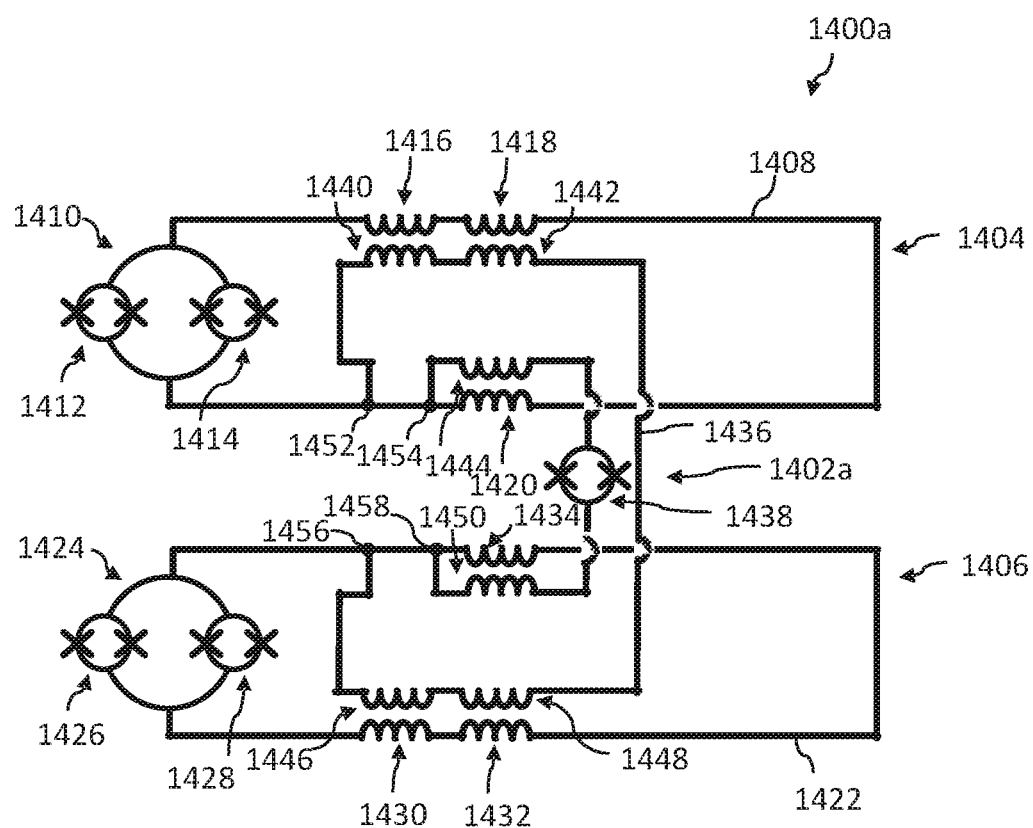
FIG. 14A is a schematic diagram illustrating another example implementation of a portion of a circuit that includes a partially-galvanic coupler, in accordance with the present systems, devices, articles, and methods.

FIG. 14A is a schematic diagram illustrating another example implementation of a portion of a circuit 1400a that includes a partially-galvanic coupler 1402a, in accordance with the present systems, devices, articles, and methods. Circuit 1400a can be an integrated circuit. Elements of circuit 1400 can include one or more materials that are superconductive in a range of temperatures. Circuit 1400a can be a superconducting circuit. Coupler 1402a can be a superconducting coupler. Coupler 1402a communicatively couples qubit 1404 and qubit 1406. Qubits 1404 and 1406 can be superconducting qubits. Qubits 1404 and 1406 can be superconducting flux qubits. Examples of superconducting flux qubits that may be used include those discussed above with reference to FIG. 11.

Qubit 1404 includes a loop 1408 of material that is superconducting in a range of temperatures interrupted by a compound-compound Josephson junction (CCJJ) 1410. CCJJ 1410 includes CJJ 1412 and CJJ 1414. Loop 1408 includes three inductances 1416, 1418, and 1420. In one implementation, loop 1408 includes niobium.

Qubit 1406 includes a loop 1422 of material that is superconducting in a range of temperatures interrupted by a compound-compound Josephson junction (CCJJ) 1424 that includes CJJ 1426 and CJJ 1428. Loop 1422 includes three inductances 1430, 1432, and 1434. In one implementation, loop 1422 includes niobium.

Coupler 1402a includes a loop 1436 of material that is superconducting in a range of temperatures interrupted by a compound Josephson junction 1438. Coupler 1402a includes six inductances 1440, 1442, 1444, 1446, 1448, and 1450. Coupler 1402a is inductively communicatively coupled to qubit 1404 by coupling of inductances 4140, 1442, and 1444 of coupler 1402a to inductances 1416, 1418, and 1420 of qubit 1404, respectively. Coupler 1402a is communicatively coupled to qubit 1404 by a galvanic coupling by a common segment between nodes 1452 and 1454.

Coupler 1402a is inductively communicatively coupled to qubit 1406 by coupling of inductances 1446, 1448, and 1450 of coupler 1402a to inductances 1430, 1432, and 1434 of qubit 1406, respectively. Coupler 1402a is communicatively coupled to qubit 1406 by a galvanic coupling by a common segment between nodes 1456 and 1458.

Benefits of the systems and methods described in the present application include higher precision in control of a coupler, and breaking of galvanic cycles, i.e., breaking of loops of superconducting material by a Josephson junction or an insulator. Galvanic cycles can be a challenge to control, and can be a shortcoming of existing technology. For example, fully galvanic couplers can be limited to communicatively coupling qubits in an architecture selected to avoid generating undesirable galvanic cycles (loops of superconducting material unbroken by a Josephson junction or an insulator). In some implementations, fully galvanic couplers can be limited to communicatively coupling qubits in a tree architecture (also referred to in the present application as an acyclic connected graph).

Figure 14B:
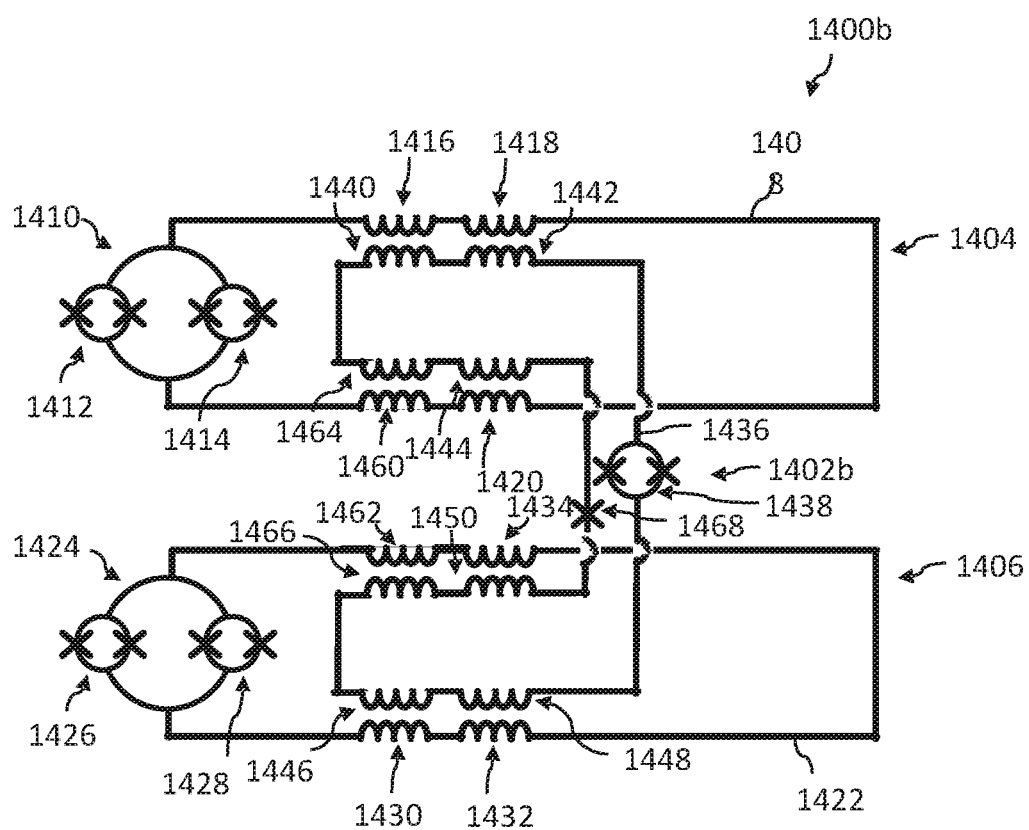
FIG. 14B is a schematic diagram illustrating an example implementation of a portion of a circuit that includes an inductive coupler, in accordance with the present systems, devices, articles, and methods.

FIG. 14B is a schematic diagram illustrating an example implementation of a portion of a circuit 1400b that includes an inductive coupler 1402b, in accordance with the present systems, devices, articles, and methods. The same reference numerals are used to denote the same or similar elements in FIG. 14B as in FIG. 14A. Circuit 1400b can be an integrated circuit. Elements of circuit 1400 can include one or more materials that are superconductive in a range of temperatures. Circuit 1400b can be a superconducting circuit. Coupler 1402b can be a superconducting coupler. Coupler 1402b communicatively couples qubit 1404 and qubit 1406. Qubits 1404 and 1406 can be superconducting qubits. Qubits 1404 and 1406 can be superconducting flux qubits. Examples of superconducting flux qubits that may be used include those discussed above with reference to FIG. 11.

Qubit 1404 includes a loop 1408 of material that is superconducting in a range of temperatures interrupted by a compound-compound Josephson junction (CCJJ) 1410. CCJJ 1410 includes CJJ 1412 and CJJ 1414. Loop 1408 includes four inductances 1416, 1418, 1420, and 1460. In one implementation, loop 1408 includes niobium.

Qubit 1406 includes a loop 1422 of material that is superconducting in a range of temperatures interrupted by a compound-compound Josephson junction (CCJJ) 1424 that includes CJJ 1426 and CJJ 1428. Loop 1422 includes four inductances 1430, 1432, 1434, and 1462. In one implementation, loop 1422 includes niobium.

Coupler 1402b includes a loop 1436 of material that is superconducting in a range of temperatures interrupted by a compound Josephson junction 1438. Coupler 1402b includes eight inductances 1440, 1442, 1444, 1446, 1448, 1450, 1464 and 1466. Coupler 1402b is inductively communicatively coupled to qubit 1404 by coupling of inductances 1440, 1442, 1444, and 1464 of coupler 1402b to inductances 1416, 1418, 1420, and 1460 of qubit 1404, respectively.

Coupler 1402b is inductively communicatively coupled to qubit 1406 by coupling of inductances 1446, 1448, 1450, and 1466 of coupler 1402b to inductances 1430, 1432, 1434, and 1462 of qubit 1406, respectively.

Coupler 1402b includes an ordered sequence of segments that includes a segment that includes coupling inductances 1440, 1442, 1444, and 1464, a segment interrupted by a compound Josephson junction 438, a segment that includes coupling inductances 1446, 1448, 1450, and 1466, and a segment interrupted by a single Josephson junction 1468.

Figure 15A:
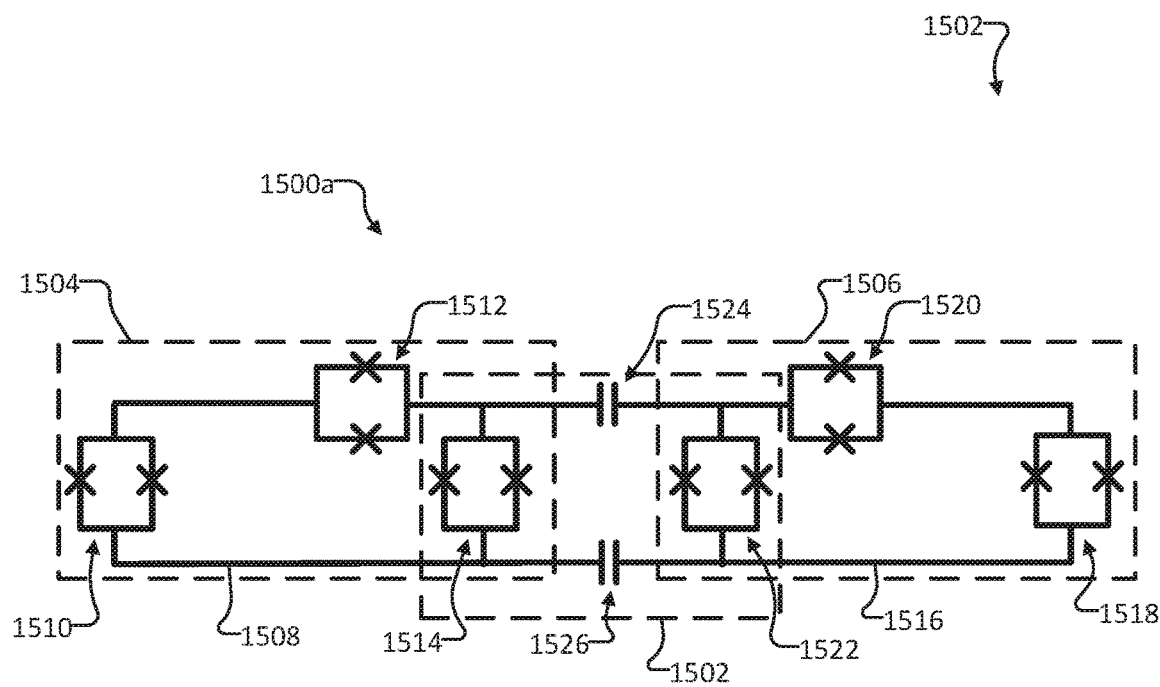
FIG. 15A is a schematic diagram illustrating a portion of a circuit that includes a capacitive coupling between superconducting qubits, in accordance with the present systems, devices, articles, and methods.

FIG. 15A is a schematic diagram illustrating a portion of a circuit 1500a that includes a capacitive coupling 1502 between superconducting qubits 1504 and 1506, in accordance with the present systems, devices, articles, and methods.

Qubit 1504 includes a loop 1508 of material that is superconducting in a range of temperatures, loop 1508 interrupted by a compound Josephson junction (CJJ) 1510. CJJ 1510 includes two parallel current paths, each path interrupted by a Josephson junction. In some implementations, CJJ 1510 is a compound-compound Josephson junction that includes two parallel current paths, each path interrupted by a Josephson junction, at least one of which is a CJJ.

Loop 1508 includes an L-tuner 1512. In one implementation, L-tuner 1512 includes a CJJ. Loop 1508 includes a Josephson junction structure 1514. In one implementation, Josephson junction structure includes a CJJ. In one implementation, Josephson junction structure 1514 can operate as an L-tuner. In one implementation, loop 1508 includes niobium.

Qubit 1506 includes a loop 1516 of material that is superconducting in a range of temperatures interrupted by a compound Josephson junction (CJJ) 1518. CJJ 1518 includes two parallel current paths, each path interrupted by a Josephson junction. In some implementations, CJJ 1518 is a compound-compound Josephson junction that includes two parallel current paths, each path interrupted by a Josephson junction, at least one of which is a CJJ.

Loop 1516 includes an L-tuner 1520. In one implementation, L-tuner 1520 includes a CJJ. Loop 1516 includes a Josephson junction structure 1522. In one implementation, Josephson junction structure includes a CJJ. In one implementation, Josephson junction structure 1522 can operate as an L-tuner. In one implementation, loop 1516 includes niobium.

Capacitive coupling 1502 between qubits 1504 and 1506 includes a capacitance 1524 and a capacitance 1526. In operation, a coupling strength of capacitive coupling 1502 can be adjusted by varying a flux bias applied to at least one of L-tuners 1512 and 1520, and Josephson junction structures 1514 and 1522. Capacitive coupling 1502 can be operated as a tunable coupler between qubits 1504 and 1506. A flux bias can be applied to at least one of L-tuners 1512 and 1520, and Josephson junction structures 1514 and 1522 by an inductive interface (not shown in FIG. 15A).

Figure 15B:
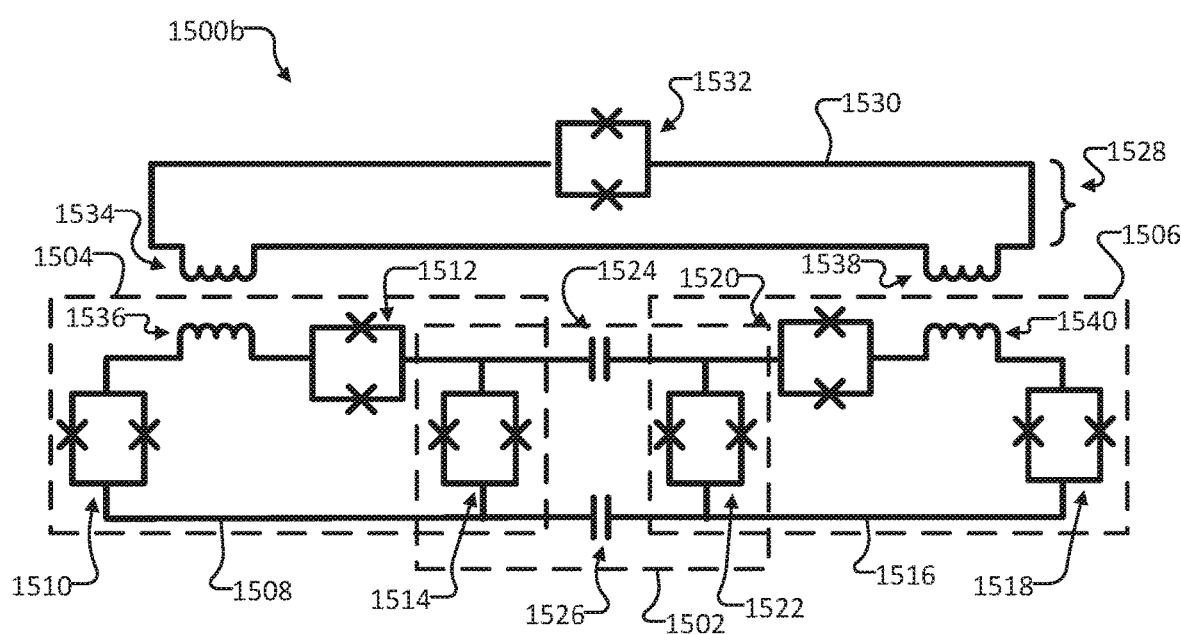
FIG. 15B is a schematic diagram illustrating a portion of a circuit that includes a capacitive coupling and an inductive coupling between superconducting qubits, in accordance with the present systems, devices, articles, and methods.

FIG. 15B is a schematic diagram illustrating a portion of a circuit 1500b that includes a capacitive coupling 1502 and an inductive coupling 1528 between superconducting qubits 1504 and 1506, in accordance with the present systems, devices, articles, and methods. The same reference numerals as FIG. 15A are used for like components in FIG. 15B. Circuit 1500b includes circuit 1500a and an additional coupler 1528.

Coupler 1528 includes a loop 1530 of material that is superconducting in a range of temperatures interrupted by a compound Josephson junction (CJJ) 1532. CJJ 1532 includes two parallel current paths, each path interrupted by a Josephson junction. In some implementations, CJJ 1532 is a compound-compound Josephson junction that includes two parallel current paths, each path interrupted by a Josephson junction, at least one of which is a CJJ.

Coupler 1528 is inductively communicatively coupled to qubit 1504 by an inductance 1534 of coupler 1528 and an inductance 1536 of qubit 1504. Coupler 1528 is inductively communicatively coupled to qubit 1506 by an inductance 1538 of coupler 1528 and an inductance 1540 of qubit 1504.

Figure 16:
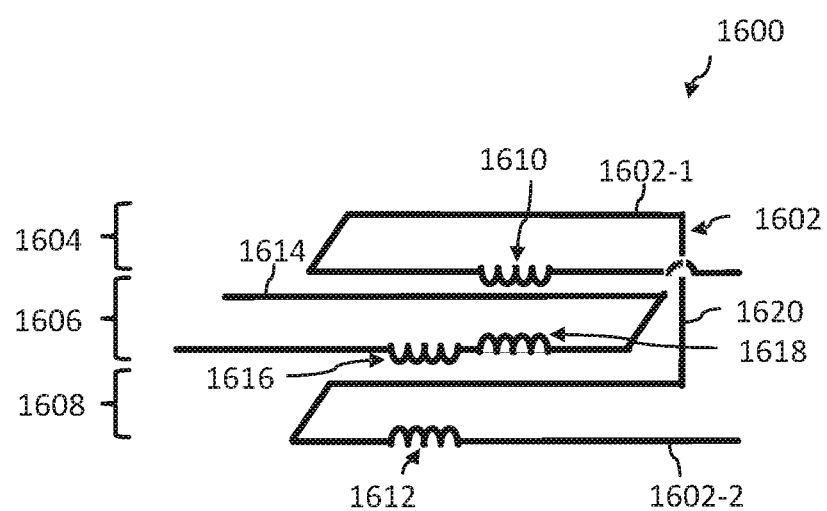
FIG. 16 is a schematic diagram illustrating a multi-layer integrated circuit that includes a double-wound coupler, according to the present systems, devices, articles, and methods.

FIG. 16 is a schematic diagram illustrating a portion of a multi-layer integrated circuit 1600a that includes a double-wound coupler 1602, according to the present systems, devices, articles, and methods. Double-wound coupler 1602 includes two windings 1602-1 and 1602-2. Circuit 1600a includes three layers—an upper layer 1604, an intervening layer 1606, and a lower layer 1608. Double-wound coupler 1602 includes an inductance 1610 in upper layer 1604 and an inductance 1612 in lower layer 1608.

Double-wound coupler 1602 is inductively coupled to a device loop 1614. Device loop 1614 can be an element of a qubit, for example. Device loop 1614 includes inductances 1616 and 1618. Winding 1602-1 is inductively communicatively coupled to device loop 1614 by inductances 1610 and 1618. Winding 1602-2 is inductively communicatively coupled to device loop 1614 by inductances 1612 and 1616. Device loop 1614 can be a portion of a qubit, for example a portion of a superconducting flux qubit.

Winding 1602-1 is electrically coupled to winding 1602-2 by vertical interconnect access (via) 1620.

Double-wound coupler 1602 may also be galvanically communicatively coupled to device loop 1614 (galvanic coupling not shown in FIG. 16). Double-wound coupler 1602 may also be inductively and/or galvanically communicatively coupled to a loop of a second device (not shown in FIG. 16). Double-wound coupler 1602 may provide inductive and/or galvanic communicative coupling between a device to which device loop 1614 belongs and the second device.

While the description above refers to inductive and galvanic coupling of qubits, the technology can be used for coupling other types of devices, for example a Superconducting Quantum Interference Device (SQUID), a Quantum Flux Parametron (QFP) device, and a flux storage device such as a digital-to-analog converter (DAC).

Flux Offset Compensation in Couplers

A flux offset in a body of a coupler (for example, one of the couplers described in the present application) can introduce a distortion into a problem Hamiltonian, and adversely affect performance of a quantum annealer. For example, a flux offset can limit an achievable precision in operation of a coupler in a quantum annealer.

The present application describes an interface operable to apply a flux bias compensation in a body of coupler.

Figure 17:
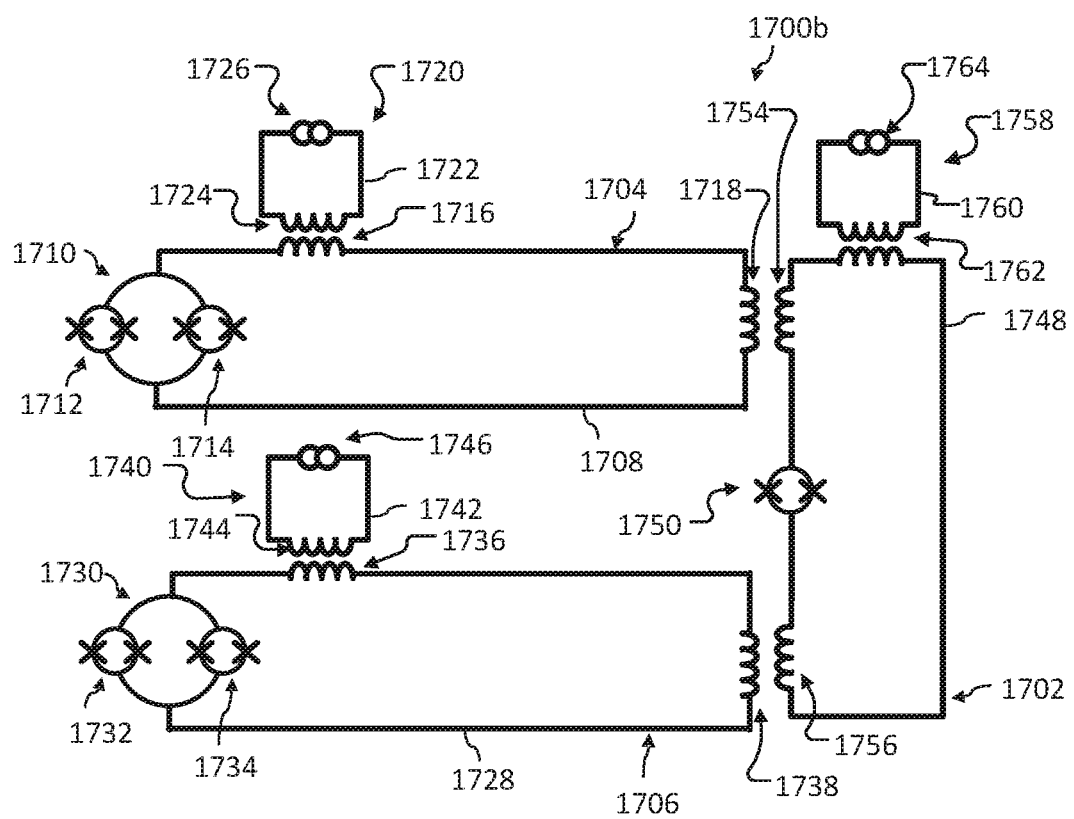
FIG. 17 is a schematic diagram illustrating an example implementation of a portion of a circuit that includes flux bias compensation of a coupler.

FIG. 17 is a schematic diagram illustrating an example implementation of a portion of a circuit 1700 that includes flux bias compensation of a coupler 1702. Circuit 1700 can be an integrated circuit. Elements of circuit 1700 can include one or more materials that are superconductive in a range of temperatures. Circuit 1700 can be a superconducting circuit. Coupler 1702 can be a superconducting coupler. Coupler 1702 can communicatively couple qubit 1704 and qubit 1706. Qubits 1704 and 1706 can be superconducting qubits. Qubits 1704 and 1706 can be superconducting flux qubits. Examples of superconducting flux qubits that may be used include those discussed above with reference to FIG. 11.

Qubit 1704 includes a loop 1708 of material that is superconducting in a range of temperatures interrupted by a compound-compound Josephson junction (CCJJ) 1710. CCJJ 1710 includes CJJ 1712 and CJJ 1714. Loop 1708 includes two inductances 1716 and 1718. In one implementation, loop 1708 includes niobium.

Circuit 1700 includes an interface 1720 which in operation can provide a flux bias to loop 1708 of qubit 1704. Interface 1720 includes a loop 1722 of material that is superconducting in a range of temperatures, an inductance 1724, and a current source 1726.

Qubit 1706 includes a loop 1728 of material that is superconducting in a range of temperatures interrupted by a compound-compound Josephson junction (CCJJ) 1730 that includes CJJ 1732 and CJJ 1734. Loop 1728 includes two inductances 1736 and 1738. In one implementation, loop 1728 includes niobium.

Circuit 1700 includes an interface 1740 which in operation can provide a flux bias to loop 1728 of qubit 1706. Interface 1740 includes a loop 1742 of material that is superconducting in a range of temperatures, an inductance 1744, and a current source 1746.

Coupler 1702 includes a loop 1748 of material that is superconducting in a range of temperatures interrupted by a compound Josephson junction 1750 and three inductances 1752, 1754, and 1756.

Coupler 1702 can be inductively communicatively coupled to qubit 1704 by inductances 1754 and 1718. Coupler 1702 can be inductively communicatively coupled to qubit 1706 by inductances 1756 and 1738.

Circuit 1700 includes an interface 1758 which in operation can provide a flux bias to loop 1748 of coupler 1702. Interface 1758 includes a loop 1760 of material that is superconducting in a range of temperatures, an inductance 1762, and a current source 1744.

Coupling between coupler 1702 and qubits 1704 and 1706 can be implemented using inductive coupling (also referred to as magnetic coupling), galvanic coupling, or a combination of inductive and galvanic coupling. Coupling between interface 1758 (also referred to in the present application as a flux bias compensator) and loop 1748 of coupler 1702 can be implemented using inductive coupling, galvanic coupling, or a combination of inductive and galvanic coupling.

A digital-to-analog converter (DAC) can be used to control flux bias compensation of the coupler.

Hybrid Computing System Comprising a Quantum Processor

FIG. 18 illustrates a hybrid computing system 1800 including a digital computer 1802 coupled to an analog computer 1804. In some implementations, analog computer 1804 is a quantum computer and digital computer 1802 is a classical computer.

The exemplary digital computer 1802 includes a digital processor (such as one or more central processor units 1806) that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like, when properly configured or programmed to form special purpose machines, and/or when communicatively coupled to control an analog computer, for instance a quantum computer.

Digital computer 1802 will at times be referred to in the singular herein, but this is not intended to limit the application to a single digital computer. The present systems and methods can also be practiced in distributed computing environments, where tasks or sets of instructions are performed or executed by remote processing devices, which are linked through a communications network. In a distributed computing environment computer-readable and/or processor-readable instructions (sometimes known as program modules), application programs and/or data, may be stored in local and/or remote memory storage devices (e.g., non-transitory computer-readable and/or processor-readable media).

Digital computer 1802 may include at least one or more digital processors (e.g., one or more central processor units 1806), one or more system memories 1808, and one or more system buses 1810 that couple various system components, including system memory 1808 to central processor unit 1806.

The digital processor may be any logic processing unit, such as one or more central processing units ("CPUs") with one or more cores, graphics processing units ("GPUs"), digital signal processors ("DSPs"), application-specific integrated circuits ("ASICs"), field-programmable gate arrays ("FPGAs"), programmable logic controllers (PLCs), etc.

Digital computer 1802 may include a user input/output subsystem 1812. In some implementations, the user input/output subsystem includes one or more user input/output components such as a display 1814, mouse 1816, and/or keyboard 1818. System bus 1810 can employ any known bus structures or architectures, including a memory bus with a memory controller, a peripheral bus, and a local bus. System memory 1808 may include non-volatile memory, for example one or more of read-only memory ("ROM"), static random-access memory ("SRAM"), Flash NAND; and volatile memory, for example random access memory ("RAM") (not shown), all of which are examples of non-transitory computer-readable and/or processor-readable media.

A basic input/output system ("BIOS") 1820, which can form part of the ROM, contains basic routines that help transfer information between elements within digital computer 1802, such as during startup.

Digital computer 1802 may also include other non-volatile memory 1822. Non-volatile memory 1822 may take a variety of forms, including: a hard disk drive for reading from and writing to a hard disk, an optical disk drive for reading from and writing to removable optical disks, and/or a magnetic disk drive for reading from and writing to magnetic disks, all of which are examples of non-transitory computer- or processor-readable media. The optical disk can be a CD-ROM or DVD, while the magnetic disk can be a magnetic floppy disk or diskette. Non-volatile memory 1822 may communicate with digital processor via system bus 1810 and may include appropriate interfaces or controllers 1824 coupled to system bus 1810. Non-volatile memory 1822 may serve as non-transitory long-term storage for computer-readable and/or processor-readable instructions, data structures, or other data (also called program modules) for digital computer 1802.

Although digital computer 1802 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc., all of which are further examples of non-transitory computer- or processor-readable media. Those skilled in the relevant art will appreciate that some computer architectures conflate volatile memory and non-volatile memory. For example, data in volatile memory can be cached to non-volatile memory, or a solid-state disk that employs integrated circuits to provide non-volatile memory. Some computers place data traditionally stored on disk in memory. As well, some media that are traditionally regarded as volatile can have a non-volatile form, e.g., Non-Volatile Dual In-line Memory Module variation of Dual In-Line Memory Modules.

Various sets of computer-readable and/or processor-readable instructions (also called program modules), application programs and/or data can be stored in system memory 1808. For example, system memory 1808 may store an operating system 1826, server instructions 1828, calculations instructions 1830, and/or run-time instructions 1832.

While shown in FIG. 18 as being stored in system memory 1808, the program modules and other data can be stored elsewhere including in non-volatile memory 1822 or in one or more other non-transitory computer-readable and/or processor-readable media.

Analog computer 1804 can be provided in an isolated environment (not shown). For example, where analog computer 1804 is a quantum computer, the environment shields the internal elements of the quantum computer from heat, magnetic field, and the like. Analog computer 1804 includes one or more analog processors such as quantum processor(s) 1834.

A quantum processor includes programmable elements such as qubits, couplers, and other devices. In one implementation, the qubits are superconducting flux qubits. The qubits are read out via readout system 1836. These results can be fed to the various sets of computer-readable and/or processor-readable instructions for digital computer 1802. Analog computer 1804 can include a qubit control system 1838 and a coupler control system 1840. Coupler control system 1840 can provide control of communicative coupling between qubits such as inductive and capacitive communicative coupling described in the present application.

In some embodiments, hybrid computer 1800 is used to implement quantum annealing on quantum processor 1834.

In some implementations, digital computer 1802 can operate in a networked environment using logical connections to at least one client computer system. In some implementations, digital computer 1802 is coupled via logical connections to at least one database system. These logical connections may be formed using any means of digital communication, for example, through a network, such as a local area network ("LAN") or a wide area network ("WAN") including, for example, the Internet. The networked environment may include wired or wireless enterprise-wide computer networks, intranets, extranets, and/or the Internet. Other embodiments may include other types of communication networks such as telecommunications networks, cellular networks, paging networks, and other mobile networks. The information sent or received via the logical connections may or may not be encrypted. When used in a LAN networking environment, digital computer 1802 may be connected to the LAN through an adapter or network interface card ("NIC") (communicatively linked to system bus 1810). When used in a WAN networked environment, digital computer 1802 may include an interface and modem (not shown), or a device such as NIC, for establishing communications over the WAN. Non-networked communications may additionally, or alternatively, be employed.

In accordance with some embodiments of the present systems and devices, a quantum processor (such quantum processor 1834 of FIG. 18) may be designed to perform quantum annealing and/or adiabatic quantum computation. An evolution Hamiltonian is constructed, that is proportional to the sum of a first term proportional to a problem Hamiltonian and a second term proportional to a delocalization Hamiltonian, as follows:

$$H_E \propto A(t)H_P + B(t)H_D$$

where $H_E$ is the evolution Hamiltonian, $H_P$ is the problem Hamiltonian, $H_D$ is the delocalization Hamiltonian, and A(t), B(t) are coefficients that can control the rate of evolution, and typically lie in the range [0,1].

In some implementations, a time-varying envelope function is placed on the problem Hamiltonian. A suitable delocalization Hamiltonian is given by:

$$H_D \propto -\frac{1}{2}\sum_{i=1}^{N}\Delta_i \sigma_i^x$$

where N represents the number of qubits, $\sigma_i^x$ is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms.

A common problem Hamiltonian includes a first component proportional to diagonal single qubit terms, and a second component proportional to diagonal multi-qubit terms, and may be of the following form:

$$H_p \propto -\frac{\varepsilon}{2}\left[\sum_{i=1}^{N}h_i\sigma_i^z + \sum_{j>i}^{N}J_{ij}\sigma_i^z\sigma_j^z\right]$$

where N represents the number of qubits, $\sigma_i^z$ is the Pauli z-matrix for the $i^{th}$ qubit, $h_i$ and $J_{ij}$ are dimensionless local fields for the qubits, and couplings between qubits, respectively, and $\varepsilon$ is a characteristic energy scale for $H_P$.

The $\sigma_i^z$ and $\sigma_i^z\sigma_j^z$ terms are examples of "diagonal" terms. The former is a single-qubit term and the latter a two-qubit term.

Throughout this specification, the terms "problem Hamiltonian" and "final Hamiltonian" are used interchangeably unless the context dictates otherwise. Certain states of the quantum processor are, energetically preferred, or simply preferred by the problem Hamiltonian. These include the ground states but may include excited states.

Hamiltonians such as $H_D$ and $H_P$ in the above two equations, respectively, may be physically realized in a variety of different ways. A particular example is realized by an implementation of superconducting qubits.

Examples of superconducting qubits include superconducting flux qubits, superconducting charge qubits, and the like. In a superconducting flux qubit, the Josephson energy dominates or is equal to the charging energy. In a charge qubit it is the reverse. Examples of flux qubits that may be used include RF-SQUIDs, which include a superconducting loop interrupted by one Josephson junction, persistent current qubits, which include a superconducting loop interrupted by three Josephson junctions, and the like. See, examples of RF-SQUID qubits in Bocko, et al., 1997, IEEE Trans. on Appl. Supercond. 7, 3638; Friedman, et al., 2000, Nature 406, 43; and Harris, et al., 2010, Phys. Rev. B 81, 134510; or persistent current qubits, Mooij et al., 1999, Science 285, 1036; and Orlando et al., 1999, Phys. Rev. B 60, 15398. In addition, hybrid charge-phase qubits, where the energies are equal, may also be used. Further details of superconducting qubits may be found in Makhlin, et al., 2001, Rev. Mod. Phys. 73, 357; Devoret et al., 2004, arXiv:cond-mat/0411174; Zagoskin and Blais, 2007, Physics in Canada 63, 215: Clarke and Wilhelm, 2008, Nature 453, 1031; Martinis, 2009, Quantum Inf. Process. 8, 81; and Devoret and Schoelkopf, 2013, Science 339, 1169. In some embodiments, the qubits and couplers are controlled by on chip circuitry. Examples of on-chip control circuitry can be found in U.S. Pat. Nos. 7,876,248; 7,843,209; 8,018,244; 8,098,179; 8,169,231; and 8,786,476. Further details and implementations of exemplary quantum processors that may be used in conjunction with the present systems and devices are described in, for example, U.S. Pat. Nos. 7,533,068; 8,008,942; 8,195,596; 8,190,548; and 8,421,053.

The above described method(s), process(es), or technique(s) could be implemented by a series of processor readable instructions stored on one or more non-transitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

The various embodiments described above can be combined to provide further embodiments. To the extent that they are not inconsistent with the specific teachings and definitions herein, all of the US patents, US patent application publications, US patent applications referred to in this specification and/or listed in the Application Data Sheet, including International PCT Patent Application Publication No. WO2009039634A1 entitled "SYSTEMS, METHODS, AND APPARATUS FOR QUBIT STATE READOUT"; International PCT Patent Application Publication No. WO2012064974A2 entitled "SUPERCONDUCTING FLUX QUBIT READOUT"; International PCT Patent Application Publication No. WO2016183213A1 entitled "FREQUENCY MULTIPLEXED RESONATOR INPUT AND/OR OUTPUT FOR A SUPERCONDUCTING DEVICE"; U.S. patent application Ser. No. 16/029,026 entitled "SUPERCONDUCTING QUANTUM PROCESSOR AND METHOD OF OPERATING SAME"; U.S. Provisional Patent Application Ser. No. 62/608,501 entitled "SYSTEMS AND METHODS FOR COUPLING QUBITS IN A QUANTUM PROCESSOR" and U.S. Provisional Patent Application Ser. No. 62/693,305 entitled "SYSTEMS AND METHODS FOR COUPLING QUBITS IN A QUANTUM PROCESSOR", are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting integrated circuit comprising:
a first superconducting qubit comprising a first loop of material,
a second superconducting qubit comprising a second loop of material, each of the first and the second loop of material superconductive in a range of temperatures below a respective critical temperature; and
a superconducting coupler comprising:
a compound Josephson junction galvanically communicatively coupled to each of the first and the second loop of material;
a first Josephson inductance comprising a first Josephson junction interrupting the first loop of material; and
a second Josephson inductance comprising a second Josephson junction interrupting the second loop of material, wherein the first superconducting qubit is communicatively coupled to the second superconducting qubit at least in part via the first Josephson inductance and the second Josephson inductance.

2. A circuit comprising:
a first device, the first device comprising:
a first loop, the first loop comprising a material that is superconductive in a range of temperatures below a respective critical temperature, the first loop interrupted by a first Josephson junction; and
a first device inductance in series with the first Josephson junction;
a second device, the second device comprising:
a second loop, the second loop comprising a material that is superconductive in a range of temperatures below a respective critical temperature, the second loop interrupted by a second Josephson junction; and
a second device inductance in series with the second Josephson junction; and
a coupling device comprising a third loop, the third loop comprising a material that is superconductive in a range of temperatures below a respective critical temperature, the third loop interrupted by a third Josephson junction, the third loop comprising a plurality of coupling inductances, each coupling inductance in series with the third Josephson junction, a portion of the third loop shared with a portion of the first loop to form a first common segment, wherein the second device is communicatively coupled to the first device by:
an inductive coupling of the first device inductance to a first one of the plurality of coupling inductances;
an inductive coupling of the second device inductance to a second one of the plurality of coupling inductances; and
a galvanic coupling by the first common segment.

3. The circuit of claim 2, wherein at least one of the first device and the second device further comprises a third device inductance, the second device communicatively coupled to the first device by:
an inductive coupling of the third device inductance to a third one of the plurality of coupling inductances.

4. The circuit of claim 2, wherein the third loop further comprises a second common segment, the second common segment in common with the second loop, the second device communicatively coupled to the first device by a coupling that further includes a galvanic coupling by the second common segment.

5. The circuit of claim 4, wherein at least one of the first device and the second device further comprises a third device inductance, the second device communicatively coupled to the first device by:
an inductive coupling of the third device inductance to a third one of the plurality of coupling inductances.

6. The circuit of claim 2, wherein the first device is a first qubit, and the second device is a second qubit.

7. The circuit of claim 2, wherein at least one of the first Josephson junction, the second Josephson junction, and the third Josephson junction is a compound Josephson junction.

8. The circuit of claim 2, wherein at least one of the first Josephson junction and the second Josephson junction is a compound-compound Josephson junction.

9. The circuit of claim 2, wherein at least one of the first device inductance, the second device inductance, and the plurality of coupling inductances includes a plurality of inductive segments.

10. A circuit comprising:
a first device, the first device comprising a first loop, the first loop comprising a material that is superconductive in a range of temperatures below a respective critical temperature, the first loop interrupted by a first Josephson junction;
a second device, the second device comprising a second loop, the second loop comprising a material that is superconductive in a range of temperatures below a respective critical temperature, the second loop interrupted by a second Josephson junction; and
a coupling device, the coupling device comprising a third loop, the third loop comprising a material that is superconductive in a range of temperatures below a respective critical temperature, the third loop comprising an ordered sequence of segments, the ordered sequence comprising in order:
a first segment in common with a segment of the first loop;
a second segment interrupted by a third Josephson junction;
a third segment in common with a segment of the second loop; and
a fourth segment interrupted by a fourth Josephson junction, wherein the second device is communicatively coupled to the first device by a galvanic coupling by the first segment and the second segment.

11. The circuit of claim 10, wherein at least one of the third Josephson junction and the fourth Josephson junction is operable as an L-tuner.

12. The circuit of claim 10, wherein the first device is a first qubit, and the second device is a second qubit.

13. The circuit of claim 10, wherein at least one of the first Josephson junction, the second Josephson junction, the third Josephson junction, and the fourth Josephson junction is a compound Josephson junction.

14. The circuit of claim 10, wherein at least one of the first Josephson junction and the second Josephson junction is a compound-compound Josephson junction.

15. The circuit of claim 10, wherein at least one of the first device inductance, the second device inductance, the first coupling inductance, and the second coupling inductance includes a plurality of inductive segments.

16. A circuit comprising:
a first device, the first device comprising a first device loop, the first device loop comprising a material that is superconductive in a range of temperatures below a respective critical temperature, the first device loop interrupted by a first Josephson junction, the first device loop comprising a first device inductance;
a second device, the second device comprising a second device loop, the second device loop comprising a material that is superconductive in a range of temperatures below a respective critical temperature, the second device loop interrupted by a second Josephson junction, the second device loop comprising a second device inductance; and
a coupling device comprising:
a first coupling loop comprising a material that is superconductive in a range of temperatures below a respective critical temperature, the first coupling loop interrupted by a third Josephson junction,
the first coupling loop comprising:
a first coupling inductance; and
a first segment in common with a segment of the second device loop,
a second coupling loop comprising:
a second coupling inductance; and
a second segment in common with a segment of the first device loop,
wherein the first coupling loop is inductively communicatively coupled to the first device by the first coupling inductance and the first device inductance, the second coupling loop is inductively communicatively coupled to the second device by the second coupling inductance and the second device inductance, the first coupling loop is galvanically communicatively coupled to the second device by the first segment, and the second coupling loop is galvanically communicatively coupled to the first device by the second segment.

17. The circuit of claim 16, wherein the first device is a qubit, and the second device is a qubit.

18. The circuit of claim 16, wherein at least one of the first Josephson junction, the second Josephson junction, and the third Josephson junction is a compound Josephson junction.

19. The circuit of claim 16, wherein at least one of the first Josephson junction and the second Josephson junction is a compound-compound Josephson junction.

20. The circuit of claim 16, wherein at least one of the first device inductance, the second device inductance, the first coupling inductance, and the second coupling inductance includes a plurality of inductive segments.

* * * * *

UNITED STATES PATENT AND TRADEMARK OFFICE
CERTIFICATE OF CORRECTION

PATENT NO. : 11,494,683 B2
APPLICATION NO. : 16/955526
DATED : November 8, 2022
INVENTOR(S) : Mohammad H. Amin et al.

It is certified that error appears in the above-identified patent and that said Letters Patent is hereby corrected as shown below:

In the Specification

Column 14, Line 5:

"$y = L\frac{\partial I}{\partial t}$",

Should read:

-- $V = L\frac{\partial I}{\partial t}$ --.

Column 23, Line 6:

"$H = -\Delta_1 \sigma_1^x - h_1 \sigma_1^z - \Delta_2 \sigma_2^x - h_2 \sigma_1^z + J_z \sigma_1^z \sigma_2^z + J_x \sigma_1^x \sigma_2^x + J_y \sigma_1^y \sigma_2^y$,"

Should read:

-- $H = -\Delta_1 \sigma_1^x - h_1 \sigma_1^z - \Delta_2 \sigma_2^x - h_2 \sigma_2^z + J_z \sigma_1^z \sigma_2^z + J_x \sigma_1^x \sigma_2^x + J_y \sigma_1^y \sigma_2^y$ --.

Signed and Sealed this
Twenty-eighth Day of March, 2023

Katherine Kelly Vidal
*Director of the United States Patent and Trademark Office*